US007292112B2

(12) United States Patent
Oxborrow

(10) Patent No.: US 7,292,112 B2
(45) Date of Patent: Nov. 6, 2007

(54) WHISPERING GALLERY OSCILLATOR

(75) Inventor: Mark Oxborrow, Hampton (GB)

(73) Assignee: The Department of Trade & Industry, London (GB)

( * ) Notice: Subject to any disclaimer, the term of this patent is extended or adjusted under 35 U.S.C. 154(b) by 70 days.

(21) Appl. No.: 11/376,380

(22) Filed: Mar. 15, 2006

(65) Prior Publication Data

US 2007/0001773 A1 Jan. 4, 2007

(30) Foreign Application Priority Data

Mar. 18, 2005 (GB) ................................ 0505646.0

(51) Int. Cl.
*H03B 5/18* (2006.01)
*H03B 7/12* (2006.01)
*H01P 7/10* (2006.01)

(52) U.S. Cl. ...................................... 331/96; 333/219.1

(58) Field of Classification Search .................. 331/96, 331/107 DP, 117 D; 333/219.1

See application file for complete search history.

(56) References Cited

U.S. PATENT DOCUMENTS

2007/0141163 A1 * 6/2007 Vitaliano et al. ........... 424/490

OTHER PUBLICATIONS

Bloembergen, N., "Proposal for a New Type Solid State Maser," Physical Review, vol. 104, pp. 324-327 (1956).

Bloembergen, N., "Solid State Masers," pp. 396-429 (Chapter IX) in "Progress in Low Temperature Physics", edited by C. J. Gorter, vol. III, North-Holland (1961).

Bloembergen, N, "The Zero-Field Solid State Maser as a Possible Time Standard," in "Quantum Electronics. A Symposium," Columbia University Press, New York, pp. 160-166 (1960).

Bogle, G., et al., "Paramagnetic Resonance of $Fe^{3+}$ in Sapphire at Low Temperatures," Proceedings of the Physical Society, vol. 73, pp. 531-532 (1959).

Bogle, G., et al., "Zero-Field Masers," Australian Journal of Physics, vol. 12, pp. 1-20 (1959).

Bourgeois, P., et al., "A cryogenic open-cavity sapphire reference oscillator with low spurious mode density," IEEE Transactions on Ultrasonics. Ferroelectrics and Frequency Control, vol. 51, pp. 1232-1239 (2004).

Chang, S., et al., "Improved cryogenic sapphire oscillator with exceptionally high frequency stability," Electronics Letters vol. 36, pp. 480-481 (2000).

(Continued)

*Primary Examiner*—David Mis

(74) *Attorney, Agent, or Firm*—DeWitt Ross & Stevens SC; Craig A. Fieschko

(57) ABSTRACT

There is disclosed a whispering gallery oscillator for producing a low noise microwave output signal. The whispering gallery oscillator comprises a dielectric resonator 1 comprising paramagnetic ions 34. A pump signal 5 is coupled by a coupler 7 to the paramagnetic ions to excite 19 the paramagnetic ions 34. The paramagnetic ions 34 decay 17 and thus excite a whispering gallery mode 15 of the dielectric resonator 1. The whispering gallery mode 15 is coupled by a coupler 10 to give an output signal 9. The whispering gallery mode 15 has a high Q ($Q \approx 10^7$) resonance. The high Q resonance results in a low-noise output signal 9. The paramagnetic ions 34 act as a MASER that is distributed about the dielectric resonator 1. In some embodiments, the whispering gallery oscillator may be locked to a frequency standard.

39 Claims, 22 Drawing Sheets

OTHER PUBLICATIONS

Dick, G., et al., "Cryo-cooled sapphire oscillator with ultra-high stability," Proceedings of 1998 IEEE International Frequency Control Symposium, pp. 528-533 (1998).
Dick, G., et al., "Development of the Superconducting Cavity Maser," Proceedings of 38th Annual Frequency Control Symposium, pp. 435-446 (1984).
Dick, G., et al., "Microwave Frequency Discriminator with a Cryogenic Sapphire Resonator for Ultra-Low Phase Noise," Proceedings of 6th European Frequency and Time Forum, Noodwijk, The Netherlands, Mar. 17-19, 1992, pp. 35-39 (1992).
Dick, G., et al., "Stability and Phase Noise Tests of Two Cryo-Cooled Sapphire Oscillators," Proceedings of the 1999 Joint Meeting of The European Frequency and Time Forum and the IEEE International Frequency Control Symposium, pp. 549-551 (1999); particularly the 'low-noise receiver' shown in Fig. 2.
Dick, G., et al., "The Superconducting Cavity Stabilized Ruby Maser Oscillator," Proceedings of the Fifteenth Annual Precise Time and Time Interval (PTTI) Applications and Planning Meeting, pp. 723-739, (1983).
Dick, G., et al., "Ultra-Stable Performance of the Superconducting Cavity Maser," IEEE Transactions on Instrumentation and Measurement, vol. 40, pp. 174-177 (1991).
Giles, A., et al., "A High Stability Microwave Oscillator Based on Sapphire Loaded Superconducting Cavity," Proceedings of the 43rd Annual Symposium on Frequency Control, pp. 89-93 (1989).
Hartnett, J., et al., "Frequency—Temperature Compensation Techniques for High-Q Microwave Resonators," pp. 67-89, in "Frequency Measurement and Control, Advanced Techniques and Future Trends," Edited by A. N. Luiten, Topics in Applied Physics, vol. 79, Springer-Verlag (2000).
Koga, Y., et al., "A Microwave Exciter for Cs Frequency Standard Based on a Sapphire Loaded Cavity Oscillator," IEEE Transactions on Ultrasonics Ferrolectrics and Frequency Control, vol. 48, No. 1, pp. 1-5, (2001); particularly figures 1, 3 and 5(b) and 5(c).
Lardet-Vieudrin, F., et al., "Design and realisation of a 100 MHz synthesis chain from an X-band reference signal," in Proceedings of the IEEE Frequency Control Symposium and 17 European Frequency Time Forum, Tampa, Florida, May 4-8, 2003, pp. 560-564 (2003); particularly Fig. 1.
Luiten, A., et al., "Latest results of the U.W.A. cryogenic sapphire oscillator," Proceedings of IEEE International 49th Frequency Control Symposium, pp. 433-437 (1995).
Luiten, A., et al., "Paramagnetic susceptibility and permittivity measurements at microwave frequencies in cryogenic sapphire resonators," Journal of Physics D (Applied Physics), vol. 29, pp. 2082-2090 (1996).
Mann, A., "Ultrastable Cryogenic Microwave Oscillators," pp. 37-66, in 'Frequency Measurement and Control, Advanced Techniques and Future Trends', Edited by A. N. Luiten, Topics in Applied Physics, vol. 79, Springer-Verlag (2000).
Mann, A., et al., "A high stability atomic fountain clock using a cryogenic sapphire interrogation oscillator," Proceedings of 1998 IEEE International Frequency Control Symposium, Pasadena, CA, USA, pp. 13-17 (1998).
Marhic, M., et al., "Whispering-Gallery $CO_2$ Laser," IEEE Journal of Quantum Electronics, vol. QE-15, No. 6, Jun. 1979, pp. 487-490.
Matsko, B., et al., "Review of Applications of Whispering-Gallery Mode Resonators in Photonics and Nonlinear Optics," The Interplanetary Network (IPN) Progress Report (http://tda.jpl.nasa.gov) 42-162, Aug. 15, 2005, pp. 1-51.
Treussart, F., et al., "Evidence for intrinsic Kerr bistability of high-Q microsphere resonators in superfluid helium," European Physics Journal D, vol. 1, pp. 235-238 (1998).
Wang, R., et al., "A Receiver Design for the Superconducting Cavity-Maser Oscillator," NASA/JPL Telecommunications and Data Acquisition Progress Report 42-107, pp. 1-5, Nov. 15, 1991; in particular Fig. 1.

* cited by examiner

WHISPERING GALLERY OSCILLATOR

BACKGROUND

Oscillators are vital elements of clocks and have many important applications in telecommunications, remote sensing (e.g. radar), and signal processing. An oscillator is a device that supplies a measurable output. This output can take, for example, the form of the deflection of a mechanical dial or the voltage across a pair of electrical terminals. An oscillator regulates the value of its output as a function of time such that it is periodic (with respect to time). The inverse of the output's temporal period is known as the oscillator's frequency.

Performance, Requirements, and Fundamental Anatomy of an Oscillator

Performance:

An oscillator's fitness of purpose, with respect to any particular application, is determined by the extent to which its frequency remains constant as time progresses. Oscillators that exhibit the most stable output frequencies are the ones, and the only ones, that can enable the most exacting applications, and they are thus valuable.

A mathematical phase can be associated with an oscillator's output, where an increase of $2\pi$ in the value of this phase is associated with each new period of the oscillator's output. The phase can be notional compared to that of a corresponding ideal oscillator, whose phase accumulates perfectly linearly with respect to time. The difference in the phases of these two oscillators as a function of time, particularly when transformed into the so-called Fourier domain, provides an alternative way of viewing and characterising the real oscillator's frequency stability.

Several established measures of performance, well known to experts in the art of oscillator characterization, are used to quantify an oscillator's frequency stability. These measures have been reviewed by Rutman and Walls ['Characterization of Frequency Stability In Precision Frequency Sources', J. Rutman and F. L. Walls, Proceedings of the IEEE, vol. 79, pp. 952-960 (1991)] and by Stein ['Frequency and Time—Their Measurement and Characterization', S. R. Stein, pp. 191-416, in 'Precision Frequency Control', edited by E. A. Gerber and A. Ballato, Academic Press, New York (1985)], as well as in many other technical articles and monographs.

Two Measures of performance that have gained particularly wide industrial acceptance are:

(i) The oscillator's 'fractional frequency stability' defined mathematically as its square-root Allan variance, also known as its Allan deviation; this measure is a function of the temporal sampling interval.

and (ii) The oscillator's 'phase-noise spectral density', defined mathematically as the one-sided spectral density of the oscillator's phase fluctuations (with respect its ideal equivalent); this measure is a function of the offset frequency with respect to oscillator's average, or so-called 'carrier' frequency.

Note that each of these two measures of performance is a curve, i.e. a function whose value varies with the value of the function's argument, as opposed to being a single numerical value. With either of these measures, for a given value of its argument (i.e. for a given value of the temporal sampling interval in the case of the fractional frequency stability, or for a given value of the offset frequency, in case the phase-noise spectral density), the lower the measure the greater the oscillator's frequency stability. An oscillator of high performance with regard to it frequency stability is one that exhibits a low fractional frequency stability over a range of temporal sampling intervals or one that exhibits a low phase-noise spectral density, over a range of frequency offsets.

Requirements:

Beyond its frequency-stability performance, an oscillator has various other properties that can affect its utility in particular applications. For a start, an oscillator has a certain mass and occupies a certain amount of space. An oscillator requires the supply of various resources to it and also the keeping of it in an environment whose qualities should allow the oscillator to attain the level of frequency stability that is required of it. All oscillators require both an adequate supply of power and an adequate means of discharging waste heat. Certain oscillators can only operate over limited ranges of temperature. Many other environmental parameters can affect the oscillator's operation, and fluctuations in them may affect the oscillator's frequency stability. These parameters include: the magnitude and direction of either ambient or deliberately applied electric or magnetic fields; the humidity; the intensity of ionising radiation to which the oscillator is exposed; mechanical acceleration (caused by the movement/vibration of the platform to which the oscillator is attached) and acoustic noise.

Fundamental Anatomy:

Every oscillator contains, in conjunction with peripheral supporting equipment, the following three core functional elements:

(A) a means of defining a particular (absolute) frequency; this 'frequency reference' is typically associated with a 'resonance', as exhibited by some or other form of 'resonator';

(B) a means for ensuring that the oscillator oscillates at the reference frequency; this process of regulation or 'locking' is typically achieved through some of other form of 'interference' or 'feedback'.

(C) a means of sustaining the oscillator's oscillation (to prevent it from decaying through unavoidable dissipative processes); this energy-supplying function is typically accomplished by some or other form of 'amplifier'.

The frequency reference associated with any individual oscillator need not be perfectly reproducible but it should, by definition, be sufficiently constant with respect to time. This in turn requires that those physical properties of the resonator whose resonance defines the frequency reference should remain sufficiently constant with time. The present invention proposes a new type of oscillator with operating frequencies in or around the broadly interpreted 'microwave' region, i.e. between a few hundred MHz and several hundred GHz. Here, to provide some technological context for the invention, and to appreciate its significance, some relevant existing microwave oscillators and associated components are briefly reviewed.

Passive Electromagnetic Resonators and Whispering-Gallery Modes

Many successful designs of microwave oscillator incorporate a passive electromagnetic (e.m.) resonator to supply the frequency-reference function [(A) above], where the resonator supports one or several resonant, electromagnetic modes exhibiting high quality factors. Here, the resonator functions as an essentially passive, linear (either 1- or 2-port) device, as can be modelled with scattering parameters (e.g. $S_{21}$). Because of their regular mention within the descriptions that follow, the quality factors of e.m. modes shall often be denoted simply by the (italicised) letter 'Q'. The frequency and Q of an e.m. mode is determined by the dimensions, shape and electromagnetic properties (viz. electric permittivity, magnetic susceptibility, surface conductance . . . ) of the resonator's constituent materials. The oscillator's frequency is regulated, by one of several available means, to lie at or close to the centre frequency of a particular high-Q mode. One says that the oscillator 'runs on', or is 'locked to' the mode. Besides the resonator itself, the oscillator requires a means of amplification to sustain its oscillation and also a means for locking its operating frequency to the mode on which it is intended to run. The most stable microwave oscillators based on high-Q resonators were recently reviewed by A. G. Mann. ['Ultrastable Cryogenic Microwave Oscillators', A. G Mann, pp. 37-66, in 'Frequency Measurement and Control, Advanced Techniques and Future Trends', Edited by A. N. Luiten, Topics in Applied Physics Vol. 79, Springer-Verlag 2000).] Many (though not all) of them are locked to electromagnetic mode of so-called 'whispering-gallery' type.

Without any further associated qualifications, the word 'dielectric', is used below to denote materials that have a complex electric permittivity, at the frequency of the electromagnetic wave to which the material is exposed, whose real part is greater than that of free space and whose complex part is several orders of magnitude smaller than its real part; in other words, a dielectric is, by default, a 'good' one, in the sense of it having a low loss tangent. Mica, silica, rutile, polystyrene and p.t.f.e. are examples of such dielectrics at microwave frequencies. A sinusoidal electromagnetic wave is characterized by its associated wavelength, $\lambda$, which is in general a function of the wave's frequency, polarization and direction of propagation. Through unbounded regions of a (good) dielectric, such a wave can propagate over distances equal to many wavelengths before suffering significant attenuation.

The external surface of a dielectric body that is surrounded by free space defines an extended two-dimensional electromagnetic interface. If the body's form is suitably convex, this interface can support a distinct class of electromagnetic waves known as 'whispering gallery' (henceforth 'WG') waves or modes, as were first analysed by Lord Rayleigh in the case of analogous acoustical systems ['The problem of the whispering gallery', J. W. S. Rayleigh, Philosophical Magazine, Vol. 20, pp. 1001-4 (1910)]. The WG waves flow tangential to the interface and are predominantly confined to the dielectric side of it, in a layer of thickness $\sqrt{\lambda R}$ that lies immediately below the surface; here, $\lambda$ is the wavelength of the equivalent freely-propagating wave in an infinite region of the same dielectric and R is the surface's appropriate radius of curvature. The mechanism of confinement can be considered as the radio- and/or microwave-frequency equivalent of what in ray optics is known as 'total internal reflection'. Within the ray-optics description, the inverse sine of the WG wave's angle of incidence at the interface is always greater than the dielectric's refractive index (equal to the square root of the ratio of the dielectric's relative electric permittivity to that of free space). Since no corresponding transmitted (refracted) wave propagating in free space can satisfy Snell's law, the WG wave is totally reflected back into the dielectric. Outside of the dielectric structure, the wave is evanescent as opposed to propagating, where its amplitude (and also its field-energy density) decays exponentially with distance away from the interface. All these features are most pronounced when the wavelength $\lambda$ is small compared to the convex dielectric body's characteristic radius of curvature R. If the dielectric body is compact or at least 'closed', in the sense that it confines WG waves to run in closed loops, then multiple interference will select a discrete spectrum of frequencies to each of which a particular whispering-gallery standing wave or 'mode' is associated.

Finite dielectric bodies whose geometric shapes have rotational symmetry can be made relatively easily with commonly available tools and established methods of fabrication. Most work on electromagnetic WG-modes to date has concerned dielectric bodies with cylindrical symmetry in the form of spheres, or cylinders, or more general 'solids of rotation' such as rings or toroids. Such dielectric bodies will support whispering-gallery modes that exhibit (discrete) rotational symmetry. The rotational symmetry significantly aids, moreover, in the mathematical analysis and electromagnetic modelling of these WG modes as they can then be quite accurately represented in terms of special functions (such as Bessel functions and their 'modified' variants) or at least relatively compact series-expansions thereof. However, as pointed out below, rotational symmetry, though often convenient, is not strictly necessary for supporting or analysing WG-modes.

If the electric permittivity tensor of the dielectric material out of which such a body is made is anisotropic, as is the case with many crystalline dielectrics whose losses are desirably low, yet the tensor exhibits a rotational symmetry about a particular axis, as is also often the case with the same, this axis can be oriented parallel to the body's geometric axis of rotational symmetry such that the electric permittivity of the space within and about the dielectric body exhibits continuous rotational symmetry. The requisite alignment of the crystal can be accomplished by either viewing it optically through crossed polarizers or using x-ray diffraction. Monocrystalline sapphire is an example of such a material; its c-axis is oriented parallel to the cylindrical axis of the dielectric body that is comprises it. The dielectric loss of sapphire at microwave frequencies, especially at liquid-helium temperatures, is, moreover, extremely low.

Dielectric resonators incorporating rings, cylinders or pucks of high-purity monocrystalline sapphire have been used in electromagnetic resonators at cryogenic temperatures to support WG modes at microwave frequencies exhibiting unloaded Qs in excess of $10^9$. Microwave oscillators built around such resonators have excellent frequency stability. [See 'Improved cryogenic sapphire oscillator with exceptionally high frequency stability', S. Chang et al, Electronics. Letters 36, 480-481 (2000); 'Cryo-cooled sapphire oscillator with ultra-high stability', G. J. Dick et al, Proceedings of 1998 IEEE International Frequency Control Symposium, pp. 528-533 (1998); 'A cryogenic open-cavity sapphire reference oscillator with low spurious mode density', P.-Y. Bourgeois, IEEE Transanctions on Ultrasonics. Ferroelectrics and Frequency Control, vol. 51, pp. 1232-1239 (2004).] Here, the sapphire resonator is maintained at a temperature lying conveniently above 4.2 Kelvin, where a frequency-versus-temperature turnover point is located. The turnover point can be precisely sat upon through a temperature-control servo loop that employs a resistive heater, with no need to pump on the helium of bath. It should be noted here, and as Bourgeois et al explicitly have demonstrated, a reflective electromagnetic shield or cavity placed around the dielectric ring is not necessary for attaining attractively high Qs.

The whispering-gallery modes can be classified through their associated electromagnetic field configurations.

Assuming rotational symmetry, the modes can be broadly divided into two classes: quasi-transverse-magnetic (WGH) modes, whose magnetic field lines lie approximately orthogonal to the ring's cylindrical axis, and quasi-transverse-electric (WGE) modes whose electric field lines lie approximately normal to the mode's cylindrical axis. The azimuthal mode order, 'n', of a WG mode equals the number of full waves made by the mode's field pattern around the perimeter of its supporting ring. The WG mode's axial and radial mode orders, 'a' and 'r', respectively, equal the number of nodes in the mode's field pattern along these two respective directions. A 'fundamental' WG mode has no nodes in either of these two directions. In general, a WG mode can be identified using the notation $WGH_{n,r,a}$ for quasi-transverse-magnetic (WGH) modes and $WGE_{n,r,a}$ for quasi-transverse-electric modes. Without external perturbations (from coupling probes, for example) each WG is doubly degenerate; this degeneracy can be associated with two travelling waves circulating in opposite directions around the ring; alternatively, the doublet can be regarded as comprising two otherwise identical standing-wave WG modes whose azimuthal phase differs by 90°.

In general, the existence and form of a given whispering-gallery mode is robust to isolated defects, such as the odd inclusion or void within the dielectric body, or the odd surface scratch or chipped edge on the body's surface, provided the dimensions of these defects are small compared with the mode's associated wavelength λ (within the dielectric). Though the form of the whispering-gallery mode may remain qualitatively the same, its quality factor Q can be significantly degraded by even small defects through their scattering or absorption of energy from the WG mode.

The vast majority of the electromagnetic WG modes that have been studied to date have been planar in form. Planarity is not strictly essential to WG modes and indeed, non-planar whispering-gallery modes can be supported by finite cylinders and 'bottle-shaped' solids of rotation; as have recently been analysed by Sumetsky. ['Whispering-gallery-bottle microcavities: the three-dimensional etalon', M. Sumetsky, Optics Letters, Vol. 29, pp. 8-10 (2004)].

Furthermore, rotational symmetry of the dielectric body itself is not necessary for supporting 'generalized' whispering-gallery electromagnetic modes, which exhibit the same desirable features concerning confinement, low evanescent leakage and (thus) high Q, as their rotationally symmetric relatives. These generalized WG mode can, moreover, offer significant advantages and design flexibility with regard to controlling how they couple electromagnetically to surrounding structures (such as coupling probes and 'launchers') located at a particular azimuthal positions. S. Ancey et al have, for example, analysed whispering-gallery modes in dielectric bodies of elliptical shape ['Whispering-gallery modes and resonances of an elliptic cavity', S Ancey, A Folacci and P Gabrielli, Journal of Physics A (Mathematical and General), Vol. 34, pp 1341-1359 (2001)].

To support a generalized WG mode, the external surface of the dielectric body should in general contain a closed, convex 'band', where the band's curvature in its 'long' or generalized-azimuthal direction should be small enough at all positions around the band to ensure total internal reflection and (thus) sufficiently suppress evanescent leakage and radiation losses. Furthermore, the variation in the azimuthal curvature around the band needs to be sufficiently limited to avoid anomalously large leakage and losses due to a phenomenon known are 'chaos assisted tunnelling', as for example has been discussed by Nöckel and Stone ['Ray and wave chaos in asymetric resonator optical cavities', J. U. Nöckel, and A. D. Stone, Nature. 385, pp. 45-47 (1997)]. Provided this and related wave-chaotic phenomena (such as so-called 'dynamical localization') are taken in to account, non-rotationally symmetric dielectric bodies that support generalized whispering-gallery modes with both high Qs and advantageous coupling features can be rationally designed and constructed.

Oscillator Loops and Locking Configurations

In connection with (B) stated above, the various means through which an oscillator can be compelled to run at the frequency that is defined by its frequency reference (as embodied by a resonator) are reviewed here.

The simplest resonator-based oscillators comprise a passive resonator [i.e. (A) above] and an amplifier [i.e. (C) above] that are connected directly together by cables in a loop to form what is known as a free-running loop oscillator. The phase-noise performance of such oscillators has been by considered quantitatively by Leeson ['A Simple Model of Feedback Oscillator Noise Spectrum'. D. B. Leeson, Proceedings of the IEEE, vol. 54, pp. 329-330 (1966)] and more recently by Everard in somewhat more detail ['Fundamentals of RF Circuit Design with Low Noise Oscillators', by J. Everard, John Wiley & Sons Ltd. (2001)]. Through such considerations, it is known how a loop oscillator's phase noise depends on its operating parameters. With regard to attaining low phase noise:

(i) the mode supported by the oscillator's resonator should have an unloaded Q that is as high as possible;
(ii) the mode's centre frequency should be as constant as possible;
(iii) the oscillator's feedback power, which flows through the resonator, should be as large as possible;
(iv) the thermal noise generated by the amplifier, as characterized by its finite noise temperature, as well as that generated by other parts of the oscillator's loop, should be as low as possible; thermal noise can be reduced by reducing the temperature;
(v) the flicker noise in the oscillator's sustaining amplifier should be as low as possible;
(vi) the electromagnetic properties of the loop's interconnecting cables, i.e. their phase length and loss, should be as stable as possible—lest fluctuations in the cables come to pull the loop oscillator's frequency.

The optimisation of a practical free-running loop oscillator involves judicious trade-offs between the above parameters. More complicated designs of microwave oscillator, incorporating additional components within various servo loops, attempt to suppress or circumvent the free-running loop oscillator's sensitivities to fluctuations in certain of them.

So-called Pound-stabilized loop (PSL) oscillators [see 'A High Stability Microwave Oscillator Based on Sapphire Loaded Superconducting Cavity', by A. J. Giles et al, Proceedings of the 43rd Annual Symposium on Frequency Control, pp. 89-93 (1989)] have been built around cryogenic sapphire whispering-gallery-mode resonators maintained at cryogenic (often liquid-helium) temperatures within a refrigerator (i.e. a so-called 'cryostat'). Within the bandwidth of such an oscillator's Pound stabilizer, the frequency instabilities that would otherwise be introduced by either the loop amplifier's phase noise and/or by fluctuations in the loop's interconnecting cables, or both, are compensated.

In contrast to the present invention proposed below, it can be remarked that a PSL oscillator is a spatially extended system: at least two microwave lines, each typically greater than one meter in length, are required to connect the cryogenic resonator to the room-temperature section of the oscillator's loop. In reality, each line comprises a series of semi-rigid microwave cables that are connect by feedthroughs between the cryostat's different chambers and sections. To achieve frequency stabilities at the $1\times10^{-14}$ level, several auxiliary cables and sensors, supporting the control of the resonator's temperature, the so-called Pound servo, and well as loop-power regulation [see, for example, 'Latest results of the U.W.A. cryogenic sapphire oscillator', A. N. Luiten et al, Proceedings of IEEE International 49th Frequency Control Symposium, pp. 433-437 (1995)] are all required to be wired into the cryostat. Pound stabilization does suppress, within a finite bandwidth, the phase (thus frequency) shifts associated with mechanical vibrations and/or temperature fluctuations along the microwave lines. Residual amplitude modulation, causing offsets in the Pound servo's d.c.~error signal remains a problem, however.

Despite their configurational complexity, PSL oscillators have demonstrated their worth in several demanding applications. They have been used as 'flywheels' for cold-atom frequency standards [see 'A high stability atomic fountain clock using a cryogenic sapphire interrogation oscillator', A. G. Mann et al, Proceedings of 1998 IEEE International Frequency Control Symposium, Pasadena, Calif., USA, pp. 13-17 (1998)], as reference oscillators for (close-in) phase-noise measurements [see 'Microwave Frequency Discriminator with a Cryogenic Sapphire Resonator for Ultra-Low Phase Noise', G. J. Dick & D. G. Santiago, Proc. of 6th European Frequency and Time Forum, Noodwijk, The Nederlands, 17-19 March 1992, pp. 35-39 (1992)], or in fundamental-physics experiments testing, for example, Lorentz invariance [see 'Tests of Lorentz Invariance using a Microwave Resonator', P. Wolf et al, Physical Review Letters, vol. 90, pp. 060402 (2003)].

Solid-State Masers

In the designs of oscillators considered above, the means through which the oscillator's oscillation is sustained [(B) above] takes the form of a conventional microwave amplifier, typically based on semiconductor technology, and typically operating at room temperature. A wholly different means of amplification is Microwave Amplification by Stimulated Emission of Radiation, which is based on atomic (also often described as 'quantum-electronic') principles. The term 'maser' (as both a noun and adjective) shall henceforth be generally used to refer to it; the gerundive 'mas(er)ing' shall also on occasions be used to refer to those physical entities that participate in the 'maser action'—to distinguish them from other's that don't.

The maser phenomemon can be realized in both solid-state systems, where the masering atoms (or ions) reside in condensed matter, and also in more rarified systems, where the masering atoms, in the form of propagating beams or clouds, reside in what is otherwise a vacuum. With regard to the former, solid-state masers have been reviewed pedagogically by Siegman ['Microwave Solid-state Masers', A. E. Siegman, McGraw-Hill (1964)]. Here, the masing medium is a dielectric solid, most often a crystal, containing a distribution (a so-called 'solid dilution') of paramagnetic ions. The frequencies that are associated with transitions between the electronic-spin states, or 'levels', of these paramagnetic ions typically lie in the microwave region (i.e. GHz). With a few exceptions, maser action in solids requires operation at liquid-helium temperatures. The most comprehensively studied and applied solid-state maser system to date has been (artificial) 'pink ruby', that is, crystalline sapphire doped with chromium $Cr^{3+}$ ions, at a substitutive concentration on the order of 1 part per thousand. This system has been used to realize low-noise, sufficiently wide-band amplifiers for boosting the power of weak microwave signals in telecommunication and astronomy. [See, for example, 'Solid State Masers', N. Bloembergen, pp. 396-429 (Chapter IX) in 'Progress in Low Temperature Physics', edited by C. J. Gorter, vol. 111, North-Holland (1961).]

The strength of a paramagnetic transition between two levels in so-called 'free-spin units' is equal to the ratio, expressed as a fraction, between the said strength and that of the equivalent 'strongly allowed' transition between the upper ($m=-\frac{1}{2}$) and lower ($m=+\frac{1}{2}$) spin levels of a free electron ($S=\frac{1}{2}$), where these two free-spin levels have been separated by an applied static magnetic field. Maser action requires that both its so-called 'pump' and 'signal' transitions are sufficiently strong, i.e. a sufficiently large fraction of a free-spin unit. Except in a few specific systems, which shall be subsequently mentioned, this generally requires that the masering paramagnetic ions be exposed to a d.c. magnetic 'bias' field that splits and mixes, quantum mechanically, the 'zero-field' quantum states that the ions would otherwise have. In addition, the application of a magnetic field of a judiciously chosen strength and orientation (relative to the crystal's axes), allows the maser's signal and pump transitions to be 'engineered' with regard to their strengths, polarizations, and frequencies [see Siegman, already referenced above.]

Dick et al ['Development of the Superconducting Cavity Maser', G. J. Dick and D. M. Strayer, Proceedings of $38^{th}$ Annual Frequency Control Symposium, pp. 435-446 (1984); 'Ultra-Stable Performance of the Superconducting Cavity Maser', G. J. Dick, and R. T. Wang, IEEE Transactions on Instrumentation and Measurement, vol. 40, pp.174-177 (1991)] developed a 'Superconducting Cavity Maser Oscillator' (SCMO), operating at a temperature near 1.6 K, that exhibited extremely good frequency stability (Allan deviation of $4–5\times10^{-15}$ for sampling intervals between 1 and 1000 s) and exceptionally low (flicker-) phase noise ($-80$ dBc/$f^3$, where the frequency f is in Hz). Dick et al's oscillator incorporated a solid-state ruby maser amplifier. This amplifier was maintained at a cryogenic temperature and its operation required an applied d.c. magnetic 'bias' field. With regard to the present proposed invention, it should be, noted that the maser amplifier within the SCMO was physically separated from the oscillator's passive frequency-defining resonator cavity. This physical separation was in fact an essential feature of the SCMO: the resonator's high Q, and hence the oscillator's frequency stability, would have been severely degraded, due to the trapping of magnetic flux in the walls of the oscillator's superconducting cavity (made of lead), had the cavity been exposed to the same magnetic field necessary to bias the ruby crystal. In other words, the amplifier and resonator of Dick et al's SCMO could not operate in the same region of space.

In contrast to a typical embodiment of the Pound-stabilized loop oscillator, however, the SCMO's all-cryogenic loop was relatively more compact (centimeters as opposed to meters) and benefited from the uniformity and stability of temperature provided by its wholly cryogenic environment. By dint of the ruby maser's combined low thermal and low flicker noise, the phase noise exhibited by the SCMO was superior to that which could have been achieved by swapping the maser for a conventional microwave (e.g. 'GaAs-FET' or 'HEMT') amplifier, even if operated at a cryogenic temperature. The SCMO offered several other advantages that are shared with the present invention proposed below, which shall be stated in due course.

For completeness, and as shall be relevant to the description of the present invention's first experimental embodiment, it is noted here that there exist a few solid-state systems that enable maser action without the application of a d.c. magnetic bias field. Sapphire that is substitutively doped with $Fe^{3+}$ ions, or sumarium sulphate doped with $Gd^{3+}$ ions, provide two examples (there are several others). Such so-called 'zero-field masers'. have been reviewed by Bogle and Symmons ['Zero-Field Masers', G. S. Bogle and H. F. Symmons, Australian Journal of Physics, 12, pp. 1-20 (1959)].

Atomic Maser Oscillators

If the linewidth of a maser's so-called 'signal' transition is sufficiently narrow, the maser action itself can provide the means of realizing an oscillator's frequency reference [(A) above], where the oscillator's output frequency is predominantly determined by the frequency of the said signal transition—acting as the reference—as opposed to the centre frequency of the maser's associated electromagnetic mode, whose linewidth is broader than that of the signal transition, with which the signal transition interacts. This possibility was in fact immediately appreciated upon the very first experimental demonstration of maser action ['Molecular Microwave Oscillator and New Hyperfine Structure in the Microwave Spectrum of $NH_3$', J. P Gordon, H. J. Zeiger and C. Townes, Physical Review, 95, pp. 282-284 (1955)]. In such 'atomic' maser oscillators, frequency stability demands that the linewidth of the maser transition be as narrow as possible, i.e. that the transition's line Q be as high as possible. To reduce 'pulling' of the atomic maser oscillator's frequency, the Q of the electromagnetic mode with which the signal transition interacts should, on the other hand, be as low as is compliant with the conditions required for sustained, above-threshold active maser oscillation, at a reasonable output power. Here, the desired relative linewidths of the signal transition and the electromagnetic mode lie in stark contrast to Dick's SCMO, where the operating electromagnetic mode had a Q ($\sim 10^9$) that was approximately seven orders of magnitude higher than the line Q of the ruby's atomic (i.e. paramagnetic) signal transition ($\sim 10^2$). This fundamental 'reversal of roles' between the atomic maser transition and the electromagnetic resonance was indeed explicitly noted by Dick and Strayer, when comparing the workings of their SCMO to that of the (atomic) hydrogen maser. [See 'The Superconducting Cavity Stabilized Ruby Maser Oscillator', Dick, G. J. and D. M. Strayer, Proceedings of the Fifteenth Annual Precise Time and Time Interval (PTTI) Applications and Planning Meeting, pp. 723-739, (1983).]

When describing maser oscillators, it is often necessary to distinguish between and quantify the various processes through which energy is lost from or gained by an electromagnetic mode. In this regard, is useful to define a mode's 'non-magnetic' Q as the Q that it would have were its interaction with the maser oscillator's paramagnetic ions (somehow) turned off.

As early as 1960, Bloembergen considered the realization of atomic maser oscillators of high frequency stability in solid-state systems (as opposed to those based on atomic/molecular beams). [See 'The Zero-Field Solid State Maser as a Possible Time Standard', in Quantum Electronics. A Symposium, Columbia University Press, New York, pp. 160-166 (1960).] He speculated, perhaps rather optimistically, that certain solid-state maser materials could exhibit paramagnetic transitions with linewidths almost as narrow as those exhibited by atoms in a vacuum. He also pointed out several advantages of those special solid-state systems (viz. the 'zero-field masers' previously mentioned) where maser action is possible without the application of a d.c. magnetic bias field.

Despite Bloembergen's imaginative early conjectures, by far the most successful atomic maser oscillator to date has been the (active) hydrogen maser oscillator, whose masering atoms compose a rarified (state-selected) gas, held within what is otherwise an evacuated bulb. Vanier provides a review ['The Active Hydrogen Maser: State of the Art and Forecast', J. Vanier, Metrologia, vol. 18, pp. 173-186 (1982)]. A conventional hydrogen maser operates at near-room temperature (the temperature of the hydrogen atoms emitted from the system's rf-dissociator is higher though the emitted atoms become quickly thermalized to the temperature of the walls of the maser's storage bulb.) The short-term stability (<100 s) of the hydrogen maser is limited by the low power of its output, which is typical no greater than −90 dBm or 1 pW. Its longer term frequency stability is limited by, amongst other processes, fluctuations in the dimensions of the maser's electromagnetic cavity.

Cryogenic or 'cold' hydrogen masers (CHMs), whose storage bulbs are coated with super-fluid helium, necessarily operate below the so-called lambda-point temperature for liquid helium at 2.17 K. They derive several benefits from their cryogenic operation: (i) lower thermal 'Schawlow-Townes' noise in the maser oscillator, (ii) lower thermal (Johnson) noise imparted by the (now potentially cryogenic) receiving amplifier, and (iii) a reduction in cavity pulling due to the lower thermal expansion, as well as lower change in the dielectric permittivity, of the materials that compose the maser's electromagnetic cavity. These significant benefits come, however, at the cost of other phenomena that significantly affect stability, most notably (the temperature and pressure dependence of) hyperfine spin-exchange, which cannot be compensated through (conventional) so-called 'spin-exchange tuning'.

Fundamental Limits

The fundamental limits on a maser oscillator's short-term frequency stability are well understood by experts in the art of their design and construction. [See, for example, 'Analysis of Fundamental and Systematic Effects Limiting the Hydrogen Maser Frequency Stability', by E. Mattison and R. F. C Vessot, Proceedings of Twenty-first Annual Precise Time and Time Interval (PTTI) Applications and Planning Meeting, Redondo Beach, Calif., USA, pp. 433-444 (1989)].

Thermal noise that is generated within and amplified by the maser oscillator causes fluctuations in the frequency of the maser oscillator's signal output. These frequency fluctuations can be described by their corresponding Allan deviation, as introduced above, which takes the form:

$$\sigma_M(\tau) = \frac{1}{Q_L}\sqrt{\frac{kT_M}{2P\tau}} \tag{1}$$

where $\sigma_M(\tau)$ is the Allan deviation of the fractional frequency fluctuations of the maser oscillator's signal output as a function of the temporal sampling interval, $\tau$; $Q_L$ is the loaded, non-magnetic Q of the signal electromagnetic mode with which the maser oscillator's signal transition interacts, k is Boltzmann's constant, $T_M$ is the absolute temperature of the maser oscillator, and P is the overall rate at which energy is removed or dissipated from the maser signal mode due to both loading (i.e. the coupling out of signal power) and internal electromagnetic losses.

If the power of the maser oscillator's output signal is low, then the noise that is imparted onto it by its so-called 'receiving amplifier', which is generally necessary for boosting the power of the maser oscillator's output signal to a usable level, can adversely affect the frequency stability of the boosted signal. The Allan deviation that describes these additional frequency fluctuations takes the form:

$$\sigma_M(\tau) = \frac{1}{2\pi f_M \tau}\sqrt{\frac{3kT_R B}{2P_0}} \quad (2)$$

where $\sigma_R$ (τ) is the Allan deviation of the additional fractional frequency fluctuations at the output of the receiving amplifier as a function of the sampling interval τ, and $f_M$ is the frequency of the maser oscillator's signal transition, $T_R$ is the so-called 'noise temperature' of the receiving amplifier, B is the effective noise bandwidth of the same, and $P_0$ is the power of the signal delivered to the input of the receiving amplifier from the maser oscillator's output. $P_0$ is some finite fraction of the total power dissipated in the maser's signal electromagnetic mode, P [as introduced in connection with equation (1) above]; the fraction $P_0/P$ is typically 0.25—though could be higher or lower depending on the application for which the maser oscillator's operating parameters are optimised. The receiving amplifier may also impart significant frequency flicker (phase) noise onto the boosted signal.

In general, the above two formulae indicate that it is advantageous with regard to frequency stability for the temperature, be it $T_M$ or $T_R$ (or both), to be low, and for the maser oscillator's operating power, be it P or $P_0$ (or both), to be high. In these two regards, conventional hydrogen masers are limited by both their high operating temperature and, in particular, by their low output power.

SUMMARY OF THE INVENTION

The present invention proposes a new type of maser oscillator, that is based upon an 'active resonator', and that offers a unique combination of frequency-stability performance in relation to its cost of manufacture, physical specifications, and operating requirements. This said active resonator consolidates the maser oscillator's frequency reference, its means of frequency regulation, and its means of amplification [i.e. (A), (B) and (C) as introduced in the Background] within a single, compact 'dielectric body'. In this regard, the present invention is wholly different from the Superconducting Cavity Maser Oscillator (SCMO) developed by Dick et al, where a passive resonator and a maser amplifier were embodied in two physically separate units, coupled together by an intermediate structure. The said dielectric body supports at least one electromagnetic mode of so-called whispering-gallery (WG) type, whose quality factor (Q) is extremely high (typically greater than $10^7$), and whose centre frequency is extremely constant (drift in fractional frequency typically below $10^{-13}$ per second). The same dielectric body contains a solid dilution of paramagnetic ions whereby, upon the application of a microwave pump, and either with or without an applied d.c. magnetic bias field, the said WG electromagnetic mode is energized through solid-state 'Microwave Amplification by Stimulated Emission of Radiation' (MASER or 'maser'), involving transitions between the quantum levels of these paramagnetic ions. By dint of the WG mode's high Q, the stability of the WG mode's centre frequency, and the intrinsically low-noise nature of the MASER process, the active resonator thus realizes, in conjunction with its surrounding and quite standard supporting elements, an active (i.e. above-threshold) 'whispering-gallery-mode maser oscillator' whose output exhibits both extremely high frequency stability and extremely low phase noise. Furthermore, in a subclass of the invention, no d.c. magnetic bias field need be applied to the active resonator's dielectric body, thus realizing a 'zero-field' maser oscillator; an example of which is the zero-field $Fe^{3+}$:sapphire WG-mode maser oscillator, whose masering paramagnetic ions are iron $Fe^{3+}$ ions within a sapphire lattice.

INTRODUCTION TO THE DRAWINGS

In what follows, the anatomy, function and operation of the invention are described with the aid of 18 figures. The invention's essential features are first introduced through FIGS. 1 to 4 within the section entitled 'Essential Features'. The principal advantages of the present invention vis-à-vis existing microwave oscillators are then stated in the section entitled 'Advantages'. Certain generic options and desirable features of the invention are next described through FIGS. 5 to 8 in the section entitled 'Optional and/or Desirable Features'. Finally, in the section entitled 'First Experimental Embodiment: a Zero-Field $Fe^{3+}$:Sapphire Whispering-Gallery-mode Maser Oscillator', a particular preferred embodiment of the invention, to be henceforth referred to as the 'first experimental embodiment', is described in detail through FIGS. 9-18.

Essential Features:

FIG. 1 presents the overall scheme of the invention; it includes those features lying outside of the active resonator that are essential to supporting the active resonator's operation.

FIG. 2 presents the basic anatomy of the active resonator; it includes those features within the active resonator that are essential to its operation.

The above said dielectric body, which is an essential component of the active resonator, both (i) necessarily supports a whispering-gallery (WG) electromagnetic mode that couples to the maser oscillator's signal transition and (ii) optionally supports a different WG electromagnetic mode, that couples to the maser oscillator's pump transition. The approximate (necessarily overlapping) locations and configurations of these two WG modes within the active resonator are depicted, schematically, in FIG. 2. The realization of an active maser oscillator through the exploitation of these one or two WG modes is a defining feature of the present invention.

FIG. 3 presents those features of an electromagnetic whispering-gallery mode, as defined by the dielectric body that supports it, which are essential to the present invention.

FIG. 4 depicts the energy levels and transitions for a generic pump-signal maser scheme through which the active resonator's signal-WG mode is energized and thus through which the resonator's maser oscillation is sustained.

Optional and/or Desirable Features:

Both precise regulation of the properties of the microwave 'pump' that is applied to the active resonator and precise regulation of the mechanical, thermal and d.c. electromagnetic environments to which the active resonator is exposed are all desirable with regard to enhancing the maser oscillator's frequency stability.

FIG. 5 presents the maser oscillator's whole operational scheme; is it equivalent to FIG. 1 except that various optional and/or desirable features have been added.

FIG. 6 presents various enhancing modifications to the basic active resonator; it is equivalent to FIG. 2 except that various optional and/or desirable features have been added.

A dielectric body that exhibits rotational symmetry is often a desirable, or at least a convenient, feature.

FIG. 7 sketches a characteristic, instantaneous (in time) 'snap-shot' of the electromagnetic field configuration for a standard whispering-gallery mode that is supported by a dielectric body in the form of a solid cylinder of dielectric material (where those components of the material's electric-permittivity tensor that are relevant to supporting the WG mode exhibit continuous rotational symmetry about the cylinder's geometric axis). The WG mode shown is the $6^{th}$-azimuthal-mode-order fundamental quasi-transverse-electric whispering-gallery mode, viz. $WGE_{6,0,0}$, which exhibits 6-fold rotational symmetry about the dielectric body's cylindrical axis.

It is particularly desirable for the azimuthal mode order of the signal WG mode to be high; the mode's energy is then distinctly confined to the dielectric body's annular periphery and the mode's non-magnetic Q (as defined in the Background) is desirably high.

FIG. 8 sketches, in plan view (looking down the cylindrical axis), a snap-shot of the $12^{th}$-azimuthal-mode-order fundamental quasi-transverse-magnetic WG mode, $WGH_{12,0,0}$, as supported by the same solid dielectric cylinder shown in FIG. 7.

First Experimental Embodiment: a Zero-Field $Fe^{3+}$:Sapphire WG-Mode Maser Oscillator:

FIG. 9 shows the first experimental embodiment of the active resonator in axial cross section. In this particular embodiment, the resonator incorporates an electromagnetic cavity that fully surrounds the resonator's dielectric body, and which mechanically supports both the electromagnetic coupling means for both its signal-WG and pump modes. In this particular embodiment, the active resonator's signal-WG and pump modes are both supported by the active resonator's dielectric body.

FIG. 10 shows a 3-D, 'exploded' view of the same active resonator; only the resonator's main structural elements are shown here.

FIG. 11 sketches, in plan view (looking down the dielectric body's cylindrical axis), the characteristic electromagnetic field configuration of a snap-shot of the $17^{th}$-azimuthal-mode-order fundamental quasi-transverse-magnetic mode, viz. $WGH_{17,0,0}$, whose frequency is approx. 12.038 GHz, and which serves as the active resonator's signal-WG mode is this particular embodiment.

FIG. 12 shows the projection of the same $WGH_{17,0,0}$ mode's electric field (more precisely its lines of electric displacement) onto a plane that includes the resonator's cylindrical axis (oriented vertically on the page).

FIG. 13 displays experimental data demonstrating the observed phenomenon of microwave bistability, which is associated with the saturation of the maser oscillator's paramagnetic ('ESR') signal transition when coupled to the extremely high-Q $WGH_{17,0,0}$ electromagnetic mode.

FIG. 14 shows the first experimental embodiment's pump-signal maser scheme, which exploits the paramagnetic energy levels and associated quantum states ('kets') of paramagnetic $Fe^{3+}$ ions within the sapphire dielectric that composes the resonator's dielectric body. To reveal ('lift') their two-fold Kramers degeneracies, these energy levels are plotted as a function of the applied d.c. magnetic-field strength along the sapphire's c-axis.

Figure 19:
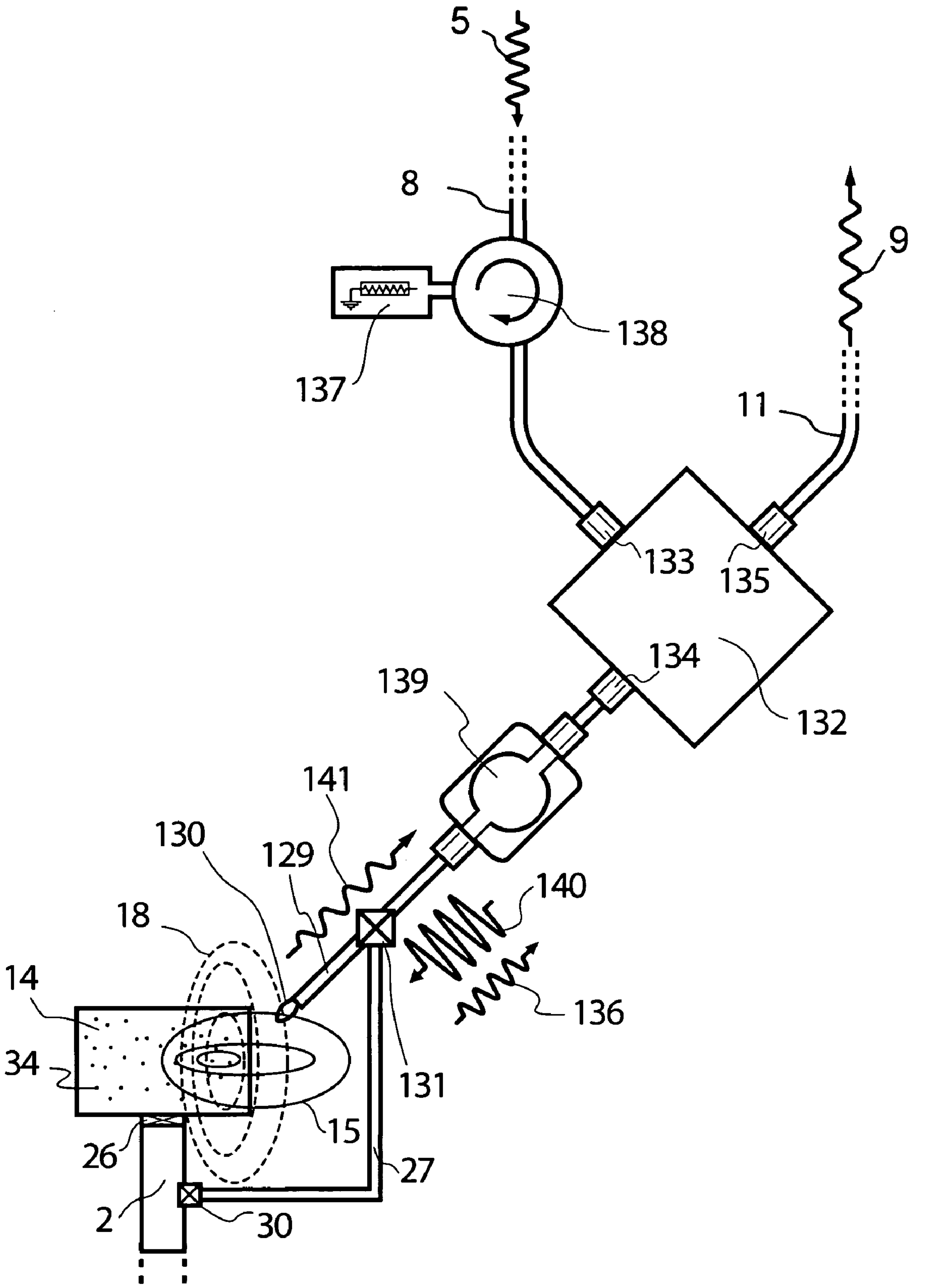

Clarifying Descriptions:

FIG. 19 explains how the maser oscillator can be operated with just a single dual-functioning coupling means.

Figure 20:
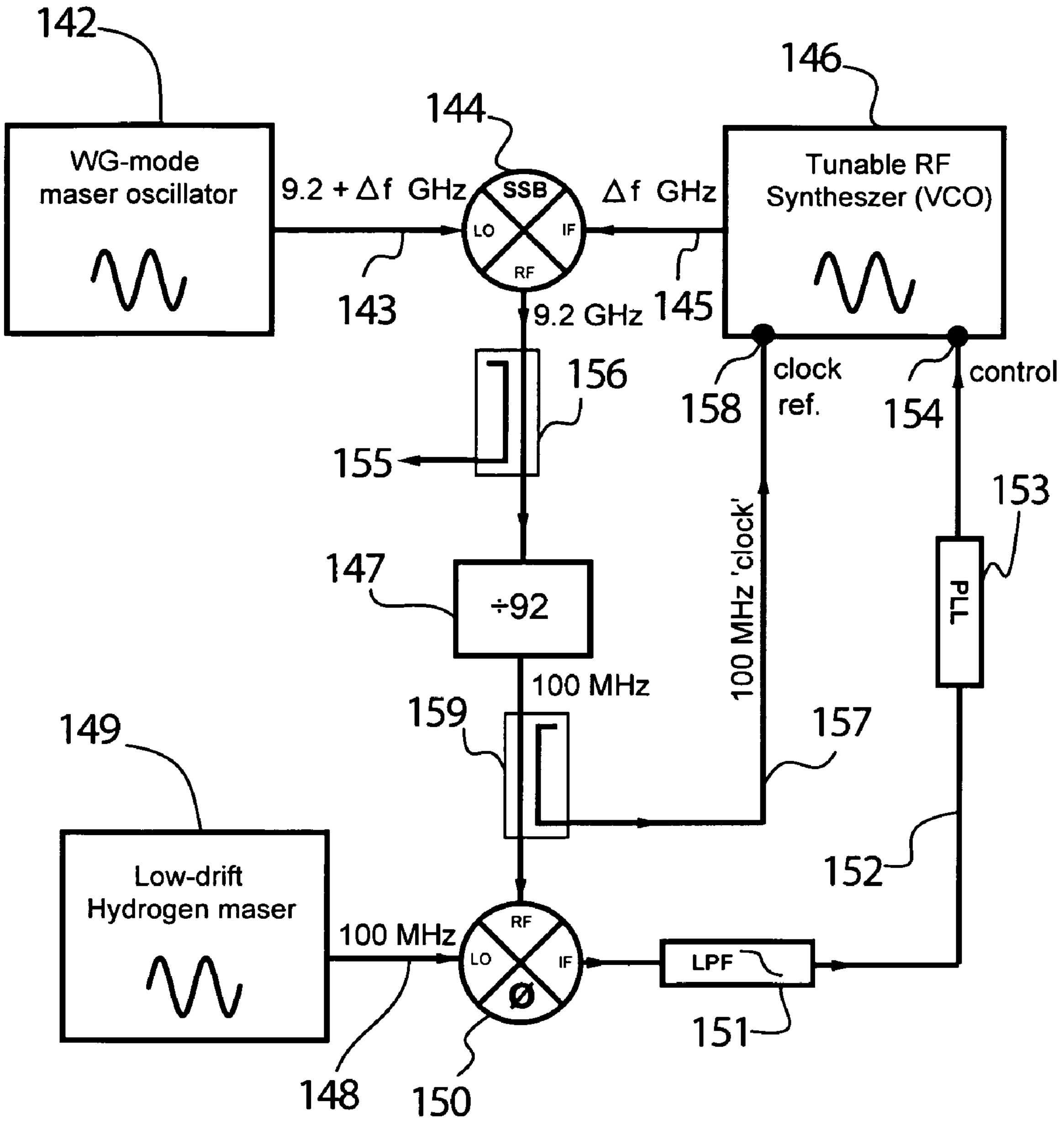

FIG. 20 shows a scheme for combining the maser oscillator with a low-drift frequency reference to provide a simultaneously low-phase-noise and low-drift frequency source.

Figure 21:
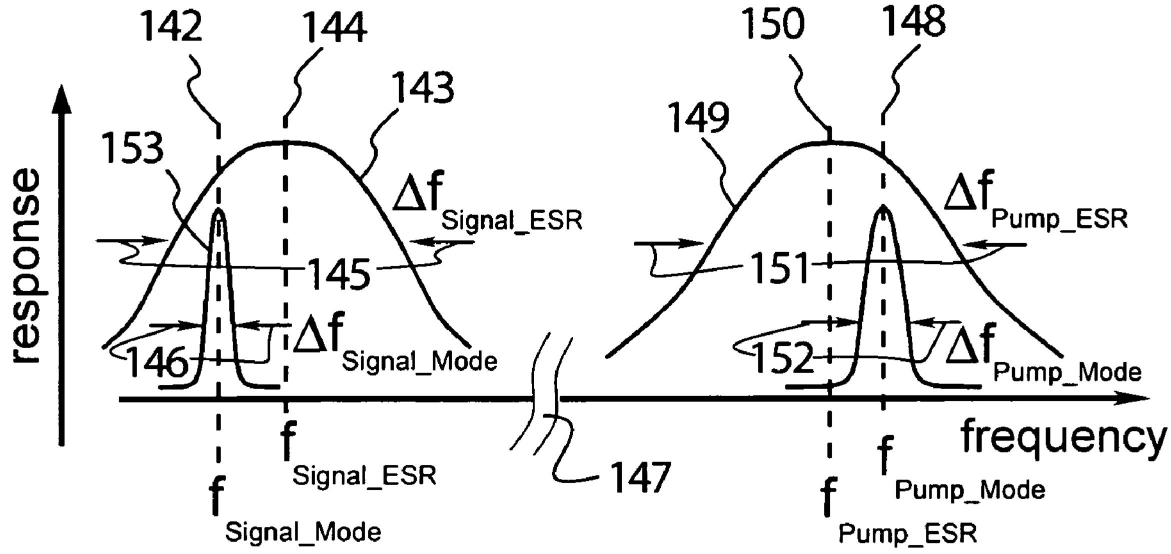

FIG. 21 shows, in frequency space, the relative profiles and locations of the maser oscillator's associated electromagnetic modes and electron paramagnetic resonances.

Figure 22:
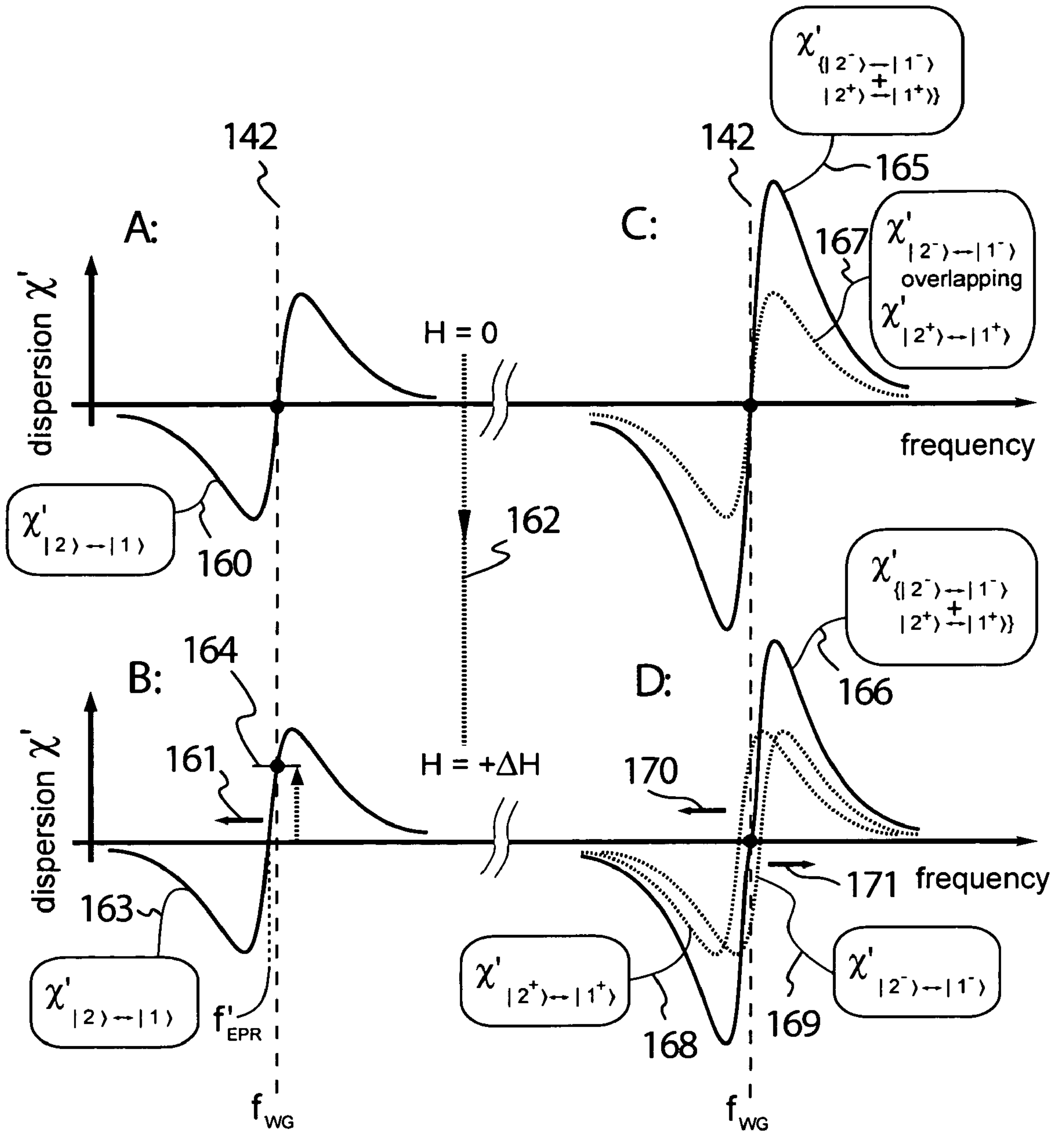

FIG. 22 explains graphically why the zero-field variant of the whispering-gallery-mode maser oscillator is immune (to first order) to fluctuations in the ambient magnetic field.

ESSENTIAL FEATURES

The term 'microwave' is used below to denote an electromagnetic wave whose frequency lies between 100 MHz and 1 THz, and which typically lies between 1 GHz and 100 GHz. Other technical terms that appear below (such as 'pump' and 'signal', for example) are those that are most commonly used by experts in the art of maser amplification and/or in the design and construction of electromagnetic resonators at microwave frequencies.

Principle of Operation

Figure 1:
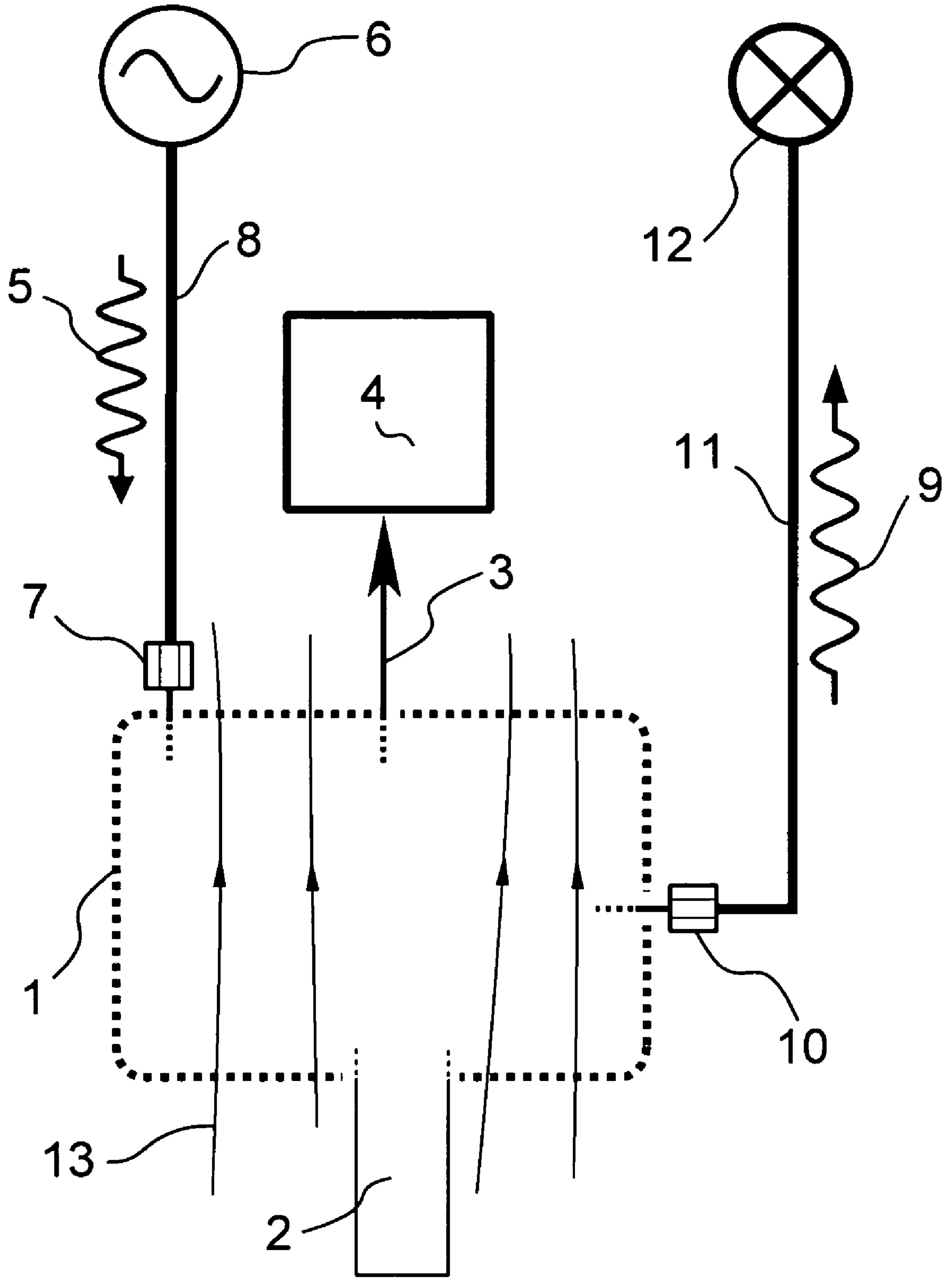

FIG. 1 presents the overall operational scheme of the invention focussing on its inputs, outputs and environmental requirements. The active resonator, whose periphery/outline is indicated by 1, and whose components are described in relation to FIG. 2 below, is held or supported by some mechanical means 2. The active resonator 1 is also cooled to and maintained at a cryogenic temperature, typically below 100 K, through the transfer of heat 3 to a cold reservoir 4 of some refrigerator (not shown). A typical embodiment of this cold reservoir is the cold flange of a vacuum can that is attached to an insert that is immersed into a dewar filled with liquid helium. The cold part of a pulse-tube cooler, of a thermoelectric (Peltier) cooling element, or of any other means of refrigeration, could equally well embody the required cold reservoir 4. The various ways in which heat can be transferred between the active resonator and the refrigerator's cold part shall be described in relation to FIG. 2 below.

A microwave pump 5 is generated by a pump source 6, such as a Gunn-diode oscillator, or klystron, or microwave synthesizer. The pump is conveyed to the active resonator's input connector 7 by some electromagnetic guiding means 8, such as a coaxial cable, rectangle waveguide, or strip line. In response to the applied microwave pump 5, the active resonator 1 generates waste heat, which is also removed from it by heat transfer 3. But the active resonator also produces, through active maser oscillation (described in connection with FIG. 4 below), a useful microwave 'signal' 9, issuing from its output connector 10, that is conveyed by an electromagnetic guiding means 11 to the maser oscillator's room-temperature output 12. The signal's frequency stability is significantly greater than that required of the pump. In certain embodiments, the two electromagnetic guiding means 8 and 11 may be substantially consolidated, with the microwave pump 5 and signal 9 propagating in opposite directions through what is the same structure (e.g. a waveguide). For functional clarity in the drawings, however, such consolidation, though acknowledged here as a (potentially desirable) possibility, is not explicitly depicted or considered further.

Figure 4:
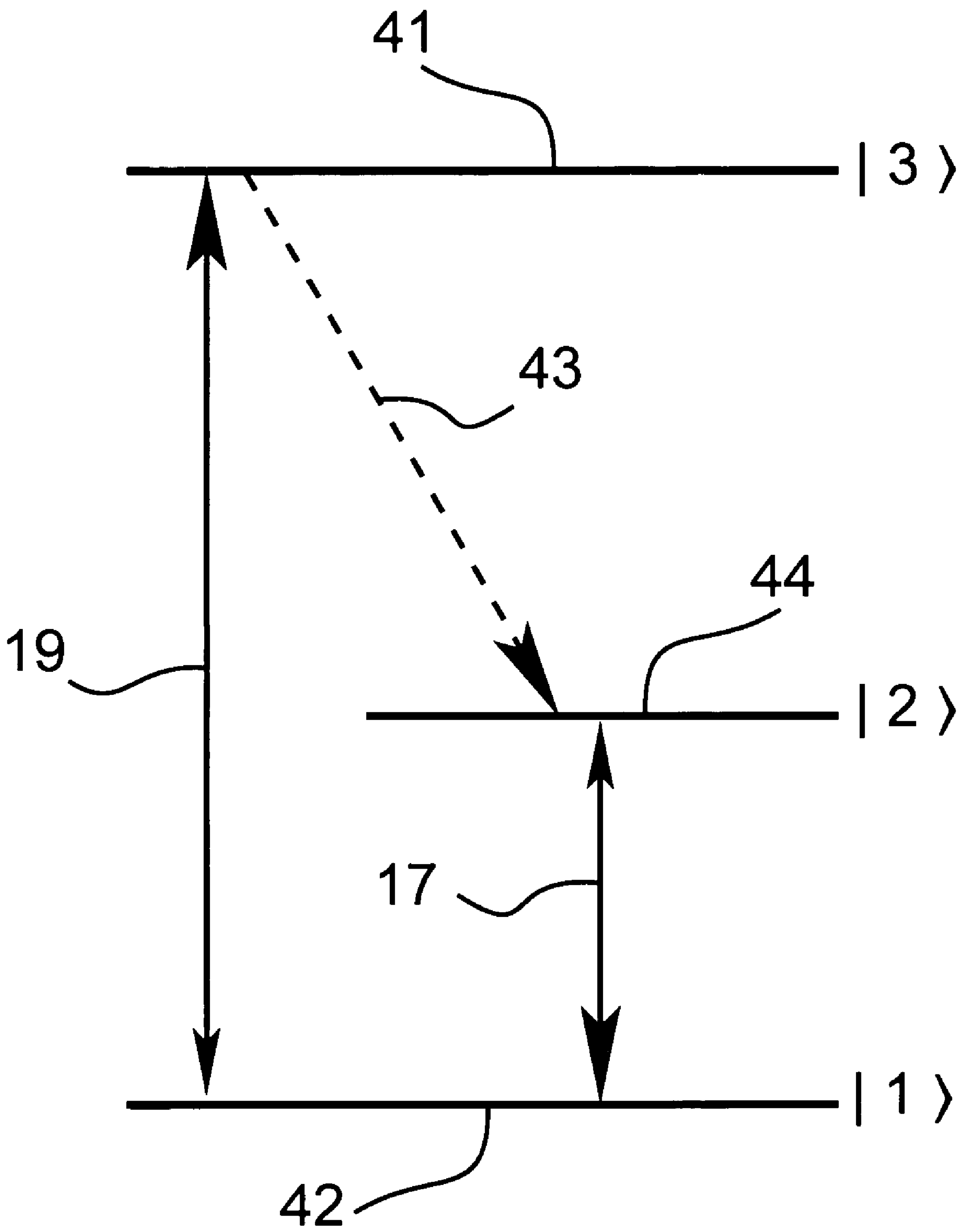

Applied D.C. Magnetic Bias Field: In certain embodiments of the invention, though not all, it is necessary to subject the active resonator to a d.c. magnetic 'bias' field 13. More precisely, and with reference to FIG. 2, this field need only run through the annular periphery of the dielectric body 14 that supports the active resonator's signal-WG mode 15—these elements shall all be described subsequently. The magnetic field 13 should have the appropriate strength, direction and uniformity for the particular embodiment's maser scheme (FIG. 4). It can be supplied by one or other magnetic field generator 16 (shown in FIG. 5), located either inside of or outside of the above said refrigerator, using equipments and methods well known to experts in the art of magnetic field generation. [Some specific options are stated in connection with FIG. 5 below.]

Active Resonator

Figure 2:
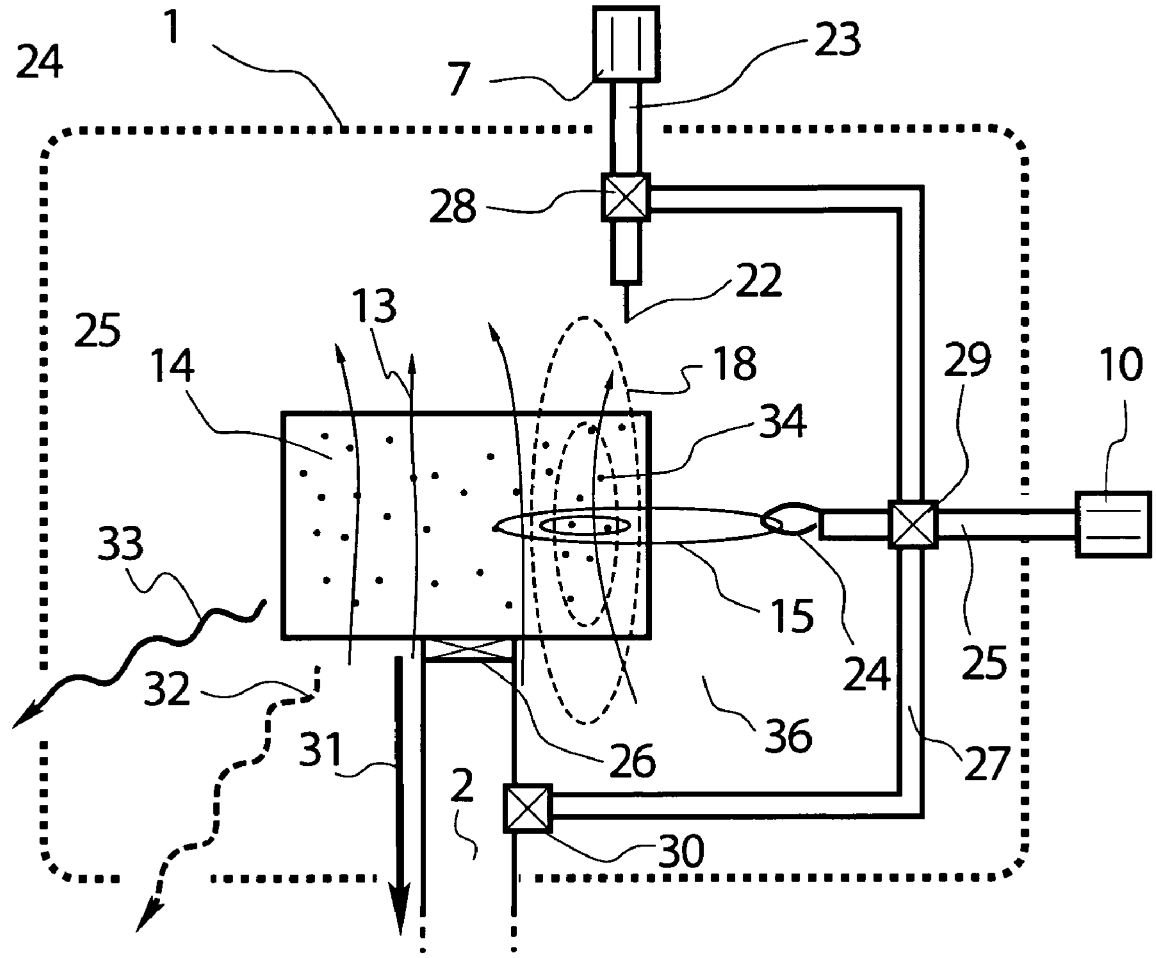

FIG. 2 presents the basic anatomy of the active resonator, whose periphery 1 also appears in FIG. 1; it includes those features of the active resonator that are essential to its operation. The active resonator contains a rigid dielectric body 14, whose properties are described in detail further on below. This dielectric body wholly supports an electromagnetic whispering-gallery (WG) mode 15, in the sense defined through the Background, which couples to the maser signal transition 17 (FIG. 4); this necessarily requires that the frequency of this WG mode lie within the linewidth of the maser signal transition. This mode shall henceforth be referred to as the 'signal-WG mode'. A different electromagnetic mode 18 couples to the maser pump transition 19 (also FIG. 4); its frequency necessarily lies within the linewidth of the maser pump transition 19. This latter mode shall henceforth be referred to as the 'pump mode'. It can be either (i) a different WG mode that is also wholly supported by the same dielectric body 14, or it can be (ii) a mode that is supported by a surrounding optional electromagnetic cavity 20 with reflective walls 21 (both in FIG. 6) that contains, and is thus dielectrically loaded by, the dielectric body 14.

Electromagnetic Coupling:

The active resonator necessarily contains a means for conveying and injecting, the above said microwave pump 5, as received at the resonator's input connector 7, into the resonator's electromagnetic pump mode 18 and also a means for extracting and conveying, the above said microwave maser signal 9, as issued from the resonator's output connector 10, from the resonator's electromagnetic signal-WG mode 15. Each of these two means shall henceforth be referred to as an 'electromagnetic (e.m.) coupling means' or, more simply, an 'e.m. coupler'. What is essential here is that the degree of electromagnetic coupling to the pump mode 18, as realized through its associated e.m. coupler, and the degree of electromagnetic coupling to the signal-WG mode 15, as realized through its associated e.m. coupler, are both at the appropriate levels for sustaining active, above-threshold maser oscillation, where (i) the pump power applied to the input connector 7 is modest (typically, this means less than 100 mW) and (ii) the maser signal power provided at the output connector 10 is sufficient (typically, this means greater than 1 pW). With suitably configured and finely adjusted signal-WG and pump modes [and a filter/diplexer (not shown) to strip off the reflected pump], it is possible for a single e.m. coupler (not shown) to serve as the e.m. coupler for both modes, whose frequencies are in general quite different. However, the flexibility of having an e.m. coupler dedicated to each mode, such that the e.m. coupling to the signal-WG and pump modes can be set independently, is typically far more desirable. The possibility of a single 'multitasking' coupler shall, for the sake of clarity in the immediate drawings and descriptions, be suppressed until the Clarifying Descriptions section, where it is described in detail in connection with FIG. 19.

Each e.m. coupling means comprises (i) a rigid 'field probe' or 'aperture', that is exposed to the electromagnetic field of the mode to which the e.m. coupling means couples, (ii) a 'connector' to which a standard microwave cable assembly, or a connectorized component, or any sort of microwave guiding means or transmission line can be connected with a tolerably low VSWR, and (iii) a rigid electromagnetic transmission line for guiding electromagnetic energy between the said probe or aperture and the said connector. In certain embodiments, the transmission line (iii) may be omitted (or becomes so short as to loose it functional distinction), with the connector and field probe joined directly together. For example, one possible embodiment of a suitable e.m. coupling means is a length of RG405 semi-rigid coaxial microwave cable; one end of this length of cable lies in the vicinity of the electromagnetic mode to which the e.m. coupler is intended to couple; a small length of the cable's outer conducting jacket at this end is removed to form an electric-field probe (i.e. a 'stub' antenna); the other end of the semi-rigid cable, which lies away from the electromagnetic mode, is terminated by a standard SMA connector. This is but one example.

With reference to FIG. 2, the pump-mode e.m. coupler comprises a field probe 22, a rigid transmission line 23, and the resonator's input connector 7. Similarly, the signal-mode e.m. coupler comprises a field probe 24, a rigid transmission line 25, and the resonator's output connector 10. Beyond the example just given above, embodiments of the e.m. couplers for either the pump mode or the signal-WG mode could also be based on suitable sections of hollow waveguide, or strip line, or other types of microwave transmission line, together with their corresponding field probes or apertures or 'launchers' and their standard connectors. Since the frequency and/or the spatial configuration of the pump mode may or may not be significantly different to that of the signal mode, optimal embodiments of the respective e.m. coupling means for the pump and signal modes may or may not incorporate different types of transmission line. For example, the maser signal could be extracted using an e.m. coupler whose transmission line takes the form of a semi-rigid coaxial cable, whereas the pump could be applied to the resonator with an e.m. coupler whose transmission line takes the form of a rectangular waveguide that is potentially re-entrant with respect to a wall of the active resonator's optional electromagnetic cavity 20 (FIG. 6), as described in the section entitled 'Options and/or Desirable Features' below, where the re-entrant waveguide is potentially occluded with an orifice so as to adjust the degree of electromagnetic coupling.

Mechanical Support and Fastening:

The dielectric body 14 is attached by some mechanical or chemical fastening means 26, which may allow for thermal conduction, to the active resonator's supporting means 2. One possible embodiment of this fastening means is thermally conducting epoxy glue such as Stycast 2850FT. The positions and orientations of the field probes 22 and 24 of the active resonator's two e.m. couplers are held fixed with respect to the dielectric body by a rigid frame 27, to which both the probe-mode and signal-WG-mode e.m. couplers are rigidly attached by some mechanical or chemical fixing means, 28 and 29 respectively, and where the rigid frame 27 is also rigidly connected to the dielectric body. The latter rigid connection may involve one or more mechanical fastenings, such as 30, between the frame 27, the dielectric body and the active resonator's supporting means 2. All that is essential here is that the relative spatial positions and orientations of (a) the dielectric body, (b) the pump and signal-WG modes, and (c) their associated e.m. couplers are all held constant.

Thermal Transport:

The solid-state maser action, as described below in connection with FIG. 4, which is essential to the present invention's working mechanism, requires that the dielectric body be maintained at a cryogenic temperature, typically lying below 100 K. Heat is generated in the active resonator, at various locations, through a number of either essential and/or unavoidable processes: (i) the quantum efficiency of the maser process is less than unity; non-radiative transitions between the levels of the dielectric body's included paramagnetic ions cause heat to be generated within the dielectric body. The energized pump and signal-WG modes cause heat to be generated both (ii) in the dielectric body through dielectric losses and (iii) in the e.m. couplers and the walls of the optional surrounding electromagnetic cavity (described in connection with FIG. 6 below) through conductive and/or dielectric losses. Furthermore, as shall be described in relation to FIG. 5 below, it is often desirable to deliberately heat the active resonator as a means of actively stabilizing the dielectric body's temperature together with those elements of the active resonator that are thermally coupled to it. Sustained and/or stable maser oscillation requires that the total heat generated by all these processes within the active resonator be got rid of by transporting it to the cold reservoir 4 (in FIG. 1), lest the temperature of the dielectric body rise above that for which maser action/oscillation is feasible.

If all the means of heat transfer within the active resonator are passive, this in turn requires that the temperature of the cold reservoir be lower than that of the dielectric body that it contains. Suitable passive means of heat transfer include (i) solid thermal conduction 31, as typically embodied with a copper braid or 'strap' (not shown), together with an associated thermal anchor or fastener at each of the strap's ends (not shown), where the thermal conductive path between the dielectric body and the cold reservoir may or may not include the resonator's mechanical supporting means 2; (ii) gaseous transport 32 between the surface of the dielectric body and the surface(s) of the cold reservoir by a so-called 'exchange gas' such as helium, at a suitable partial pressure; (iii) radiative transport 33, either directly or indirectly (i.e. via 'radiative baffles') between the same surfaces; or some appropriate combination of (i), (ii) and (iii).

Active means of heat transfer, including additional layers of refrigeration within the active resonator itself, are also possibilities. For example, a cryogenic thermoelectric cooler (not shown) could be inserted within the dielectric body's mechanical/thermal fastening means 26 and used to cool the dielectric body exclusively. Because the essential process of maser action within the dielectric body generates little heat (typically microwatts), the cooling power required by such a local refrigerator can be modest.

To recapitulate: irrespective of the particular means of refrigeration and/or heat transfer, what is essential to the working process of the active resonator is that its dielectric body can be kept cold enough for 'above-threshold' active maser oscillation to occur at a pump power that is both (i) attainable with respect to the pump generator's maximum output, and (ii) one that does not cause the refrigerator's maximum sustainable heat load to be exceeded.

Supported Electromagnetic Modes

As stated above, the essential function of the dielectric body 14 is to support a whispering-gallery mode to serve as the maser signal-WG mode 15, where the mode's frequency lies within the linewidth of the maser signal transition 17. Furthermore, this mode's non-magnetic Q should be extremely high (typically $>10^7$), and the mode's electromagnetic field configuration should be such that is couples sufficiently strongly to the maser signal transition 17 (FIG. 4) of the masering paramagnetic ions 34 included within the dielectric body 14. In certain embodiments, such as the first experimental embodiment described below, the dielectric body also directly supports a different WG mode, that is used as the active resonator's pump mode 18. Similarly, the electromagnetic field configuration of the pump mode, whether it be wholly supported by the dielectric body or not, must be such that is couples sufficiently to the maser pump transition 19.

Figure 3:
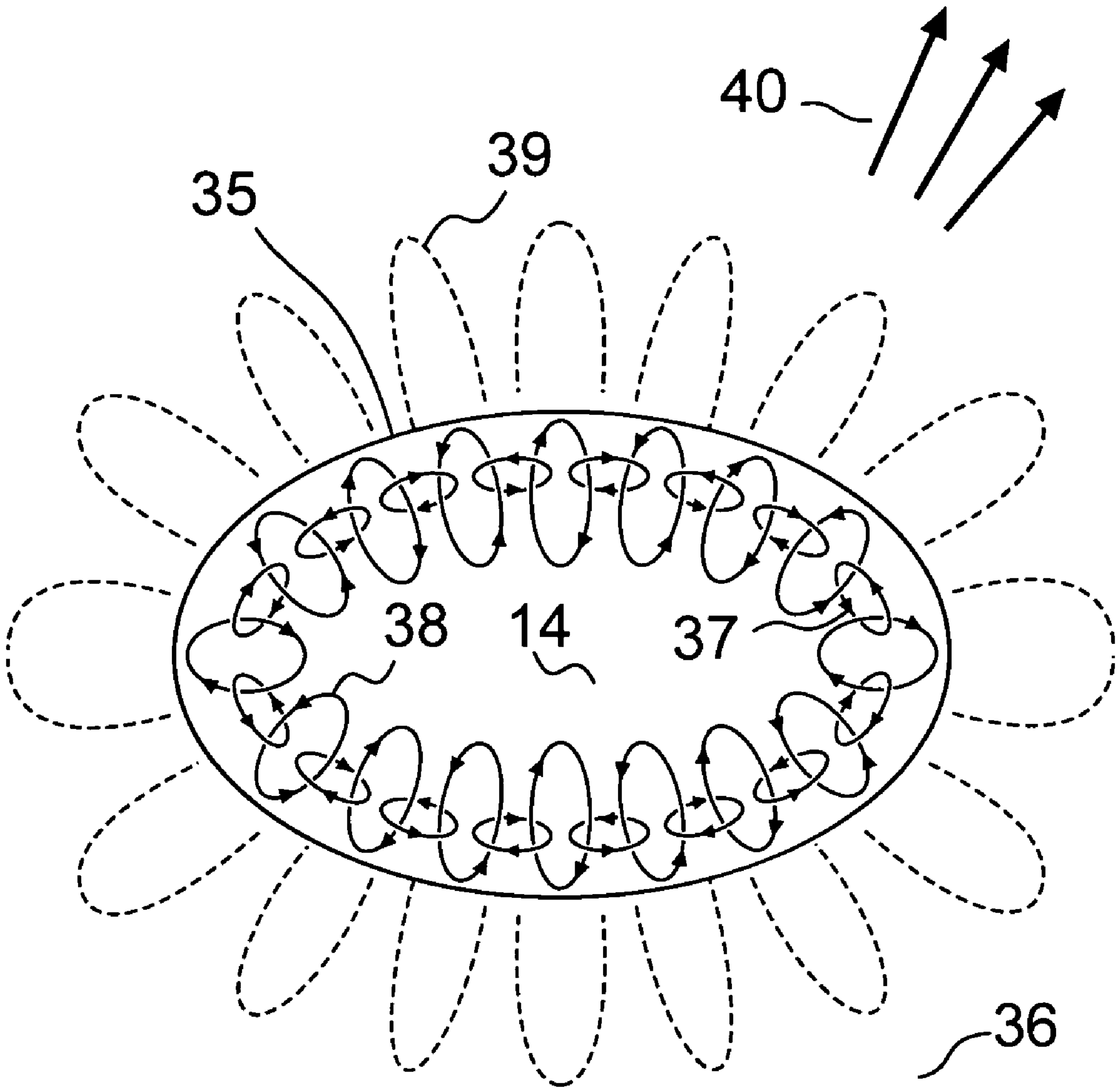

With reference to FIG. 3, the dielectric body 14 has a surface, where a section of this surface takes the form of a closed, convex strip or 'band' 35, and where beyond this convex band lies free space 36, and where this band, as a convex dielectric-vacuum interface, supports either standard (i.e. rotationally symmetric) or generalized whispering-gallery (WG) modes—with the meanings of 'standard' and 'generalized' as given in the Background. The WG mode's electromagnetic field pattern comprises loops of electric displacement 37, which lie broadly orthogonal to loops of magnetic flux density 38. [The electric displacement ('D') and magnetic flux density ('B') are shown in favour of the electric field strength ('E') and the magnetic field strength ('H') because lines of D and lines of B are conserved across a dielectric and/or paramagnetic interface, whereas lines of E or H in general are not. See, for example, 'Electricity and Magnetism', B. I. Bleaney and B. Bleaney, Oxford University Press, 3rd Edition (1976). Thus, in the absence of free charges and of currents, lines of electric displacement D and lines of magnetic flux density B lie in closed loops, which greatly facilitates their graphical depiction. These remarks also apply to FIGS. 7, 8, 11, and 12 below.] The loops of electric displacement and magnetic flux density, and hence the WG mode's electromagnetic energy density, are predominantly confined to the relatively thin layer of dielectric lying just within (i.e. underneath the surface of) the convex band 35. Beyond the surface of the dielectric body, the WG mode's electromagnetic field 39 is evanescent and decays exponentially with distance away from the surface such that the far-field radiation 40 lost by the WG mode is extremely small.

The material properties and features of the dielectric body 14 that allow the Q of the whispering-gallery modes that the dielectric body supports to be high are now discussed in detail. In what follows, the term 'free space' is used to denote what is an electromagnetic vacuum except for the possible presence of an exchange gas for thermal conduction, such as gaseous helium typically at a pressure of 10 μBar at 4.2 K, whose presence does not significantly affect the vacuum's electromagnetic properties with regard to the active resonator's essential working mechanism. The free space 36 in FIGS. 2, 3, and 5-12 is all of this sort.

In general, the active resonator's dielectric body will comprises one or several solid dielectric pieces together with either none, one or several solid mechanical supporting pieces (not shown), together with one of several rigid mechanical or chemical fastening means (not shown) for holding these constituent pieces together. This/these fastening means may or may not be incorporated into the fastening means 26 that secures the dielectric body to the active resonator's supporting means 2. The dielectric material out of which any one of these said solid dielectric pieces is made may, though need not, be different from that out of which any other one of the said solid dielectric pieces is made. The layer of dielectric underneath the above said convex band 35, which electromagnetically supports the WG modes 15 and (optionally) 18, shall henceforth be referred to as the dielectric body's 'annular periphery'; the spatial extent of such an annular periphery, in relation to its inscribing dielectric body and the WG modes that it contains, is described in connection with FIG. 8 below.

To support a whispering-gallery mode of high Q, the annular periphery should only contain 'good' dielectric materials that satisfy, at microwave frequencies, the following criteria: (i) the magnitudes of both the real and the imaginary parts of all elements of the material's complex magnetic susceptibility tensor are less than $10^{-4}$; (ii) the real parts of the diagonal elements of its complex relative electric permittivity tensor are all greater than 1.05, and (iii) the imaginary parts of all elements of the same tensor are all less than $10^{-4}$. The solid material out of which each of the said dielectric pieces is made thus approximates to that of a low-loss dielectric, with a low residual magnetic susceptibility. Synthetic monocrystalline sapphire, as it is commercially grown, is an example of such a material (it is certainly not the only one); the electric permittivity of monocrystalline sapphire is anisotropic, where its complex relative electric permittivity tensor is diagonal and exhibits a rotational symmetry about its so-called c-axis. Often included within commercially grown monocrystalline sapphire is a solid dilution of paramagnetic ions 34 (in FIG. 2 and also 6), which bestow upon the material a small paramagnetic susceptibility.

The materials that compose the dielectric body should realize both a rigid structure and one that enables the heat generated within it be conducted away, involving one or several of the means of heat conduction mentioned above. Thus, the dielectric body's otherwise purely mechanical components, which do not enter its annular periphery, may nevertheless be required to be good conductors of heat. In this regard, for example, a spacer made of beryllia would be favoured over one made of silica. Typical fastening means include a bolt, nut and washers, or glue that is capable of surviving cryogenic shock, or a dry optical contact between flat, polished surfaces.

Illustrative examples: a simply embodiment of a dielectric body that supports standard whispering gallery modes is a single piece of monocrystalline rutile ($TiO_2$) whose form is that of a solid cylinder, where the so-called optical or c-axis of the monocrystalline rutile is oriented to lie exactly parallel to the cylinder's axis of rotational symmetry. A more perverse embodiment is a piece of p.t.f.e. in the form of a 'cog wheel' as opposed to a cylinder; the cogwheel exhibits discrete N-fold rotational symmetry about it rotational axis, where N is the number of teeth that it possesses; such a body will support whispering-gallery-like modes whose azimuthal mode order equals N/2. The annular periphery of the dielectric body in this case includes both these said teeth and the free space that lies between them. Finally, an embodiment that supports generalized whispering-gallery modes is a single piece of monocrystalline sapphire in the form of an elliptical prism, where the prism's geometric axis is oriented parallel to the crystal sapphire's c-axis. Variously different and more intricate embodiments that support high-Q whispering-gallery modes can be extrapolated from these examples.

As declared above, the pump mode 18 is either (i) a WG mode, that is wholly supported by the dielectric body's convex surface band 35, or it is (ii) a different type of electromagnetic mode that is supported by a rigid electromagnetic cavity 20 (in FIG. 6) containing one or several reflective surfaces 21 that are stationed at a distance from the dielectric body. In the case of (ii), the void between the annular periphery of the dielectric body and these said reflective surfaces is filled with free space 36 except, potentially, for the e.m. coupling means (or parts thereof) for the pump and signal-WG modes. Suitably reflective surfaces can be made from either a normal metal such as copper or silver, or a superconductor such at niobium or lead, depending on the operating temperature. Irrespective of which type of electromagnetic mode is used for the pump mode 18, it is essential is that (a) the electromagnetic field configuration of the pump mode, particularly the direction/polarization of the oscillating magnetic field that the configuration defines in the vicinity of the signal-WG mode, is appropriate for pumping the paramagnetic ions 34 that lie within the signal-WG mode and (b) the pump mode has a sufficiently high Q so that it can be energized enough to sufficiently saturate the maser pump transition 19 (FIG. 4) without excessive pump power being dissipated within the active resonator.

Electronic Paramagnetic Resonance (EPR) and Maser Action

At least one of the pieces of dielectric that compose the dielectric body's annular periphery must contain a solid dilution of ions 34, where the quantum states of these ions exhibit paramagnetic transitions at microwave frequencies. Such transitions are associated with the physical phenomenon of electronic paramagnetic resonance (EPR), also known as electronic spin resonance (ESR). [See, for example, 'Electron Paramagnetic Resonance', J. W. Orton, Iliffe Books Ltd, London (1968); 'Electron Paramagnetic Resonance of Transition Ions', A. Abragam and B. Bleaney, Clarendon Press, Oxford (1970)]. These paramagnetic ions 34 are the resonator's essential, 'active' ingredient. A representative example of such a both paramagnetic and dielectric material is pink ruby, i.e. monocrystalline sapphire, $Al_2O_3$, where a small fraction of the sapphire's constituent aluminum is replaced by chromium $Cr^{3+}$ ions. Another example of such a paramagnetic dielectric is aluminum nitrate salt, $Al(NO_3)_2$. $9H_2O$, where a small fraction of the salt's $Al^{3+}$ ions are replaced by iron $Fe^{3+}$ ions. These are not the only two examples. Though the substitutive concentration of the paramagnetic ions within its dielectric host can range over many decades whilst still providing detectable resonances, a typical experimental concentration is 1 part in $10^4$.

The active resonator's means of amplification, i.e. maser action, by which oscillation on the signal-WG mode 15 is sustained, requires that there be sufficient spatial overlap between (i) the signal-WG mode 15, (ii) the pump mode 18, (iii) the above-said paramagnetic ions 34 and, in those embodiments that need it, (iv) the applied d.c. magnetic bias field 13. Furthermore, the relative (i) configurations/polarizations (i.e. WGH versus WGE) of the signal-WG and pump modes, (ii) orientation of the crystal(s) in which the paramagnetic ions reside, as well as (iii) direction of the applied d.c. magnetic bias field, must all be appropriate. These requirements are generally well understood by experts in the arts of EPR/ESR and solid-state maser amplification.

FIG. 4 depicts the energy levels and transitions for a generic pump-signal maser scheme through which the active resonator's means of amplification can be realized. For simplicity, a classic three-level maser scheme is shown, as conceived by Bloembergen almost half a century ago ['Proposal for a New Type Solid State Maser', by N. Bloembergen, Physical Review, pp. 324-327 (1956)]. The quantum-electronic principles and practical workings of such a three-level maser, as applied to solid-state systems, are presented in the Siegman's monograph. ['Microwave Solid-state Masers', A. E. Siegman, McGraw-Hill (1964).] Other, either less direct or more complicated maser schemes incorporating 'harmonic pumping' or even 'multiple pumping', such as 'push-pull' or 'push-push' or 'pull-push', lie within the scope of this invention. These variants (not shown) are all well known to experts in the art of maser amplification and are described, for example, in Siegman's 1964 monograph [already referenced, particularly pages 292-299.]. Note that multiple pumping would in generally require additional pump sources, electromagnetic pump modes, and associated e.m. couplers, which many or may not be multi-tasking (in the sense defined above).

The quantum-electronic energy levels and their associated energy eigenstates or wavefunctions, which describe the quantum states of the above said paramagnetic ions are defined by (i) the atomic species (e.g. chromium Cr versus iron Fe) and (ii) the chemical oxidation state (e.g. $Cr^{3+}$ versus $Cr^{2+}$), as well as (iii) the crystal field to which these ions are exposed within its dielectric host and, if present, the strength and orientation of the externally applied d.c. magnetic bias field. Typically, these quantum-electronic energy levels and eigenstates are such that the transition probability (i.e. the so-called 'matrix element') for an electromagnetically induced transition between at least one non-adjacent pair of energy levels is greater than $10^{-6}$ free-spin units (these units are explained in the Background).

Maser Action:

With reference to FIG. 4 and previous figures: The microwave pump 5 is coupled to the pump mode 18 by the pump-mode e.m. coupler comprising 7, 23 and 22, and thereby the pump mode is energized. The frequency of the pump mode lies within the linewidth of the maser's so-called pump transition 19. The energized pump mode induces transitions between the upper 41 and lower 42 levels of this pump transition. Provided the pump transition is sufficiently 'saturated', non-radiative relaxation processes 43 subsequently cause a population inversion between the middle 44 and lower 42 paramagnetic levels as connected by the maser's so-called signal transition 17. The frequency of the above-mentioned signal-WG mode lies within the linewidth of this signal transition. Energy in the signal-WG mode 15 stimulates transitions between the upper and lower levels of the signal transition and, due to the said population inversion, such stimulated transitions will cause net energy to be transferred from the paramagnetic ions to the signal-WG mode. If the loaded (nonmagnetic) Q of the signal-WG mode is high enough, the so-called threshold for maser oscillation is exceeded whereupon the energy in the signal mode increases up to a level at which the population inversion on the signal transition becomes depleted, i.e. the signal transition itself saturates. The field probe 24 of the active resonator's e.m. coupler (comprising 24, 25, and 10) couples power out of the energized signal-WG to provide a maser signal 9 at the said coupler's connector 10. This maser signal 9 is in turn conveyed to the maser oscillator's room-temperature output 12.

The field amplitude of the pump mode 18 as seen by the paramagnetic ions 34 need not be so high as to fully saturate the pump transition, but it does need to be sufficient to cause a sufficiently large population inversion across the signal mode transition 17 for the threshold for active maser oscillation to be exceeded. The essential condition for active maser oscillation, and thus the essential condition for the present invention's means of operation, is that the magnitude of the inverse of the so-called 'magnetic Q' of the signal whispering-gallery (WG) mode 15 should be greater than the inverse of the loaded (non-magnetic) Q of the same signal-WG mode. The value of the negative magnetic Q depends on several factors including (i) the amplitude of the pump mode's electromagnetic field (which in turn depends on the pump power, and both the e.m. coupling to and Q of the pump mode), (ii) the strength of the pump transition, (iii) the so-called spin-lattice relaxation time $T_1$, (iv) the temperature (of the dielectric body), (v) the strength of the signal transition, (vi) the linewidth of the signal transition (related to the spin-spin relaxation time $T_2$) . . . and several of these parameters themselves depend on temperature. Relevant formulae are stated in textbooks that cover the art of electronic paramagnetic resonance and solid-state maser design, such as Orton's 1968 and Siegman's 1964 monographs [both already referenced above]. Typically, the magnitude of the negative magnetic Q is $10^5$ or greater and the loaded non-magnetic Q of the signal-WG mode is $10^7$ or greater. In the practice, significant saturation of the pump-transition, and thereupon the attainment of a sufficient population inversion to exceed the threshold for maser oscillation, requires that the dielectric material that contains those paramagnetic ions that power the signal-WG mode be maintained at a cryogenic temperature below 100 K, and typically below 20 K.

The loaded Q of the signal-WG mode, as determined by the mode's loading and its intrinsic losses is at least a factor of $10^4$ greater than the line Q of the paramagnetic ion's signal transition, as determined by the ion's so-called spin-spin relaxation time $T_2$. In this regard, the present maser oscillator, that runs on a high-Q whispering-gallery whose frequency is defined by the shape and electromagnetic properties of a dielectric body, is distinctly different from atomic maser oscillators, such as the hydrogen maser, or those solid-state maser oscillators ('solid clocks') proposed by Bloembergen, as were both described and referenced in the Background. With such atomic maser oscillators, the line Q of the masering atom's signal transition is far higher than that of the electromagnetic mode to which the transition is coupled. The absolute reverse is true—and typically by a factor $10^4$—in the case of the present invention.

Advantages

Fundamental:

The proposed active resonator takes the form of a loop oscillator whose loop is the path taken by the signal whispering-gallery (WG) electromagnetic mode around and within the annular periphery of the active resonator's dielectric body that supports the mode; this path follows the closed chain of interlocking electric 37 and magnetic 38 field loops shown in FIG. 3. Thus, in effect, the loop of the loop oscillator is the signal-WG mode. Both the resonator's frequency reference and its means of frequency regulation [i.e. (A) and (B) in the Background] benefit from the colossal multiple interference of the electromagnetic wave that circulates in the signal-WG mode, in consequence of the mode's high non-magnetic Q. Furthermore, the resonator's means of amplification [i.e. (C) in the Background] is distributed continuously (and typically quite uniformly) around the loop.

In a typical embodiment of the WG-mode maser oscillator, with an output frequency in the microwave X-band region, this loop has characteristic dimensions of just a few centimeters and can (though need not) be perfectly circular. Compared to the spatially extended Pound-stabilized-loop (PSL) oscillator, mentioned previously, or even Dick et al's hybrid Superconducting Cavity Maser Oscillator, mentioned previously, the oscillator loop of the present invention is significantly more compact spatially, and in addition offers excellent mechanical, thermal and electromagnetic continuity, as well as uniformity, to its circulating signal.

Power:

The output signal power of the proposed maser oscillator is typically 10 nW (i.e. −50 dBm; see FIGS. 15 and 16), which represents an advantageous compromise between the 'perilously weak' output from a hydrogen maser (typically −90 dBm) and the 'needlessly strong' output from the Pound loop oscillator (typically −10 dBm—from the resonator's transmission port). The WG-mode maser oscillator's valley on the Allan-deviation chart, where its frequency-stability performance is advantageous, will typically reside (along the sampling-interval axis) between these two. With regard its required (input) pump power, the active resonator is extremely frugal compared with most other active microwave devices; with optimised pump-mode coupling and a sufficiently high pump-mode Q, pump powers on the order of only a few μWs suffice. The heat load placed by the active resonator's working mechanism on its supporting refrigerator is thus small, allowing considerably flexibility in the choice and design of the refrigerator.

Figure 6:
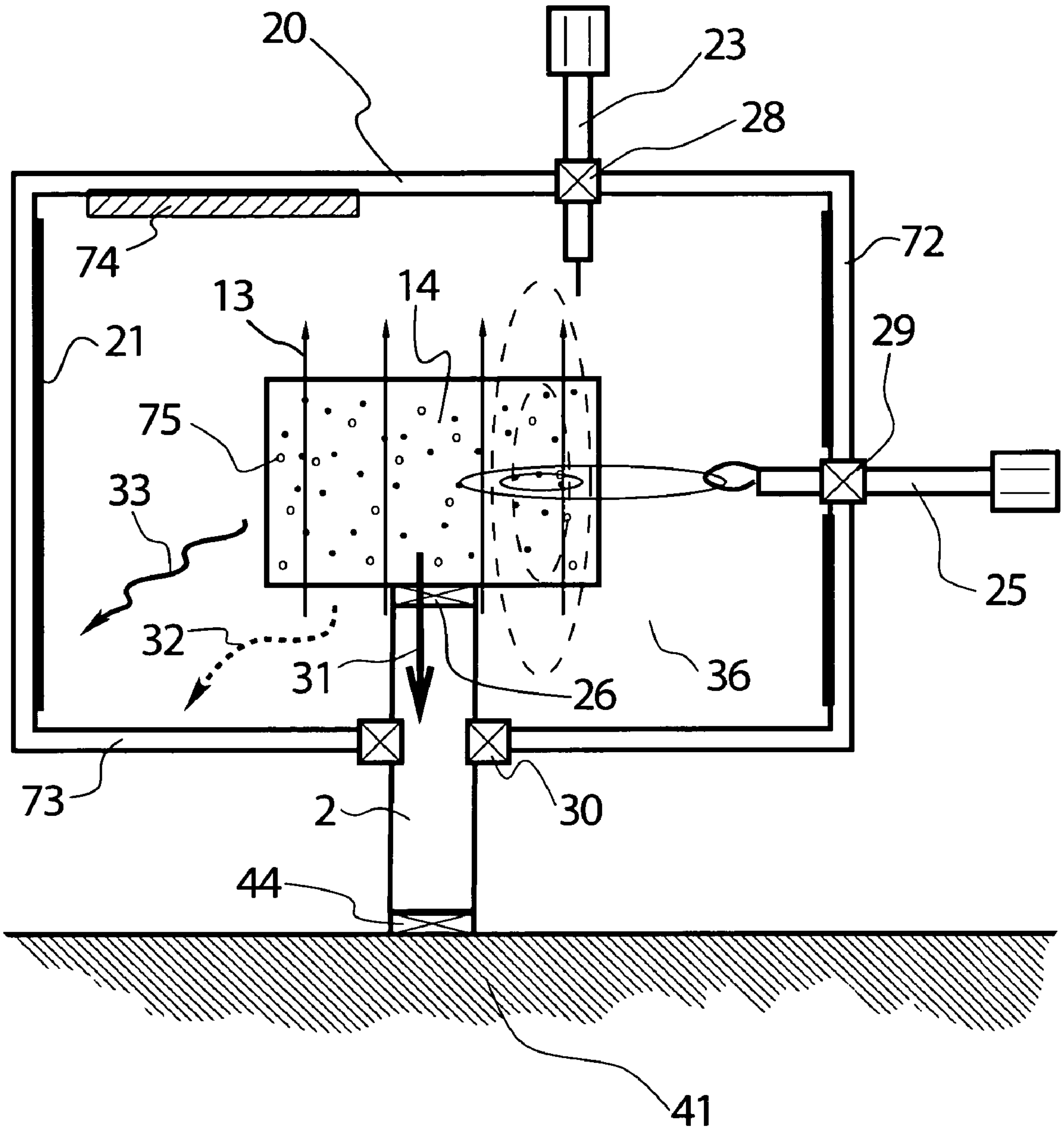

Operation in Zero d.c. Magnetic Field:

In general, a solid-state maser oscillator requires the application of a d.c. magnetic bias field 13, of the correct strength and orientation, and of sufficient temporal stability and spatial uniformity over the cryogenic volume of the masering solid. [The straightness of the magnetic field lines 13 in FIG. 6, as compared to the equivalent in FIG. 2, attempts to capture the desirability of magnetic field uniformity over the dielectric body 14.] This requirement represents a significant technical undertaking. A masering solid that requires no such bias is advantageous in many applications. Such zero-field masers have been considered by Bogle and Symmons ['Zero-Field Masers', G. S. Bogle and H. F. Symmons, Australian Journal of Physics, 12, pp. 1-20 (1959)], as was previously mentioned in the Background. As exemplified by the first experimental embodiment described below, zero-field maser oscillators based on WG modes represent a class of embodiments within the overall scope of the present invention. Moreover, the symmetrical way in which Kramers-type degeneracies are lifted about zero magnetic field means that zero-field maser oscillators generally suffer no frequency pulling to first order in fluctuations of the magnetic field about zero magnetic field; this feature could be particularly advantageous with regard to achieving high frequency stabilities.

Clamping of Population Inversion:

The imaginary part of the susceptibility associated with the oscillator's masering paramagnetic ions provides the negative magnetic Q that sustains the maser oscillator. The real part of the same susceptibility will in general contribute toward determining the frequency of the signal-WG mode, though it should be noted that this real part vanishes at the line centre of the paramagnetic ion's signal transition. Any change in the susceptibility as would occur with a change in the degree of population inversion on the maser's signal transition will thus in general cause a shift in the frequency of the maser oscillator's output (unless the frequency of the signal WG-mode lies exactly at the line centre of the signal transition). However, in analogy to the same phenomenon that occurs in lasers [see, for example, 'Lasers', (also) by A. E. Siegman, University Science Books, Mill Valley Calif. (1986), in particular pp. 510-518], the extremely high loaded Q of the signal WG-mode will cause extremely stiff 'clamping' of the population inversion across the maser's signal transition. This is turn will lead to relative insensitivity of the maser signal output's frequency to pump power.

Cryogenic Operation:

The active resonator of the present invention, or at least its dielectric body 14, necessarily operates at cryogenic temperature, typically below 20 K. The necessity of cryogenic operation may impede the invention's adoption in low-cost or portable applications but it does offer some significant advantages with regard to the active resonator's frequency-stability performance. These are stated forthwith.

By inspection of equations (1) and (2) above, one sees immediately that the frequency instabilities associated with the thermal noise of the maser oscillator and that which is imparted by its receiving amplifier decrease with decreasing temperature: both formulae have the square root of the absolute temperature, of the maser oscillator and the receiving amplifier respectively, in their numerators. Cryogenic operation of the active resonator will often conveniently allow for the use of a cryogenic receiver amplifier whose noise temperature can be significantly lower than that of one operating at room temperature.

The frequency of the signal-WG mode depends predominantly on the dimensions and the electric permittivities of the annular dielectric body's constituent components. At cryogenic temperatures, the thermal expansion of solid material 'freezes out', i.e. the material's coefficient of thermal expansion will approach zero as the absolute temperature approaches zero. This fact applies, in particular, to the components that compose the active resonator's dielectric body, i.e. its dielectric pieces, its purely mechanical supports, as well as the means by which they are fastened together. Fractional changes in the dimensions of the dielectric body as measured on a per-Kelvin basis will be significantly smaller (typically by a factor of $10^4$ or greater) at cryogenic temperatures than at room temperature. Furthermore, the change in the electric permittivity of the dielectric materials that compose the annular dielectric body will also be significantly smaller on a per Kelvin basis at cryogenic temperatures as compared to at room temperature.

Furthermore, the thermal conductivities of certain materials, particularly crystalline dielectrics, such as monocrystalline sapphire, and also certain metals such a copper, are relatively high at cryogenic temperatures meaning that, if desired, good spatial uniformity in temperature can be attained across the whole of the active resonator, including the dielectric body that supports the signal-WG mode. Such uniformity means that a system for controlling the temperature of the dielectric body by means of just a single, local temperature sensor can be relatively effective. Furthermore, sensitive, low-noise temperature sensors for operation at cryogenic temperature are available. Thus, cryogenic operation, essential to the active resonator's maser amplification, enables the temperature of the dielectric body, and thereupon the frequency of the signal-WG mode that it defines, to be held constant to a relatively high degree of precision, which is advantageous to the frequency stability of the active resonator's maser signal output.

Compared with the Hydrogen Maser:

By dint of its solid-state nature, the spatial density of the present invention's active ('masering') paramagnetic ions is relatively high compared to, for example, the spatial density of the masering hydrogen atoms that are available within the bulb of a conventional hydrogen maser. This statement is true even when the substitutive concentration of the paramagnetic ions within the ions' host dielectric lattice lies at the parts-per-billion level. In consequence, the above-described active resonator offers significantly greater output ('saturation') powers, in the region of tens of nWs, compared to the pWs typically offered by maser oscillators based on the state selection of atomic/molecular-beams, such as the hydrogen maser. This in turn means that the limits of frequency stability associated with the thermal noise that (i) is generated within the maser, as quantified by equation (1) above, and (ii) are imposed by the finite noise temperature of the amplifier that receives and boosts that maser's output, as quantified by equation (2) above are significantly alleviated: both of these Allan deviations scale with the inverse square of the power.

A conventional hydrogen maser requires a constant feed of material in the form of a stream of (molecular) hydrogen. It also produces material waste in the form of 'spent' hydrogen atoms that no longer exhibit a population inversion, which have to be disposed of through the constant operation of vacuum pumps. These pumps are bulky and require periodic servicing and/or replenishment. The present active resonator neither requires to be fed with material nor produces material waste and thus allows embodiments that do not require the continuous operation of vacuum pumps. Provided it is kept refrigerated and receives a source or electromagnetic pump power, the active resonator will operate indefinitely. It essential components do not wear or age.

Compared with a Pound-Stabilized Loop (PSL) Oscillator:

Compared to a typical embodiment of the Pound-stabilized-loop oscillator [see, for example, 'Latest results of the U.W.A. cryogenic sapphire oscillator', A. N. Luiten et al, Proceedings of IEEE International 49th Frequency Control Symposium, pp. 433-437 (1995)] the present invention comprises far fewer critical components. The active resonator, whose dielectric body is typically 5 cm in diameter, is spatially far more compact than a typical embodiment of the PSL oscillator whose essential circuitry typically extends over several meters. The active resonator's loop resides, moreover, in a stable cryogenic environment. As a result, the active resonator can be far more easily isolated from undesirable environmental perturbations such as electromagnetic interference, mechanical vibration and fluctuating temperature gradients.

With a PSL oscillator, it is highly desirable for its so-called Pound input e.m. coupler to be adjusted such that its associated coupling parameter, with respect to the resonator's electromagnetic mode under operating (i.e. cryogenic) conditions, lies close to unity. When the PSL oscillator is locked, the Pound detector diode then operates in its so-called square-law region where its sensitivity is highest. The mechanical adjustment of the input e.m. coupler is necessarily done before the resonator is cooled to a cryogenic temperature. Because the unloaded Q of the resonator's operating mode cannot be predicted with any great accuracy (variations of +/−50 percent are common) prior to cool down, the achievement of a near-unity coupling parameter is not straight forward. Often a series of several cool downs and iterative adjustments are required, which is both tedious and expensive with regard to refrigeration costs, such as supplies of liquid helium. In contrast, the adjustments of the e.m. couplers associated with the active resonator, as are required to establish active maser oscillation, with a sufficiently low applied pump power and a sufficiently large output signal power, are relatively less critical. With regard to energy efficiency, it is desirable for the coupling parameter that quantifies the coupling of the active resonator's em coupler for the pump mode to be close to unity so as to avoid reflected and thus wasted pump power; but, with regard to the frequency stability of the signal mode, this coupling parameter does not need to be critically tuned.

Compared with Dick et al's Superconducting-Cavity Maser Oscillator:

As previously mentioned, Dick et al developed a series of embodiments of a so-called superconducting-cavity maser oscillator (SCMO). ['Ultra-Stable Performance of the Superconducting Cavity Maser', G. J. Dick, and R. T. Wang, IEEE Transactions on Instrumentation and Measurement, vol. 40, pp.174-177 (1991).] Unlike Dick et al's superconducting-cavity maser oscillator, embodiments of the present invention allow for active maser oscillation without any applied magnetic field. In constrast to the SCMO's superconducting cavity, neither a superconducting cavity nor an electromagnetically reflecting cavity of any sort are essential features of the present invention. The final version of Dick et al's SCMO exhibited a region in the level of the pump power applied to the SCMO (they described this region as a "valley") where the sensitivity of the SCMO's frequency to its pump power was $\leqq 2\times10^{-13}$ per dB. In the first experimental embodiment of the present invention, two complete turnover points (a sharp maximum and a softer minimum) are observed in the frequency-versus-pump-power curve, where the sensitivity to pump power vanishes to first order (see FIG. 18). At least as good (in)sensitivity to fluctuations in the pump power would thus seem attainable in optimised embodiments of the present invention.

Unlike Dick et al's SCMO, embodiments of the present invention can exhibit frequency-versus-temperature turnover points just above 4.2 K. The frequency-versus-temperature turnover point for Dick et al's SCMO lay near 1.6 K, which is considerably more difficult and/or expensive to sustain cryogenically.

The phase noise associated with the present active resonator should be as good as that exhibited by the SCMO due to the low thermal noise and low-flicker noise generically exhibited by solid-state maser action. In fact, because the volume of the masering solid in the present invention is typically (at X-band) several tens of cubic centimeters, compared to the only several tens of cubic millimeters of ruby used in the SCMO, the phase noise exhibited by embodiments of the current invention can be exceptionally low.

Optional and/or Desirable Features

Several features, not mentioned above, are desirable with regard to attaining the conditions necessary for above-threshold maser oscillation at reasonably cost, as well as for ensuring that the frequency-stability performance of the active resonator's signal output is competitive with respect to existing oscillators (as surveyed in the Background).

Environment and Operation

Figure 5:
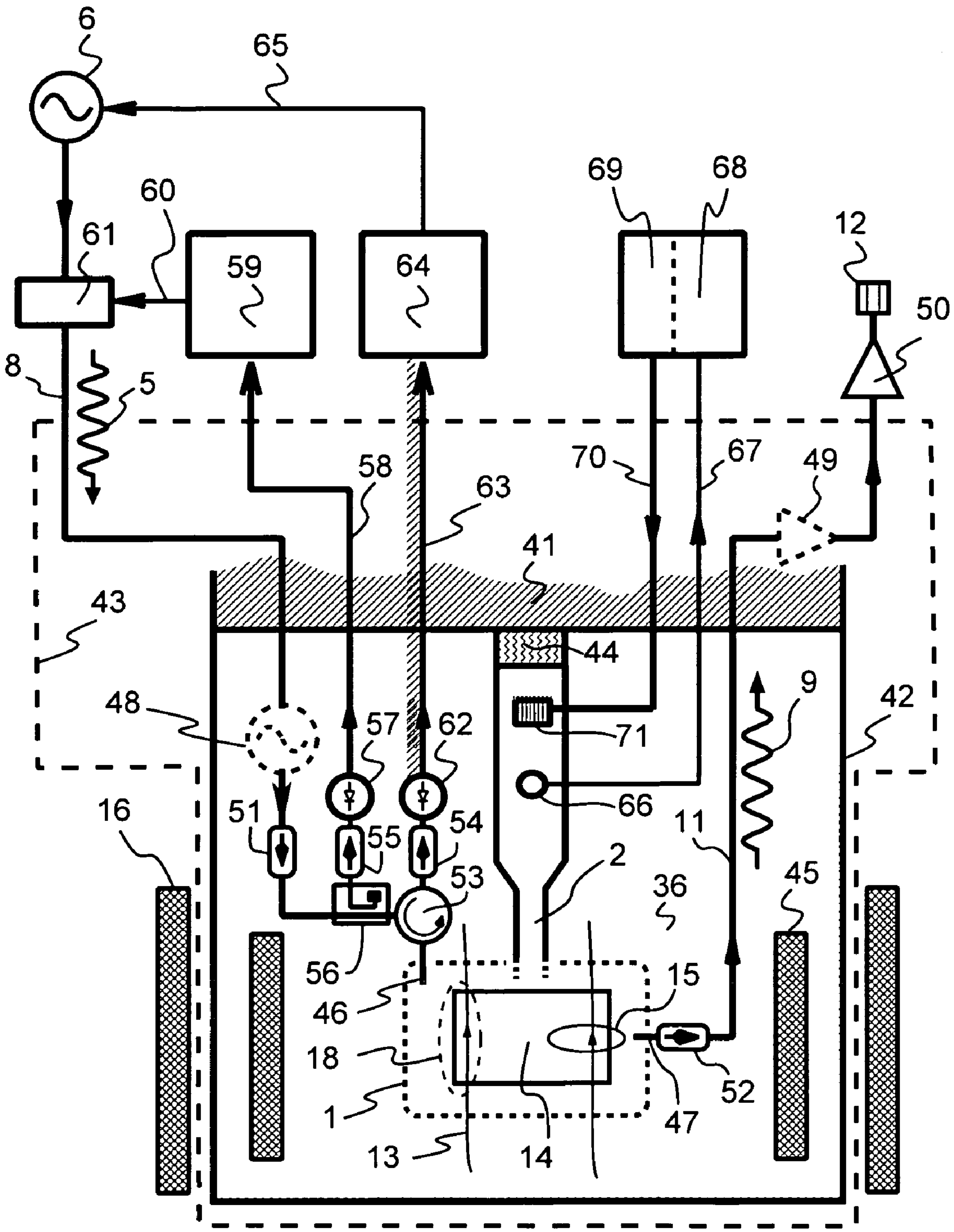

FIG. 5 is equivalent to FIG. 1, except that various optional and/or desirable components and systems have been added, and where a few arbitrary choices regarding the placement or containment of certain components in relation to one another have been taken.

Refrigeration:

Only the active resonator's dielectric body 14 need be refrigerated. It is often, however, either convenient or desirable that all parts of the active resonator, as well as certain auxiliary, enhancing elements (described below) that are attached to it, be refrigerated along with the dielectric body. In FIG. 5, the active resonator, whose perimeter is indicated by 1, together with associated cryogenic paraphernalia (described below), is maintained within a cryogenic space bounded by the cold face 41 and associated radiation shield 42 of a refrigerator, such as a standard liquid-helium bath cryostat or pulse-tube cooler. The detailed anatomy of the rest of the refrigerator, whose total extent is indicated by the dashed rectangle 43, is not shown. This cold face and radiation shield together serve as the 'cold reservoir' 4 shown in FIG. 1. The active resonator is mechanically and thermally attached to a rigid support 2, such as a copper post, that also allows solid thermal conduction. The support 2 is in turn connected to the refrigerator's cold face 41 by a 'moderate' thermal link whose conductance (i) enables the temperature of the post to be maintained at a desirable temperature above that of the cold face without excessive heating, and (ii) one that allows the active resonator to be cooled down at a reasonable speed (if the introduction of an exchange gas is not an option). The said thermal link may optionally also reject mechanical vibrations; a strap comprising many fine, floppy (i.e. not under tension), copper strands is an example of such a mechanically isolating thermal link. As already mentioned in relation to FIG. 2, a small partial pressure of exchange gas, such as helium, in the cryogenic void 36 can provide an alternative means of thermal conduction between the dielectric body and the cold reservoir/refrigerator. Besides the exchange gas, the void 36 should desirably be a high vacuum lest gaseous impurities such a water vapour cause 'frost' to build up on the dielectric body and/or other parts of the resonator, which would adversely affect their electromagnetic properties and, as a result, the maser oscillator's frequency stability.

Applied d.c. Magnetic Bias Field:

In general, maser action requires that the dielectric body 14 be exposed to a suitably oriented and sufficiently strong, uniform and stable d.c. magnetic bias field 13, which is generated by a magnetic-field generator 16. Embodiments of the invention that exploit so-called zero-field maser action, as is the case with the first experimental embodiment described below, are exceptions and do not require a magnetic field generator. In FIG. 5, the magnetic-field generator 16, such as a conventional current-carrying solenoid, potentially with additional 'shimming coils' for improved magnetic-field uniformity, is placed around the active resonator and located outside of the refrigerator for low heat load (cryogen boil-off rate). Other means of magnetic-field generation, such as permanent magnets placed either inside or outside of the cryogenic space (not shown) or a conventional or superconducting coil placed inside the cryogenic space (not shown), may be preferred options depending on the maser oscillator's application and operating requirements.

Irrespective of whether the applied magnetic field is zero or takes a finite value, a means 45 of keeping the magnetic field stable is generally desirable. At cryogenic temperatures, an effective passive means of magnetic-field stabilization is a superconducting long tube (i.e. longer than the axial height of what it contains), made for example from either lead or niobium, with the active resonator inserted inside of it (near its axial mid-point). Other passive means include one or several nested mu-metal (or cryo-perm) shields located around the active resonator outside of (or inside) the cryostat. Active magnetic-field stabilization using one or several SQUID or flux-gate magnetometers (not shown), whose outputs control additional magnetic field generators (not shown), such as three orthogonally oriented pairs of Helmholtz coils (not shown), can be advantageously included. Note that, in the present invention, it is the frequency of the extremely high-Q WG-signal mode that predominantly determines the frequency of the maser oscillator's signal and not the centre frequency of the (considerably lower-Q) maser signal transition; moreover, the fractional sensitivity of the former to changes in the magnetic field is significantly smaller than that of the latter.

Microwave Electromagnetics:

As in FIG. 1, a microwave pump 5 is first generated by a pump source 6 and is ultimately injected into the pump-mode 18 through a cable 8 terminating at the pump-mode e.m. coupler 46 (which incorporates 7, 23, 22 in FIG. 2). A desirable cable for low thermal conductivity and cryogenic phase stability is astro-cobra-flex cable, type 31086, manufactured by Astrolab, Inc., of Warren N.J. (USA). The active resonator's signal-WG mode 15 is in turn energized through maser action and power from it is coupled out of the active resonator by the signal-mode e.m. coupler 47 (incorporating 24, 25, and 10 in FIG. 2) and conveyed to the maser oscillator's output 12 by a cable 11. Here the possibility of a cryogenic pump generator 48 is recognized; this would eliminate the need for the cable/waveguide 8, which may be advantageous in certain applications. Also, the output cable 11 may be interrupted by either one or more amplifiers, 49 and 50, placed either inside or outside the refrigerator, respectively, which serve to receive and boost the maser signal 9 that is issued from the active resonator's signal-WG coupler 47 to a higher, and thus more useful power level. If the refrigerator's radiation shield 42 is made of metal, the microwave reflections and associated parasitic modes that it could otherwise support may be suppressed by lining its inner wall with a microwave absorbing material (not shown), such as Emerson and Cumming Eccosorb® coating 300, or MCS silicone sheet.

To avoid frequency-pulling effects, appropriately oriented microwave isolators, 51 and 52 or even several isolators in series at each point, should be inserted as close as possible to the active resonator's signal-output 10 and pump-input 7 connectors, respectively; for example, at microwave X-band frequencies, a suitable SMA-connectorized isolator is a NARDA INH-9012. Their insertion will suppress the degree to which the centre frequencies of the active resonator's pump and signal-WG modes are 'pulled' by standing-waves in the cables 8, 11 and auxiliary equipment that is connected to the e.m. couplers for the pump and signal-WG modes. The locations of these isolators must take into account other potentially additional components such as the circulator 53 of a pump-frequency Pound servo (see below), and the directional coupler of a pump power servo (see immediately below); the inclusion of these additional components may necessitate the desirable insertion of further isolators, 54 and 55.

In general, the frequency of the maser oscillator will depend on the power of the pump 5 that is applied to the active resonator's pump-mode e.m. coupler 46. Due to variable loss in the cable 8 (associated with, for example, the change in the level of liquid helium in the dewar with time at it boils off), this power is not necessarily a constant fraction of that generated by the pump generator 6. It is thus desirable for the maser oscillator to incorporate a means for stabilizing the pump power as received by the cryogenic resonator. This can be achieved with a standard cryogenic power-control servo [see A. N. Luiten et al (1995), previously referenced.] A directional coupler 56 is connected as close as possible to the pump-mode's e.m. coupler input connector 7 in the cryogenic space. The said directional coupler's coupling port is connected to a power sensor 57, such as a microwave detector diode (ideally a so-called 'back' diode for low flicker noise, such as a Herotek DT8012), whose output signal is fed via cable 58 into a servo loop filter 59 whose output 60 in turn control's a voltage-controlled microwave attenuator 61.

In general, the frequency of the maser oscillator will also depend, to some extent, on the frequency of the pump that drives the active resonator's pump-mode. If the pump is generated by a standard commercial microwave frequency source, such as a Gunn-diode oscillator, its frequency stability might be inadequate. The dependence will be more severe if an electromagnetic mode of high Q is used for the pump mode; any deviation by a significant fraction of the pump mode's linewidth in the frequency of the applied pump from the pump mode's centre frequency will cause a change in the amplitude of the pump mode and thereupon a change in the degree to which the pump transition is saturated. It is thus desirable for the frequency of the applied pump 5 also to be stabilized. This can be done through conventional means, such a locking the microwave source that provides the pump to a stable quartz-crystal oscillator; alternatively, a frequency-tunable synthesizer could be Pound-locked to the pump mode, or even a Pound-locked loop oscillator could be set up to run on the pump mode. FIG. 5 depicts the middle possibility. A circulator 53 directs the power reflected back from the active resonator's pump-mode coupler 46 to a 'Pound' detector diode 62, whose output is carried via a cable 63 to a servo loop filter 64, whose output 65 controls the frequency-tuning input of the now frequency-tunable pump generator 6, such as a microwave synthesizer with so-called d.c.-FM capability.

Temperature Control:

In general, the signal-WG mode's frequency will be a function of the temperature of the dielectric body that supports it. It is thus desirable for the dielectric body's temperature to be actively controlled. Various methods and equipment for doing so, covering a spectrum in precision and complexity, are well known to experts in the art of cryogenic temperature control. [See, for exampled 'Experimental Techniques in Condensed Matter Physics at Low Temperatures, R. C. Richardson and E. N. Smith, Frontier in Physics Series No. 67, Addison-Wesley (1988)]. The dielectric body's temperature could be monitored, for example, by a germanium resistance thermometer 66 that is mounted in and thermally connected to the active resonator's support 2, to which the dielectric body 14 is in turn both mechanically and thermally connected. [FIG. 9 describes these thermal and mechanical connections for a particular embodiment in greater detail.] The thermometer 66 is connected by a 4-wire cable 67 to an a.c. resistance bridge 68. The output or 'error signal' from this bridge is fed to an accompanying PID temperature controller 69 whose output 70 controls the current flowing through a resistive heating element 71 that is attached to the same said support 2.

Active Resonator

FIG. 6 is equivalent to FIG. 2, except that various optional and/or desirable features have been added; for clarity, the labels for several of the features whose representations are the same in both figures are omitted from FIG. 6.

Surrounding Electromagnetic Cavity:

As stated above, it is not necessary for the active resonator's electromagnetic pump mode 18 to be wholly supported by the dielectric body 14. Alternatively, the dielectric body can be either completely or partially surrounded by a rigid electromagnetic cavity 20, where the pump mode is defined by those interior surfaces 21 of the cavity that electromagnetic reflect the pump mode back onto itself, in conjunction with those parts of the dielectric body 14 (necessarily including its annular periphery) that dielectrically load it. Between the dielectric body and these reflecting walls lies an electromagnetic vacuum 36, apart from potentially a low partial pressure of exchange gas for thermal conduction 32 between the dielectric body and the cavity.

In general, the cavity comprises one or several rigid walls e.g. 72 and 73, that are held rigidly together by one or several mechanical and/or chemical means (such as bolts screwed into threaded holes, or glue; not shown) that may also allow for thermal conduction. Both the cavity and the dielectric body are rigidly attached to one another and the resonator's mechanical support 2 by fastening means 26 and 30, where the support and fasteners may also allow solid thermal conduction 31. It is desirable that the refrigerator's cold face does not suffer from excessive mechanical vibration such that the support 2 can be connected mechanically as well as thermally, through a now simple rigid and thermally conductive means 44, straight to the refrigerator's cold face 41, without recourse to any elaborate (an often necessarily massive) thermally conductive yet mechanically isolating means.

The interior surfaces 21 of the cavity that substantially reflect electromagnetic waves at microwave frequencies are typically made from, or at least coated with, metal (either normal or superconducting) for electrical conduction and thus electromagnetic reflection. Alternatively, the reflecting property of these surfaces, albeit generally over more limited ranges of frequency, can be realized through dielectric multi-layers. The cavity's reflecting surfaces will unavoidably generate heat due to either resistive or dielectric losses, and those walls that support them, as well those walls that compose the path of solid thermal conduction between them and the active resonator's support 2, may be required to have adequate solid thermal conduction in addition to mechanical rigidity. The cavity may contain non-reflecting surfaces whose supporting walls 73 are required to provide only mechanical support and potentially also thermal conduction and/or thermal-radiation shielding.

Beyond its function of co-defining a suitable pump mode 18 for the active resonator's means of maser amplification, the cavity may provide the following additional electromagnetic features: (i) The cavity can enhance the signal-WG mode's Q value by reducing its radiative losses through reflective electromagnetic shielding. Such an enhancement may, however, cause significant pulling of the signal-WG mode's frequency, and thus may not always be desirable with respect to maximizing the active resonator's long-term frequency drift. (ii) Rather than substantially reflecting electromagnetic waves at microwave frequencies, one or several of the cavity's interior surfaces, or parts there of, may be clad or coated with, a microwave-absorbing material 74, such as Emerson and Cumming Eccosorb® (as already mentioned) such that the surface substantially absorbs electromagnetic waves. Such absorbing surfaces can be used to suppress unwanted electromagnetic modes that may lie close to and thus significantly pull the frequency of the signal-WG and/or pump modes. (iii) The cavity can electromagnetically shield the maser oscillator from undesired external electromagnetic interference, such as 'jamming'.

Mechanical, Thermal and Sundry Concerns:

The rigid electromagnetic cavity 20 can also desirably form part of the active resonator's means of mechanical support for its e.m. couplers, which would otherwise require separate mechanical supports in the form or a rigid scaffolding or frame 27 (FIG. 2). The position and orientation of (i) the dielectric body 14, (ii) the reflecting surfaces 21 of the cavity that surround the dielectric body, (iii) the signal-WG mode 15 and pump mode 18 [as are defined by (i) and —optionally— (ii)], and (iv) the e.m. couplers that couple to these two modes, 46 and 47, are all thereby fixed rigidly with respect to one another. The transmission line 23 of the pump-mode e.m. coupler 46 is supported by the cavity through a fixing means 28. Similarly, the transmission line 25 of the signal-WG-mode e.m. coupler 47 is supported by the cavity through a fixing means 29. It is generally desirable that each of these two fixing means allow for the translation and/or rotation of the e.m. coupler that holds it such that the coupler's degree of electromagnetic coupling with respect to its corresponding mode can be adjusted. For reasons of maximizing the active resonator's energy efficiency at converting pump power into signal power, it is generally desirable that the coupling parameter for the pump mode be unity such that the pump mode is power-matched to the pump source. To retain a high loaded non-magnetic Q, and hence good frequency stability and low phase noise, the coupling parameter for the signal-WG mode should be no greater than what is necessary to provide a maser signal 9 at an adequate power level for the maser oscillator's intended application.

The cavity's walls can function as a thermal radiation shield for the dielectric body that they surround. Depending on the dimensions and composition (in terms of materials and their thicknesses) of its constituent walls, the cavity's thermal mass can provide an intermediate thermal reservoir or 'buffer' between the dielectric body 14 and the refrigerator's cold face 41. Heat can be exchanged between the dielectric body and the cavity through either thermal radiation 33 or exchange gas 32 or via thermal conduction 31 through the dielectric body's supporting and fixing means (as exemplified in FIG. 9).

Furthermore, provided all its joints (not shown) and attached fastening and fixing means 30, 28, 29 are air tight, the cavity can function as the refrigerator's vacuum can. In such embodiments, the cavity is first evacuated, optionally baked out and then filled with an appropriate partial pressure of exchange gas. The cavities vacuum space is then sealed off, by means of a valve or 'pinched' copper tube (not shown), and disconnected from its evacuating pumps. The refrigerator for such embodiments requires no vacuum pumps of it is own, with the cavity directly immersed in the cryogenic fluid.

Other than the partial pressure of the exchange gas, if used, the electromagnetic vacuum 36 that surrounds the dielectric body must be as clean as possible, lest gaseous impurities such a water or pump oil become progressively adsorbed on the dielectric body's cold surface causing a drift in the frequency of the signal-WG mode and/or the pump mode. Adherence to high-vacuum practices, are regards the choice and cleaning of the materials that bound the vacuum space 36 in which the dielectric body resides, is generally desirable.

It is also desirable that the form of the dielectric body 14 be such as to facilitate its thorough cleaning, whereby all surface impurities, such as finger marks (grease) and/or small particles of metal or organic material, can be removed from the dielectric body's surfaces prior to its mounting within the active resonator. In this regard, smooth, polished, flat/convex surfaces as opposed to rough, chipped, cracked or otherwise re-entrant ones, which could harbour dirt, are desirable. It is also desirable that any metallic particles or flakes ('glitter'), as are likely to be shed by mechanical fastening means with wearing parts, such a stainless steel bolt screwed into threaded copper hole, do not fall under gravity onto the dielectric body's annular periphery; such fastening means should thus preferably not lie above the dielectric body's annular periphery.

Dielectric Body

The dielectric loss of the solid dielectric material or materials that compose the annular periphery of the dielectric body that supports the signal-WG mode should be as low as possible at the dielectric body's operating temperature. Typically, the dielectric loss tangent of these materials should be less than $10^{-7}$ such that the signal-WG mode's unloaded nonmagnetic Q is greater than $10^{7}$. A Q of this magnitude typically requires monocrystalline dielectrics whose crystal lattices contain relatively few impurities or structural defects, and where the dielectric is cooled to cryogenic temperatures. A maser oscillator based upon such a high-Q mode can thereupon be realized, where the concentration of the paramagnetic ions within the dielectric body's annular periphery that provide the oscillator's essential means of maser amplification is extremely low, i.e. less than 100 parts per billion. Any frequency shifts associated with fluctuations in the real part of the magnetic susceptibility that is associated with these paramagnetic ions are thus commensurately extremely small.

With regard to frequency stability, it is highly desirable that the signal-WG mode supported by the dielectric body exhibits a frequency-versus-temperature 'turnover' point at some cryogenically accessible temperature where above-threshold maser oscillator is feasible. In embodiments that incorporate a liquid-helium cryostat, the existence of such a 'turnover' point at a temperature lying a few Kelvin, or a even just a few tens of Kelvin, above 4.2 K (the boiling point of liquid helium at 1 atmosphere) is highly desirable. There are several means by which such temperature compensation can be achieved, as are well known to experts in the art of cryogenic microwave resonators. [A review is provided by 'Frequency-Temperature Compensation Techniques for High-Q Microwave Resonators', J. G. Hartnett and M. E. Tobar, pp. 67-89, in 'Frequency Measurement and Control, Advanced Techniques and Future Trends', Edited by A. N. Luiten, Topics in Applied Physics Vol. 79, Springer-Verlag (2000).] In particular, it is often desirable that the dielectric body contain additional or 'auxiliary' paramagnetic ions 75. These ions play no essential role in the maser action of the active resonator but the change in their associated magnetic susceptibility with temperature produces the desired frequency-versus-temperature 'turnover'. For example, dielectric bodies made from monocrystalline sapphire, that includes $Mo^{3+}$ or $Ti^{3+}$ ions at concentrations below 1 part per million support high-Q whispering gallery modes with frequency-versus-temperature turnover points conveniently above 4.2 K [see 'Paramagnetic susceptibility and permittivity measurements at microwave frequencies in cryogenic sapphire resonators', A. N. Luiten, A. G. Mann, and D. G. Blair, Journal of Physics D (Applied Physics), Vol. 29, pp. 2082-2090 (1996).] An example observation of such temperature compensation is mentioned in connection with the first experimental embodiment described below. Once the turnover point has been located, the means of temperature control 66-71 described in connection with FIG. 5, or some equivalent temperature controlling system, can be used to maintain the dielectric body's temperature precisely at the turnover point, where the maser-signal frequency is, to first order in excursions of the temperature, independent of temperature fluctuations.

Figure 18:
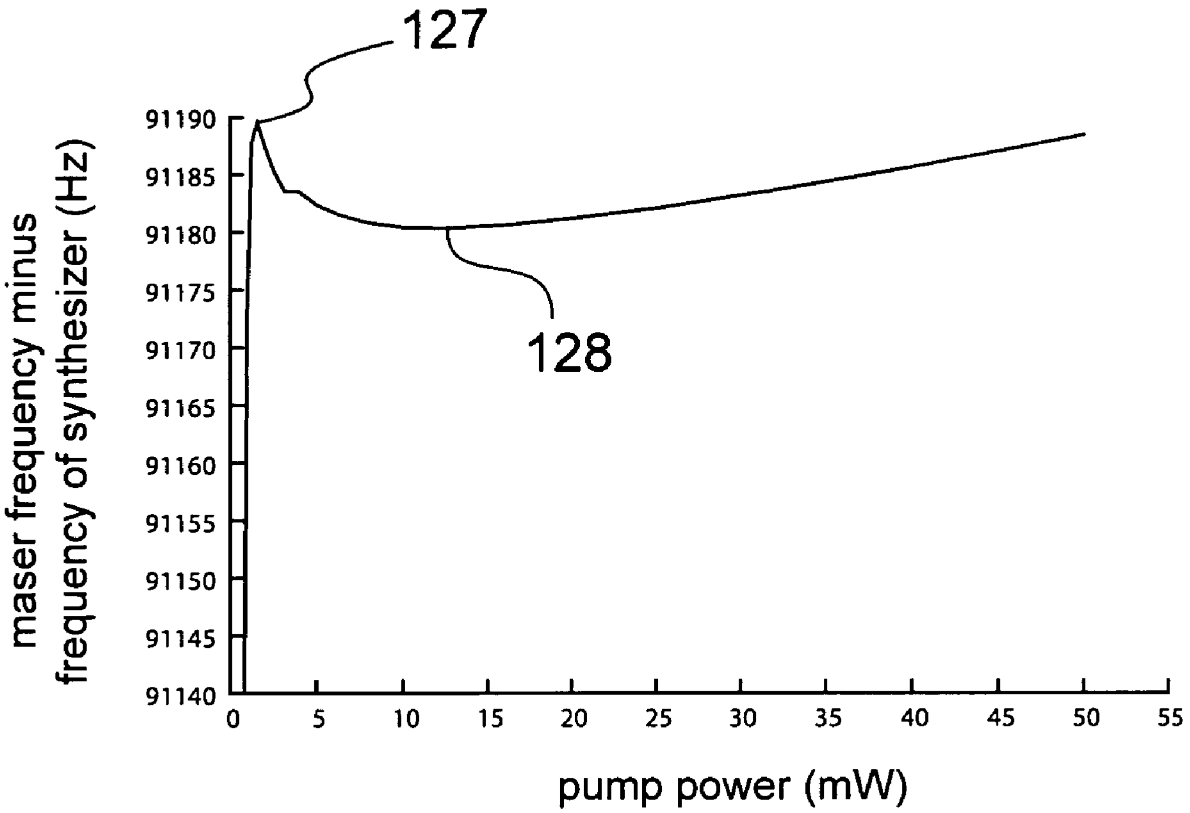
FIG. 18 shows how the frequency of the maser oscillator's signal output depends on the power of the microwave pump.

It is also highly desirable for the active resonator's maser signal frequency to exhibit a turnover point as a function of pump power. An example of such frequency-power compensation, with accompanying experimental data (viz. FIG. 18), is described in connection with the first experimental embodiment below. Once the frequency-versus-pump-power turning point has been located, the above power-control servo 56-61 described in relation to FIG. 5 can be used to precisely maintain the power level at this frequency-versus-pump-power turnover point.

Cylindrical Symmetry:

As stated above, it is generally not essential for (the relevant components of) the electric permittivity tensor, that is defined by the shape and composition of the dielectric body, to exhibit rotational symmetry. It is, however, often convenient for the dielectric body's form and composition to approximate to this symmetry whereupon the whispering-gallery modes that it supports are 'standard', exhibit discrete rotational symmetry, and can be classified by the $WGH/E_{n,r,a}$ nomenclature introduced in the Background.

Figure 7:
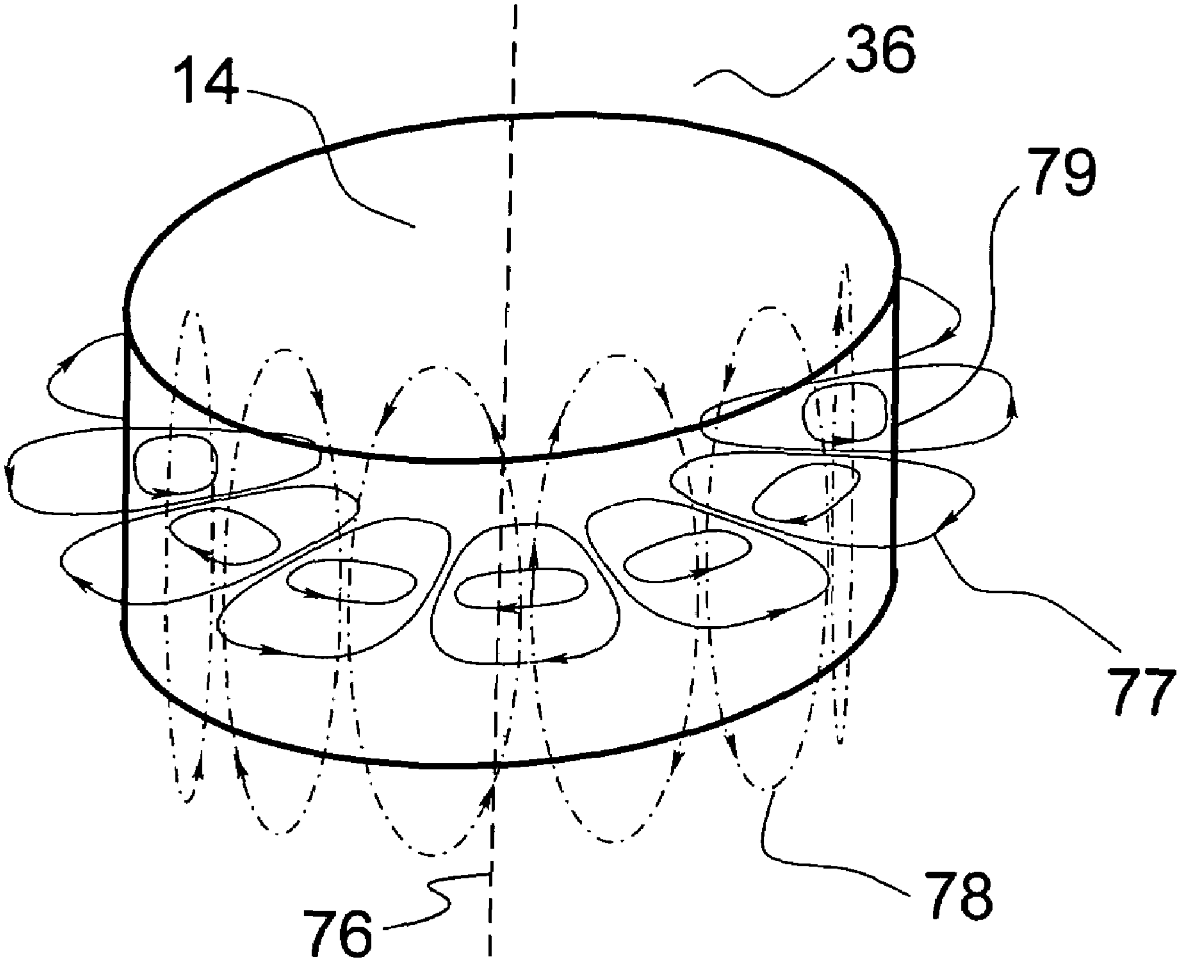

FIG. 7 sketches the characteristic electromagnetic field configuration for a snap-shot of a $6^{th}$-azimuthal-mode-order fundamental quasi-transverse-electric standard whispering-gallery mode, $WGE_{6,0,0}$. This mode is supported by a dielectric body 14 in the form or solid dielectric cylinder, within an electromagnetic vacuum 36, where the electric permittivity tensor exhibits continuous rotational symmetry about the cylinder's geometric axis 76; the mode itself exhibits discrete 6-fold rotational symmetry about the same axis. The mode's lines of electric displacement ('D') are arranged in loops 77 and lie predominantly orthogonal (i.e. transverse) to the cylindrical axis. The mode's lines of magnetic flux density ('B') are also arranged in loops 78 and lie predominantly orthogonal to the local radial direction, i.e. parallel to that part of the cylinder's outer curved wall 79 (also shown in radial cross-section in FIG. 8) each particular loop lies nearest to.

Figure 8:
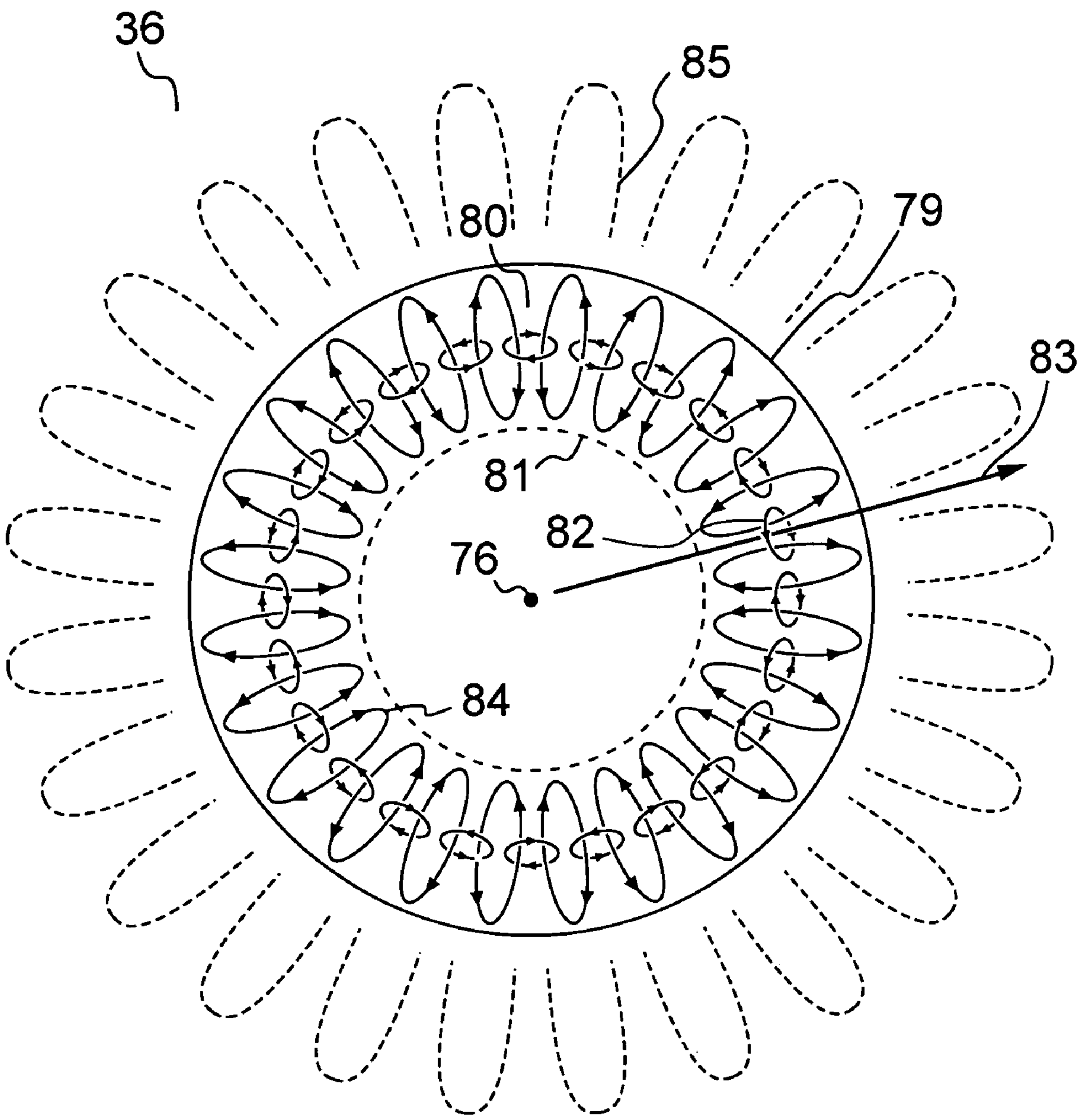

It is particularly desirable for the azimuthal mode order of the signal-WG mode to be high such that its evanescent leakage and radiative losses are low and its non-magnetic Q correspondingly high. FIG. 8 sketches, in plan view (looking down the cylindrical axis), a snap-shot of the $12^{th}$-azimuthal-mode-order fundamental quasi-transverse-magnetic WG mode, $WGH_{12,0,0}$, as supported by the same solid dielectric cylinder shown in FIG. 7. The mode's electric and magnetic field lines, and thus their associated energy density, are now more significantly confined to a distinct annular periphery 80 that is (i) bounded from within by the cylindrical (and coaxial) surface 81 and (ii) bounded from the outside by the dielectric cylinder's three external surfaces comprising its cylindrical outer wall 79 and its two flat end faces (not shown, though correspond to 100 and 101 in FIG. 12). The mode exhibits 12-fold rotational symmetry about the cylinder's axis 76 (oriented out of the page). Any particular one of the mode's loops of electric displacement 82 lies predominantly orthogonal to its local radial direction 83. Lines of magnetic flux density 84 lie in loops oriented predominantly orthogonal to the cylindrical axis. The $WGH_{12,0,0}$ mode's evanescent magnetic field 85 is relatively weak and decay's rapidly; the mode's far-field radiation losses (not shown) are corresponding low.

Maser Action

It is desirable that (i) the pump mode's non-magnetic Q be sufficiently high, (ii) the strength of the maser pump transition 19 (FIG. 4) be a sufficient fraction of a free-spin unit, (iii) the same transition's inverse linewidth or (equivalently) the masering paramagnetic ion's so-called spin-spin relaxation time, $T_2$, be sufficiently large, and (iv) the masering paramagnetic ion's so-called spin-lattice relaxation time, $T_1$, be sufficiently large, such that the pump transition can be saturated with a modest applied pump power.

With regard to frequency stability, it is also desirable that (i) the signal-WG mode's non-magnetic Q be extremely high and (ii) the strength of the maser signal transition 17 (FIG. 4) be a sufficiently large fraction of a free-spin unit, and again (iii) $T_2$ be sufficiently large, that above-threshold maser action can be obtained with an extremely low substitutive concentration of masering paramagnetic ions (typically parts per billion).

With regard to low phase noise, it is desirable that the power extracted from the signal-WG mode 15 by its e.m. coupler 47 be high enough that the thermal noise of the amplifier 49 and/or 50 (in FIG. 5) that receives and boosts the maser oscillator's signal output 9 to a useful level does not degrade the phase noise of the boosted signal output at the frequency offsets of interest in the maser oscillator's intended application. It is thus typically desirable that the power of the active resonator's maser signal output be greater than −60 dBm; if a (ruby) maser amplifier were used as the first (necessarily cryogenic) receiving amplifier 49, the required power level could be somewhat reduced. This in turns requires that (i) the concentration of paramagnetic ions be sufficiently large and (ii) the spin-lattice relaxation time $T_1$ be sufficiently small that the maser's so-called saturated signal output power, a certain (i.e. the 'coupled-out') fraction of which provides the active resonator's maser signal output 9, is sufficiently large. Note that the condition/inequality on $T_1$ here is the opposite to that which was stated just above: thus $T_1$ should be neither too large nor too small. The above statements can all be made quantitative through those design equations that are well known to experts in the art of maser amplification and oscillation, and which are explicitly stated and comprehensively explained in Siegman's 1964 monograph (already referenced).

Despite the stiff population clamping provided by the high Q of the signal-WG mode, it is generally (i.e. without regard to the deliberate construction of frequency-versus-pump-power turnover points) desirable for the signal-WG mode to lie as close in frequency to the line centre of the maser signal transition 17 (FIG. 4) as possible.

Receiving Amplifier

As explained in the Background, and quantified by equation (2), it is desirable for the amplifier (either 49 or 50 or both in FIG. 5), which is used to receive and boost the power of the active resonator's maser signal output (typically −50 dBm) to a useful level (typically +10 dBm for driving a microwave mixer), to contribute as little additional noise as possible. In other words the white-frequency and flicker-phase noise of the boosting amplifier should be as small as possible. With regard to the former type of noise, this equates to demanding that the amplifier's noise temperature $T_R$ be as low as possible. Cooled GaAs and HEMT amplifiers operating at or below liquid-nitrogen temperature (as made by—for example—Panatron, Inc., of Pomona Calif., USA) offer noise temperatures of a few tens of Kelvin. With regard to low flicker-phase noise, a conventional pink-ruby maser ('power') amplifier could also be used advantageously as the first amplifier in a boosting cascade for the active resonator's signal output.

Figure 9:
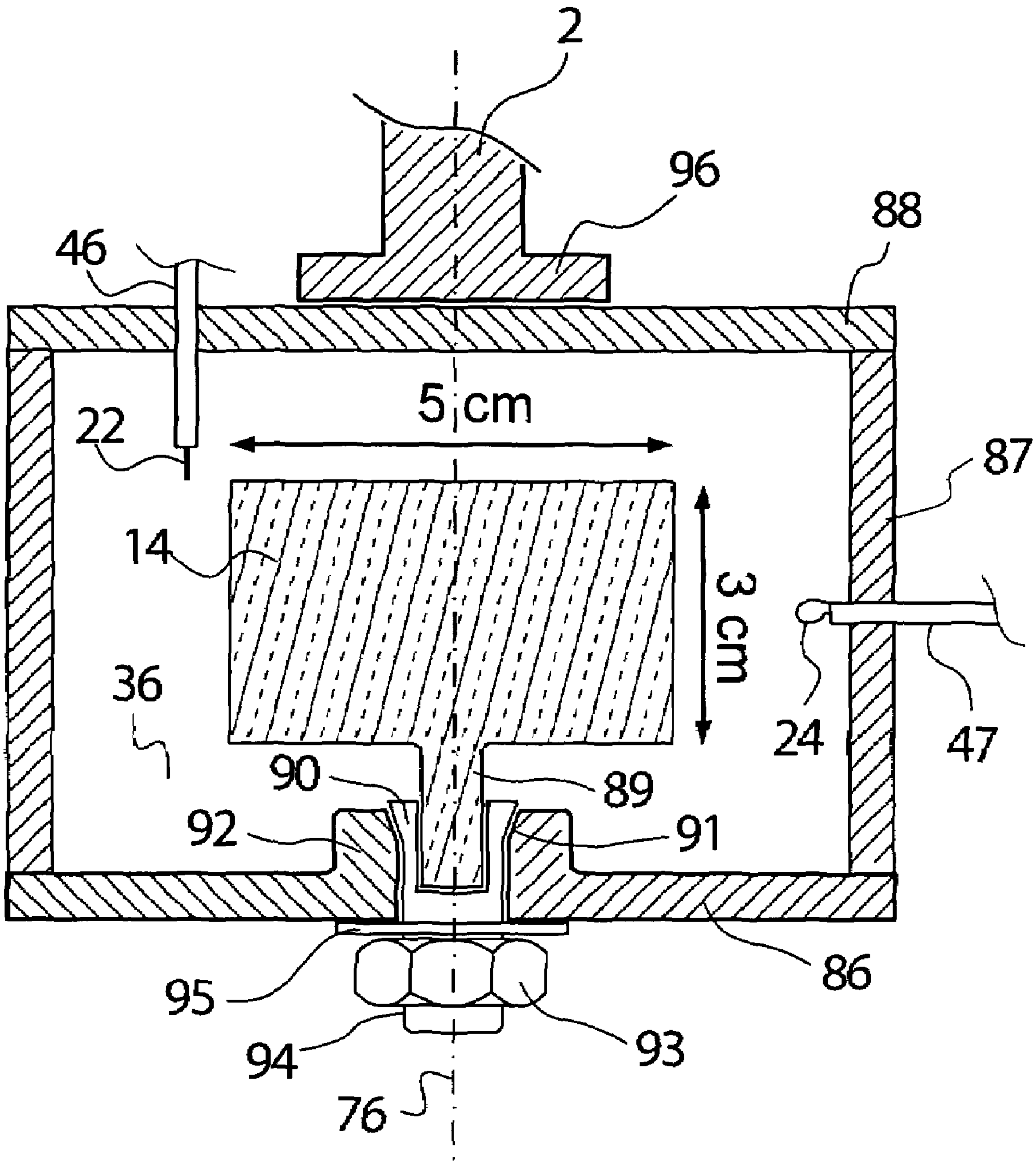
Figure 10:
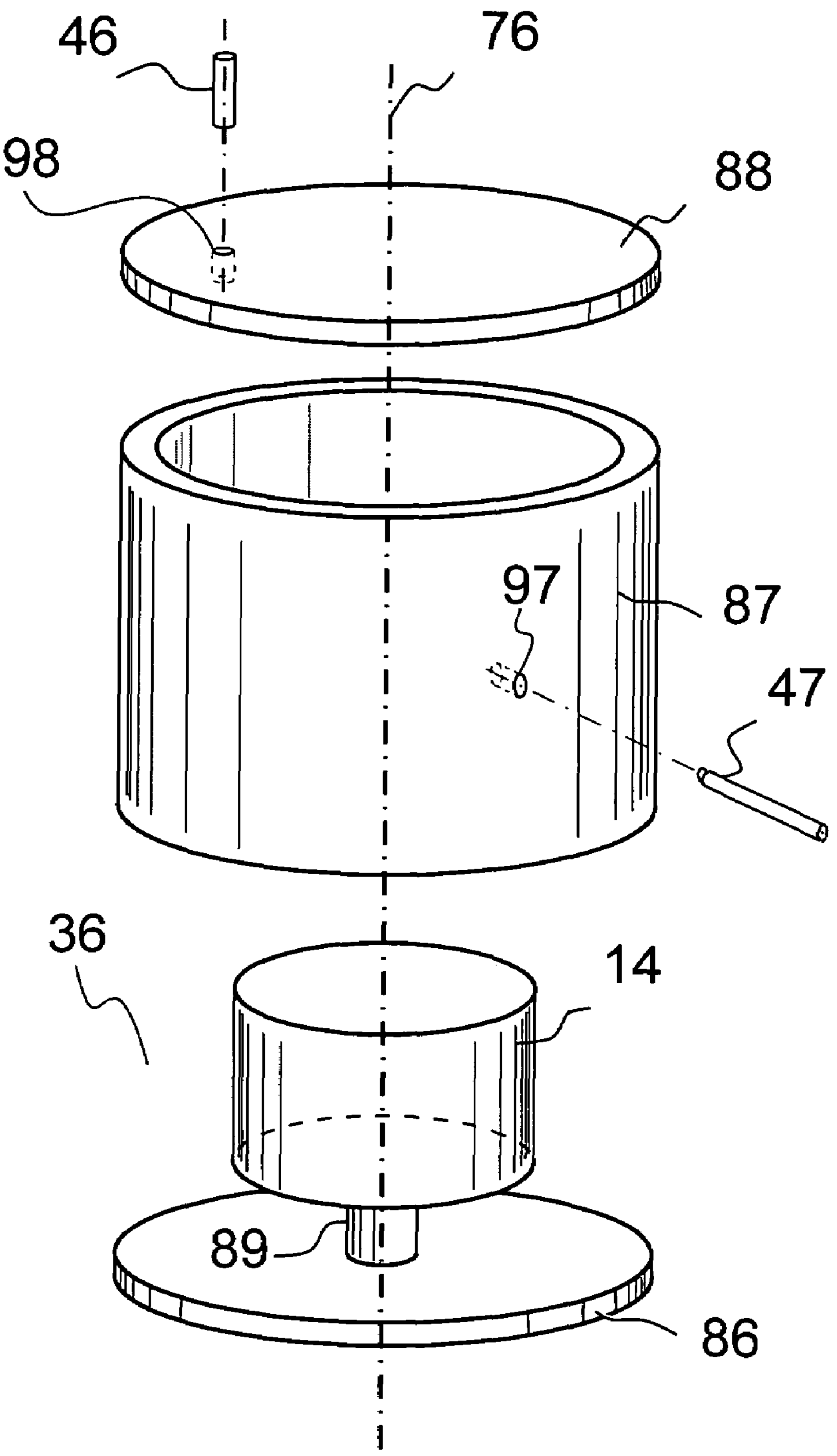

First Experimental Embodiment a Zero-Field $Fe^{3+}$:Sapphire WG-Mode Maser Oscillator Active Resonator FIG. 9 shows the mechanical structure of the active resonator of the first experimental embodiment in axial cross section; all elements are approximately to scale. FIG. 10 shows a 3-D, 'exploded' view of the same resonator's main structural elements. In this particular embodiment, the resonator incorporates a rigid electromagnetic cavity (including 86, 87, 88) made predominantly of copper, that fully surrounds the resonator's dielectric body 14, and which supports both the e.m. coupler 47 for the maser signal-WG electromagnetic mode (not shown in FIG. 9), and the e.m. coupler 46 for the maser pump electromagnetic mode (not shown in FIG. 9). The active resonator's dielectric body 14 takes the form of a solid cylinder with a coaxial spindle 89, where both the cylinder and spindle compose a continuous single piece of monocrystalline sapphire. The outer diameter of the cylinder is approx. 5 cm and its axial height (excluding the spindle) is approx. 3 cm. [The material properties of this cylinder are described in detail further on below.] The form of the electromagnetic cavity is also cylindrical, where it and the sapphire cylinder lie coaxially, sharing a common cylindrical axis 76.

The cylinder and spindle are both enclosed within the cylindrical cavity, whose three principal components are a 'base plate' 86, a surrounding 'barrel' 87, and a 'lid' 88; all three are made of OFHC copper. The dielectric body's spindle 89 is held in a copper collet 90, which fits in a complementary, coaxial conical seat 91, excavated from the base plate's thicker, central pedestal 92. This collet is forced into its conical seat, whereby the collet grips the sapphire spindle, through the tightening of a copper nut 93, whose thread moves against the corresponding thread 94 on the collet's lower cylindrical section, whilst at the same time sliding against the lower face of a brass washer 95, whose other, upper face is in contact with the base plate's bottom face. Thermal conduction between the sapphire and the base plate is facilitated through the smearing of the relevant mating surfaces with Apiezon N grease, while taking care that no grease is accidentally deposited on the surfaces of the sapphire cylinder (especially those that bound its outer periphery). The base plate 86, barrel 87 and lid 88 are fastened rigidly together with stainless-steel bolts and threaded blind holes (not shown); the fastening allows for both thermal and electrical conduction. The metal cavity shields the annular dielectric body from external electromagnetic interference. It also functions as a thermal-radiation shield and thermal reservoir so facilitating the precise regulation of the sapphire cylinder's temperature. The cylindrical cavity is bolted to the flange 96 of a massive supporting copper post (mentioned further on below), where the joint has good thermal conduction.

The active resonator is assembled in a class-10000 clean room. All components 46, 47, 86-95 are thoroughly cleaned using appropriate standard high-vacuum cleaning procedures for each material, prior to the resonator's assembly. A typical cleaning procedure for the all-copper components is ultrasonification in a hot 10% aqueous solution of warm Decon 90, then thoroughly rinse in distilled water, then ultrasonify in low-residue isopropyl alcohol, then rinse with the same, then dry on a hot plate.

Figure 11:
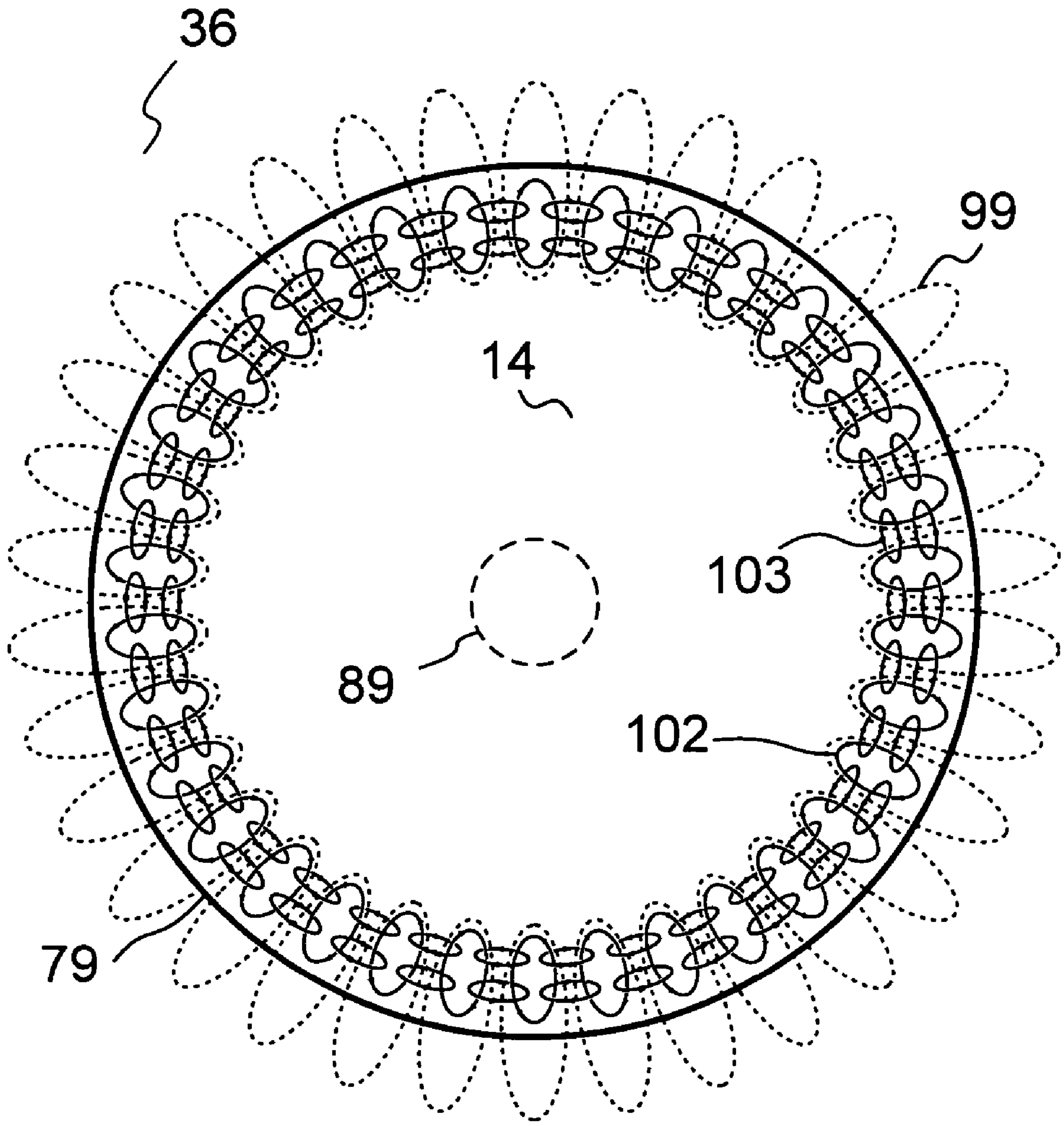
Figure 12:
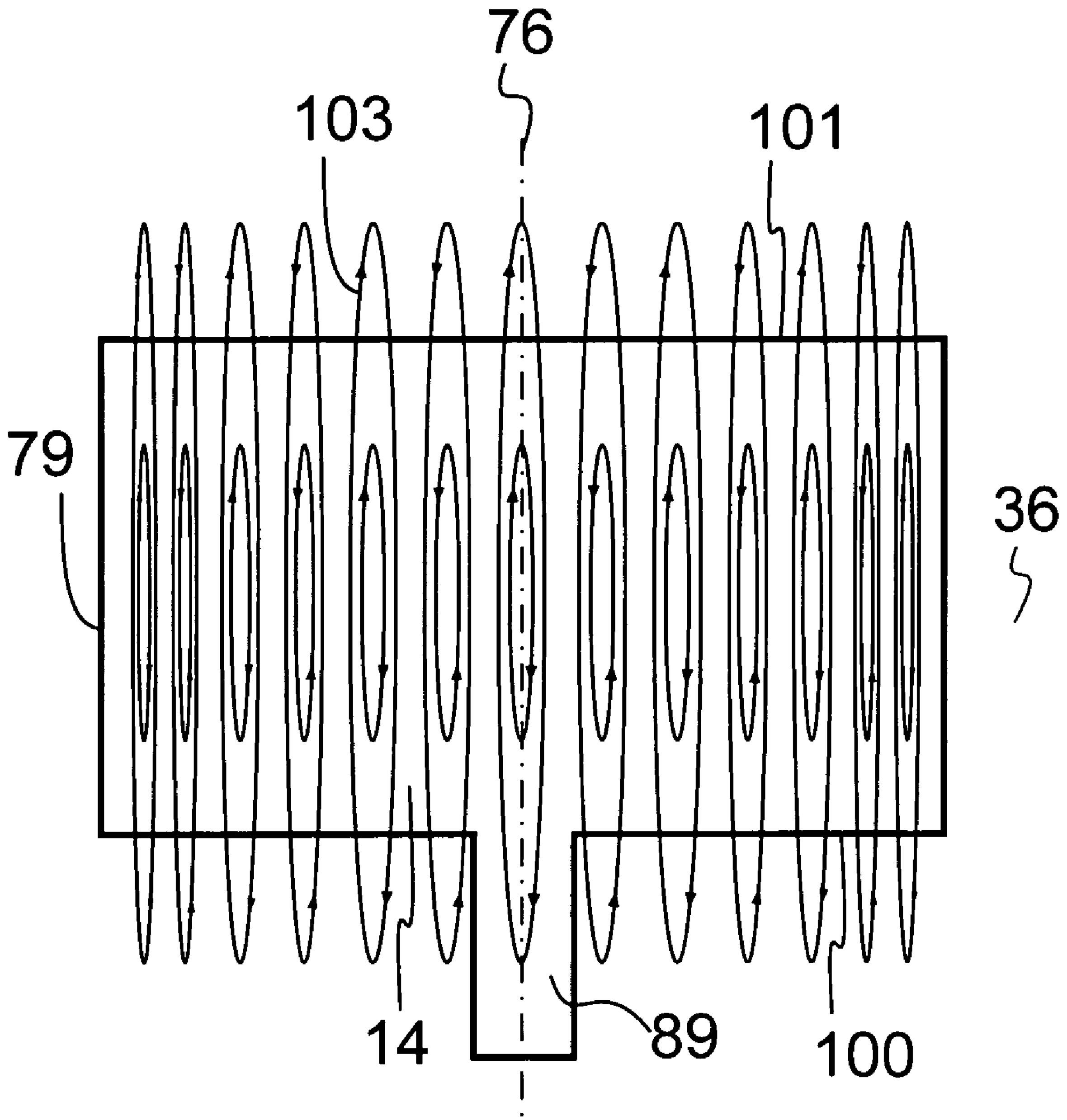

The e.m. coupling means 47 for the active resonator's signal-WG mode (whose electromagnetic field configuration is shown in FIGS. 11 and 12) is made from a piece of standard RG-405 semi-rigid coaxial cable, and whose probe takes the form a magnetic-field loop 24, (the cable's inner copper conductor is soldered to its outer copper jacket); the e.m. coupler's other end is soldered to a standard male SMA connector 10 (not shown in FIGS. 9 or 10 but shown in FIG. 2). The e.m. coupling means is inserted into a hole 97 in the active resonator's barrel 87, where the cable is anchored into the hole by a mechanical fixing means (not shown) of standard design. Briefly, this fixing means comprises (i) a conical 'seat', which is mounted by a screw thread into the said hole, (ii) a small collet (N.B. not 90) and (iii) a threaded 'lock ring'. The said small collet, which grips the semirigid cable's outer solid copper cylindrical jacket, is pressed into the conical seat by the said lock ring. The fastening means allows the semi-rigid cable to both slide through and rotate within the collet, such that the degree of electromagnetic coupling provided by the e.m. coupler can be adjusted prior to the lock ring being rotated hard down, whereupon the e.m. coupler is rigidly held. The magnetic-field loop probe 24 couples to the evanescent transverse magnetic field 99 of the $WGH_{17,0,0}$ mode that is supported by the sapphire ring, whose frequencies is approximately 12.038 GHz, which serves as the active resonator's maser 'signal' electromagnetic mode 15.

Similarly, the e.m. coupling means 46 for the active resonator's pump mode is also made from a piece of RG-405 semi-rigid coax, but whose probe takes the form a electric-field stub 22; its other end is soldered to a standard male SMA connector 7 (again, not shown in FIG. 9 or 10 but shown in FIG. 2). This e.m. coupler is inserted into the cavity through a hole 98 in the cavity's lid 88, where the cable is again anchored into the hole by the same type of collet-based mechanical fixing means (not shown) as just briefly described above. The electric-field loop couples to the axial electric field of a quasi-transverse-magnetic whispering-gallery mode, also supported by the sapphire cylinder, whose frequency is approximately 31.339 GHz, which serves as the active resonator's 'pump' electromagnetic mode. Thus, although the first experimental embodiment incorporates a reflective electromagnetic cavity, this cavity plays no essential role in supporting the active resonator's signal-WG and pump modes.

Sapphire Cylinder and Whispering-Gallery Modes

The above said sapphire cylinder, which embodies the active resonator's dielectric body 14, is made of synthetic HEMEX-grade monocrystalline sapphire grown by Crystal Systems Inc, of Salem, Mass., USA. The optical or c-axis of the sapphire crystal is oriented parallel to the cylinder's geometric axis to within a tolerance of 30 arc minutes. Care is taken during its machining/grinding with diamond-coated tools to minimize marring/chattering and (thus) sub-surface damage. The surfaces of the cylinder are optically polished to '80/30 scratch & dig' or better to aid subsequent cleaning. After machining and polishing, the sapphire cylinder is annealed at 1100° C. or higher in air for several hours to aid/accelerate the release of any residual locked-in 'tooling' stress, and allowed to cool slowly. Prior to assembly, the sapphire cylinder was cleaned by a 30-minute soak in 'Piranha' solution (98% $H_2SO_4$+30% $H_2O_2$ mixed in the ratio of 3:1 by volume) at room temperature then rinsed thoroughly in distilled water and then shaken/blown dry to avoid drying marks.

Still with regard to FIG. 9, the sapphire cylinder is surrounded by a void 36, which, in this particular embodiment, contains no deliberately added exchange gas, and is evacuated at room temperature to a high vacuum of approx $10^{-5}$ mBar, achieved through pumping with a small turbomolecular pump backed by a standard rotary pump. Due to so-called 'cryopumping' at the active resonator's operating temperature, at or slightly above 4.2 K, the operating pressure in the void will be significantly lower than $10^{-5}$ mBar. Thus, with regard to the electromagnetic workings of the present embodiment, the void 36 is to good approximation an electromagnetic vacuum. At cryogenic temperatures, the thermal connection between the sapphire and its surrounding cavity is predominantly by solid thermal conduction through its supporting copper post 2.

Co-alignment of the cylinder's geometric axis to the c-axis of its constituent monocrystalline sapphire ensures that the electric permittivity tensor exhibits continuous rotational symmetry about this axis to a good approximation. The sapphire cylinder thus supports standard (as opposed to generalized) whispering-gallery modes, both quasi-transverse electric (WGE) and quasi-tranverse-magnetic (WGH) ones, that can be identified (up to the doublet degeneracy mentioned in the Background) through standard $WGE/H_{n,r,a}$ nomenclature. Note that the form, position and, in the case of 47 (viz. 24), orientation of both the signal-WG-mode coupler 47 and pump-mode coupler 46 shown in FIG. 9 are optimised for coupling to WGH modes rather than WGE modes.

The active resonator's signal-WG mode is the $17^{th}$-azimuthal-mode-order fundamental quasi-transverse-magnetic mode, $WGH_{17,0,0}$, whose frequency is approx. 12.038 GHz, and whose inferred unloaded non-magnetic Q is approximately $6.9\times10^8$. FIG. 11 sketches, in plan view (looking down the active resonator's cylindrical axis), the characteristic instantaneous electromagnetic field configuration of this mode. FIG. 12 shows the projection of a few representative lines (loops) of electric displacement for the same $WGH_{17,0,0}$ mode onto a plane that includes the resonator's cylindrical axis (oriented vertically on the page). This mode is supported by the outer periphery of the sapphire cylinder 80, that is bounded by its outer cylindrical surface 79 and its two flat end faces 100 and 101, beyond all of which lies an electromagnetic vacuum 36. As with all quasi-tranverse-magnetic modes, the $WGH_{17,0,0}$ mode's lines of magnetic flux density 102 are arranged in loops that lie predominantly orthogonal to the cylindrical axis. Loops of electric displacement 103 lie predominantly parallel to that part of the sapphire cylinder's outer curved surface they lie nearest to. [The abrupt change in the direction of a line of electric displacement upon it crossing the sapphire-vacuum dielectric interface is acknowledged here though not explicitly represented in FIG. 12]. Because of the $WGH_{17,0,0}$ mode's high azimuthal mode order, its evanescent magnetic field 99 and electric field (not shown) decay rapidly with radial distance, such that the finite conductivity of the interior metallic (non-superconducting) surfaces of the active resonator's (non-superconducting) copper cavity do not significantly reduce the mode's non-magnetic unloaded Q.

The active resonator's pump mode in this particular embodiment is also a quasi-transverse-magnetic WG mode of high azimuthal-mode order. Its centre frequency is approximately 31.339 GHz and its observed (loaded) linewidth is approx. 60 Hz, corresponding to a loaded Q of approximately $5\times10^8$.

Microwave Bistability and Maser Action

The single piece of HEMEX-grade monocrystalline sapphire $Al_2O_3$ that composes the active resonator's dielectric body contains, as a residual impurity, a solid dilution of paramagnetic iron $Fe^{3+}$ ions 34 (in FIG. 2), believed to be at an concentration of a few parts per million relative to the aluminum Al atoms that they substitute. In this particular embodiment, the $Fe^{3+}$ ions are essential to the maser oscillator's working mechanism. The concentration of $Fe^{3+}$ ions is nominally the same throughout the whole cylinder. Note that only those $Fe^{3+}$ ions that lie where the two different WGH signal and pump modes overlap participate in the masering process.

The HEMEX sapphire also contains solids dilutions of other non-essential 'auxiliary' paramagnetic $Cr^{3+}$, $Mo^{3+}$, and $Ti^{3+}$ ions 75 (in FIG. 6), each at concentrations below 1 part per million. The presence of these auxiliary ions is relatively harmless with regard to their lowering of the signal-WG mode's Q. Furthermore, their presence can give rise to several desirable features as discussed below. Different embodiments of the invention could use one of these auxiliary ions as the masering species in place of $Fe^{3+}$.

Figure 13:
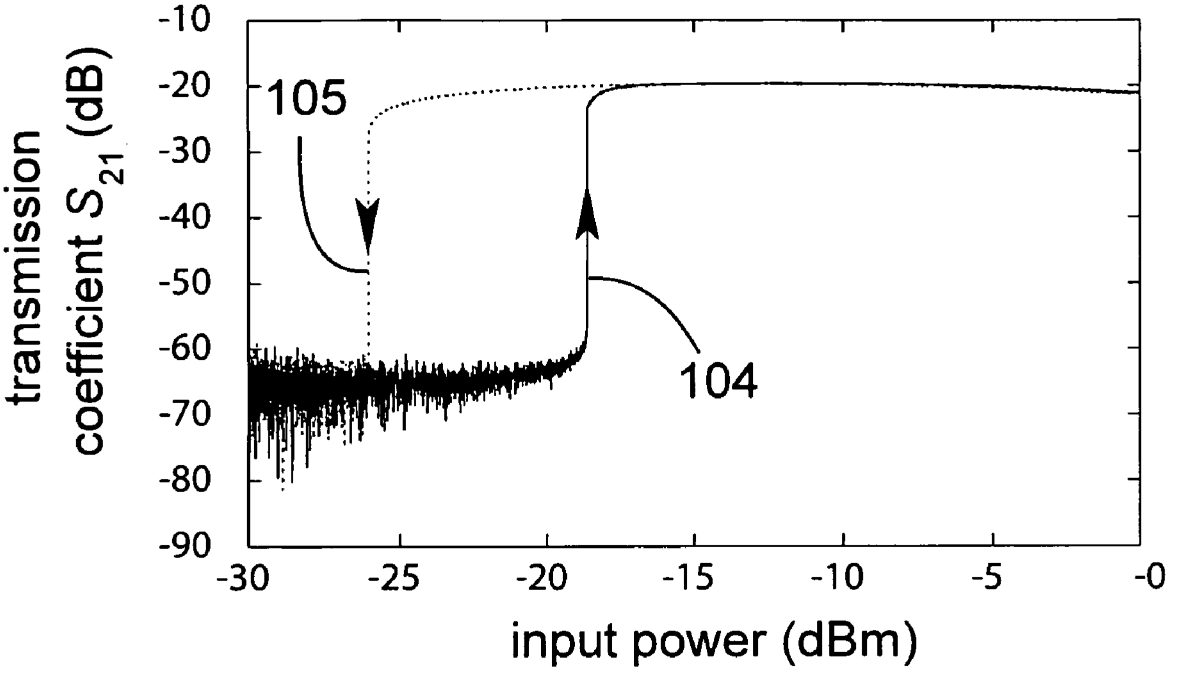

For diagnostic purposes, the transmission coefficient $S_{21}$ between the signal-mode e.m. coupler 47 and the pump-mode e.m. coupler 46 is measured with a microwave network analyser (Anritsu 37369C or its Agilent equivalent), with no pump power applied to the resonator. [Note that the latter e.m. coupler is only weakly coupled to the signal-WG mode.] FIG. 13 shows the magnitude of the $S_{21}$ coefficient as a function of the power applied to the signal-mode e.m. coupler at approx 12.038 GHz, on resonance with the signal-WG mode. Depending on the direction in which the applied power sweeps, one of two thresholds is observed. At low applied powers, the $WGH_{17,0,0}$ mode cannot be observed above the noise. It then suddenly appears when the power is raised above a threshold 104 at a power level of approx. −18.6 dBm. When the applied power is reduced from a high level, the mode remains observable down to a second threshold 105 at a power level of approx. −26 dBm, upon falling below which it suddenly vanishes. This observed phenomenon of bistability can only be explained by the saturation of the $Fe^{3+}$ ion's ESR at approx. 12.04 GHz (viz. 106 in FIG. 14) in conjunction with the $WGH_{17,0,0}$ mode's extremely high (non-magnetic) Q. The fact that one of the $Fe^{3+}$ ion's paramagnetic transition can be saturated by energizing a WG mode at modest applied power is good evidence that a maser oscillator is feasible at similarly modest pump powers. By fitting the experimental data shown in FIG. 13 to a functional form (the so-called 'state equation') that is well known to experts in the art of optical bistability [see, for example, 'Theory of Optical Bistability', L. A. Lugiato, pp. 71-211 in Vol. XXI of 'Progress in Optics', edited by E. Wolf, Elsevier (1984)] the effective substitutional concentration of ('active' or 'coupled-to') $Fe^{3+}$ ions within the HEMEX sapphire is estimated to be approximately 2 parts per billion. This concentration is substantially lower than the $Fe^{3+}$ ion's chemical concentration as it counts only those ions that participate in forming the 'hole' burnt by the signal-WG mode into the whole, inhomogeneously broadened EPR signal transition (see the discussion in the subsection entitled 'Hole burning . . . ' in the 'Clarifying Description' section below).

Figure 14:
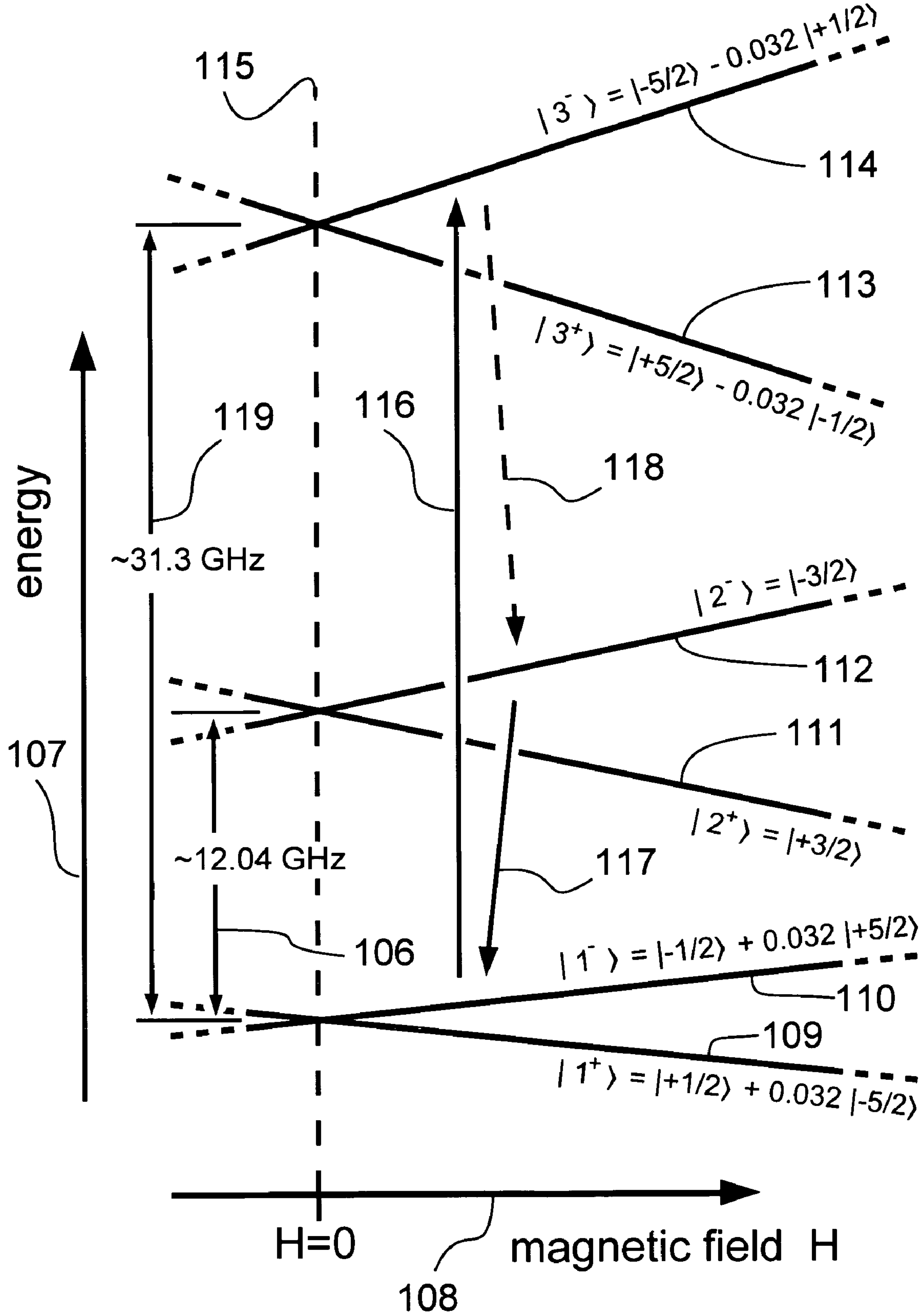

FIG. 14 shows the energy sub-levels of, and (a subset of) the transitions for, the 3-level pump-signal maser scheme that is used by the first experimental embodiment. This diagram corresponds to FIG. 4, yet includes those details that are specific to $Fe^{3+}$ within a sapphire lattice ('crystal field'). The energy 107 of the paramagnetic $Fe^{3+}$ ion's quantum sub-levels are plotted as functions of the applied magnetic field strength 108, when the field is oriented along the sapphire's c-axis. These quantum sub-levels comprise three Kramers doublets (i) the lower doublet 109 and 110, (ii) the middle doublet 111 and 112, and (iii) the upper doublet 113 and 114, where the degeneracy of each doublet is lifted (though with different slopes) by non-zero applied magnetic field. Furthermore, each individual level is annotated by its associated quantum state in so-called Dirac ('ket') notation.

The present embodiment works at zero applied magnetic field 115 where each Kramers doublet forms a degenerate 'level'. For clarity/illustration, the allowed radiative transitions between sub-levels that participate in the masering process are represent in FIG. 14 by solid single-headed arrows 116, 117 between the separated sub-levels. Dashed single-headed arrows 118 correspond to non-radiative transitions. [To avoid excessive clutter, only two of the four participating radiative transitions are shown and only one or four non-radiative transitions is shown.] The solid double-headed arrow 119 indicates transitions between the lower and upper levels and is annotated by the corresponding approximate transition frequency; these correspond to 'pump' transitions at ~31.3 GHz. Similarly, the solid double-headed arrow 106 indicates transitions between the lower and middle levels and is annotated by its corresponding transition frequency; these correspond to signal transitions at ~12.04 GHz.

Transitions between the appropriate sublevels of any of these three levels are allowed, though their strengths vary significantly as is discussed by Bogle and Symmons ['Paramagnetic Resonance of $Fe^{3+}$ in Sapphire at Low Temperatures', G. S. Bogle and H. F. Symmons, Proceedings of the Physical Society, vol. 73, pp. 531-532 (1959)]. The strength of the 31.3 GHz pump transition 119, in particular, equals only 0.02 free-spin units and is thus relatively weak and difficult to saturate. At liquid-helium temperature (around 4.2 K), there are significant differences in the populations of the lower, middle and upper levels, in accordance with the Maxwell-Boltzmann distribution law. The overall (inhomogeneous) linewidth of the maser 12.04 GHz signal transition is approximately 30 MHz.

Except for its Kramers degeneracies, the maser scheme for the zero-field $Fe^{3+}$:sapphire maser oscillator follows the classic three-level scheme previously described in relation to FIG. 4. Signal transitions 106 are stimulated by the resonator's $WGH_{17,0,0}$ mode whose frequency of approx. 12.038 GHz lies well within the maser signal transitions' linewidth. With no pump applied to the resonator, these stimulated transitions extract extra net power from the mode—i.e. above and beyond the losses associated with its regular, 'non-magnetic', loaded Q. Coupling of microwave pump power at approx 31.3 GHz, will cause a net transfer of $Fe^{3+}$ ions from the $|1^-\rangle$ sub-level to the $|3^-\rangle$ sublevel through radiative transitions 116, and from the $|1^+\rangle$ sublevel to the $|3^+\rangle$ sublevel through similar radiative transitions (not shown). The populations of the middle $|2^+\rangle$ and $|2^-\rangle$ sub-levels will in turn be increased through non-radiative transitions such as 118 and others (not shown). At sufficient pump power, a population inversion can thus be obtained between the middle and lower levels. The $WGH_{17,0,0}$ mode will then receive power from both stimulated transitions 117 between the $|2^-\rangle$ and $|1^-\rangle$ sublevels, and transitions (not shown) between the $|2^+\rangle$ and $|1^+\rangle$ sublevels. If this received power can match the losses associated with the mode's loaded Q, the maser action will exceed threshold: the $WGH_{17,0,0}$ mode with be energized corresponding to maser oscillation.

Experimental Operation and Observations

The refrigerator in which the active resonator is installed takes the form of a standard liquid-helium bath cryostat. The dewar was made by Precision Cryogenic Systems Inc. of Rockville Road Indianapolis, USA; its insert was made by SNLS (Vide Cryo Plasma) of Saint Romans, France. The insert's vacuum can is evacuated using a standard turbo pump (Varian Turbo-V 300 HT MacroTorr) backed by a diaphragm pump. The active resonator is rigidly mounted onto a massive copper post that is mechanically and thermally connected to the cold flange of the insert's vacuum can; the resonator is cooled predominantly by solid thermal conduction to this post.

With reference to FIGS. 2 and 5: the microwave pump 5 is generated by an Agilent E8254A microwave synthesizer 6 located outside of the refrigerator, and conveyed to the active resonator's pump-mode e.m. coupler (46 in FIG. 9) via a standard RG-405 semi-rigid coaxial cable 8, interrupted by several SMA freedthroughs and connectors, running down through the insert. The maser signal 9 from the active resonator's signal e.m. coupler is conveyed by a similar cable 11 running up through the insert to the maser oscillator's output 12 at room temperature. No cryogenic receiving amplifier (49 in FIG. 5) is installed on the insert. The temperature of the active resonator is actively controlled by incorporating a Lakeshore germanium resistance thermometer (GR-200A-2500) 66 and a Lakeshore 340 controller (an alternative to 68 and 69 combined). In this particular embodiment, neither cryogenic pump-power stabilization (comprising 56-61) nor active Pound-locking of the pump frequency to the pump mode (comprising 53, 62-65, and 6) is implemented, though both are certainly desirable with regard to improving the frequency stability. Rather, the pump frequency and power are merely dialled up on the said synthesizer. Since the first experimental embodiment is a zero-field maser oscillator, no d.c. magnetic bias field 13 is applied to the resonator. No passive or active regulation 45 of the ambient magnetic field to which the sapphire cylinder is exposed is implemented.

Figure 15:
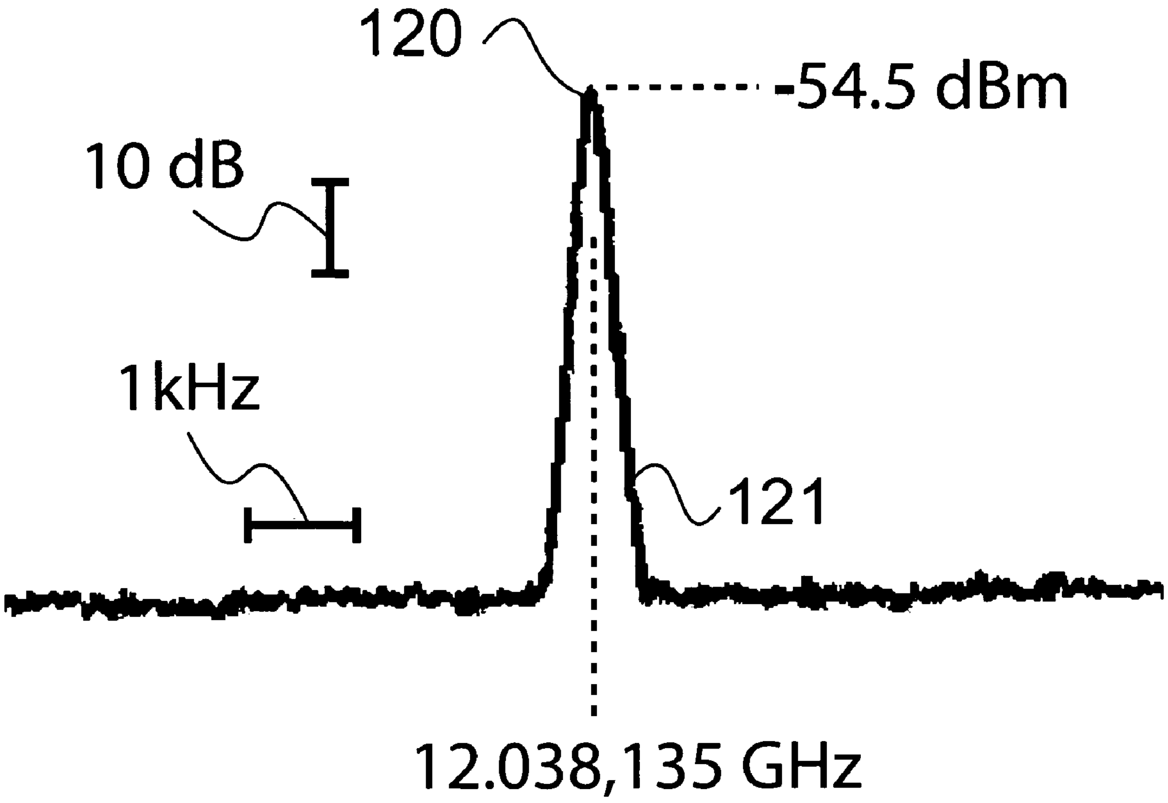
FIG. 15 shows the maser signal output of the first experimental embodiment as experimentally recorded on a spectrum analyser; the displayed peak explicitly demonstrates the occurrence of maser oscillation in the embodiment's active resonator.

When the pump synthesizer is set to a frequency of approx. 31.339 GHz and to a power level of approx 2.2 dBm (122 in FIG. 16), a maser-signal line 120 is observed on a spectrum analyser connected directly to the first experimental embodiment's output 12 with no boosting room-temperature pre-amplifier (i.e. no 50 in FIG. 5); see FIG. 15. This maser-signal line 120 provides concrete proof of the invention's practicality. Note that the line's 'wings' 121, which give the maser line a finite width in FIG. 15, merely reflect the spectrum analyser's finite resolution bandwidth (of a few Hz); the maser signal itself is extremely single-frequency. The frequency of the maser oscillation is approx 12.038135 GHz corresponding to the frequency of the $WGH_{17,0,0}$ mode. Taking into account the approx. 5 dB loss in the output cable 11 running through the refrigerator's insert, an output power of −54.5 dBm 123 is inferred for the maser oscillator (at the active resonator's cryogenic output), which is at least 30 dB greater than a hydrogen maser.

Figure 16:
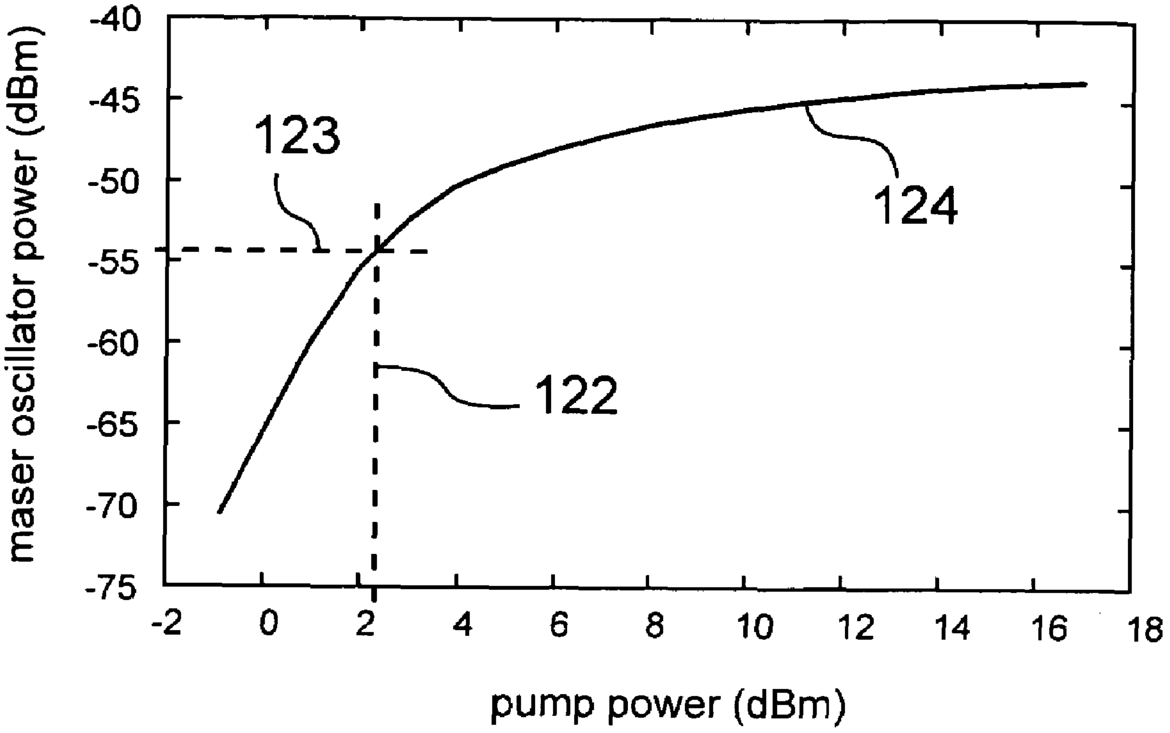
FIG. 16 shows how the power of the maser signal output depends on the power of the microwave pump (at approx 31.3 GHz).

FIG. 16 shows the dependence in the power of the active resonator's maser signal output as a function of the pump power, as dialled-up and generated by the Agilent E8254A synthesizer. At pump powers greater than ~10 dBm, the output power saturates 124.

The maser oscillator's output signal, as available from the top of the cryostat, is amplified by approx. 70 dB using a two MITEQ AL'S6-08001600-15-10P-6 amplifiers in cascade with an intermediate attenuator (to prevent saturation of the second amplifier). The amplified signal is then mixed in a doubly-balanced mixer (Sage MR117) against a signal generated by a second microwave synthesizer (Wiltron 68147A) receiving a frequency reference from a local hydrogen maser. The resulting ~91 kHz beat-note is conveyed to a high-resolution frequency counter (HP 53132A).

Figure 17:
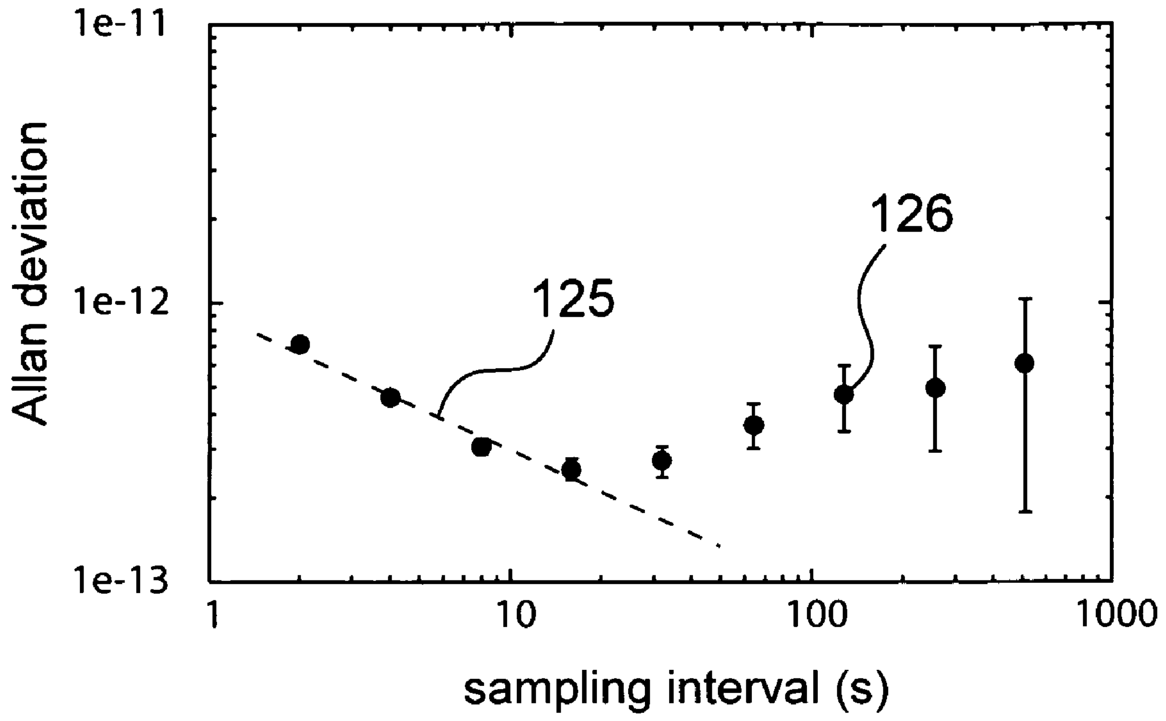
FIG. 17 shows the fractional frequency Allan deviation of the maser oscillator's signal output, relative to an (imperfect) independent reference oscillator.

By slowly increasing the resonator's temperature whilst recording the beat-note's frequency, a frequency-versus-temperature turnover is observed at a temperature of approx 7.9 K. The resonator is stabilized at this temperature using an active temperature control system similar to 66-71 (in FIG. 5). The beat-note is measured against time, and the fractional-frequency Allan deviation, as introduced in the Background, is computed. FIG. 17 shows typical frequency-stability performance data for the first experimental embodiment, with the pump power set at 5.0 dBm. The reference synthesizer's own instability 125 is also shown, which limits the resolution of the measurement for sampling intervals less than 20 seconds. For greater sampling intervals out to 100 seconds 126, the maser oscillator exhibits a fractional frequency stability better than $5\times10^{-13}$.

The observed frequency-versus-temperature turnover is a highly desirable feature with regard to attaining good frequency stability, and can be attributed to residual paramagnetic $Mo^{3+}$ or $Ti^{3+}$ ions in the HEMEX sapphire cylinder [see A. N. Luiten et al (1996), previously referenced.] These 'auxiliary' ions, as depicted by 75 in FIG. 6, take no essential part in the embodiment's maser action.

FIG. 18 shows how the frequency of the active resonator's maser signal output depends on the level of pump power as generated by the Agilent E8254A synthesizer. Both a sharp initial maximum 127 near 2 dBm and a gentle subsequent minimum 128 near 12 dBm are observed. Both, and especially the latter, are high desirable features with regard to attaining good frequency stability. Note that the frequency-stability data shown in figure was not collected at a pump power corresponding to either of these two turnover points. In general, such frequency-versus-pump-power turnover points can have various causes: (i) Variations of the energy in the maser pump or signal modes can modify the relative occupations of the levels associated with auxiliary paramagnetic ions, either directly or through so-called cross-relaxation effects; in this context, it is remarked that, in the case of the $Fe^{3+}$:sapphire zero-field WG-mode maser oscillator, the $Cr^{3+}$ ESR at approx 11.45 GHz lies only a dozen or so transition linewidths away from the maser signal transition at 12.04 GHz. (ii) The saturation of either the maser's pump or signal transitions is spatially inhomogeneous due to the nodal character of the electromagnetic modes (standing-waves) to which they couple; moreover, the signal-WG and pump modes do not perfectly overlap in space; pump-power dependent frequency shifts can arise from the stubborn/belated saturation of 'dead spots' at the nodes of the pump mode where there is no population inversion. (iii) The sign of the frequency shift of the signal-WG mode upon saturation of the maser signal transition will depend on whether the frequency of the signal-WG mode lies above or below the line centre of the (inhomogeneously broadened) maser signal transition.

Clarifying Descriptions

[1] Single, 'Multitasking' Electromagnetic Coupling Means

The possibility of consolidating the electromagnetic coupling means for driving the pump mode with the e.m. coupling means for extracting an oscillator signal from the signal-WG mode in a single dual-tasking coupling means was first mentioned at the end of the first paragraph in the sub-section above entitled 'Electromagnetic coupling:', in the section entitled 'Essential Features'. It represents a subclass of the invention where (i) the electromagnetic (e.m.) coupling means (comprising 7, 23 and 22) for energizing the pump mode 18 and (ii) the e.m. coupling means (comprising 10, 25 and 24) for tapping energy from the signal-WG mode 15 are consolidated within a single e.m. coupling means that performs both functions, and whose wave-guiding body 129 and field-probing tip 130 are shown in FIG. 19. As in the case of two separate e.m. couplers, the position of this dual-functioning single e.m. coupling means is held rigidly with respect to the resonator's dielectric body 14, and hence rigidly with respect to the electromagnetic modes 15 and 18, through one or more mechanical supporting means 2 and 27 held together by one or more mechanical fastening means 30 and 131.

For both the microwave pump 5 and the maser output signal 9 to use a single dual-functioning e.m. coupler, the two must be combined ahead of it through a microwave combining or diplexing network 132 that has three or more ports 133, 134, 135. This network may be composed of one or several microwave components (not shown), connected by suitable waveguides or cables (not shown), where one or several of these components or cables may operate at cryogenic temperatures in the proximity of the active resonator 1. It is generally desirable for this diplexing network to function as follows:

(i) The applied microwave pump 5 arriving at port 133 should leave substantially through port 134, to which the dual-functioning e.m. coupler 129&130 is connected;

(ii) The maser signal 9 (or 141—as discussed below) extracted by this same e.m. coupler and arriving at the same port 134 should leave substantially from port 135, to which the maser oscillator's output 12 is connected through a wave-guiding means (e.g. microwave coaxial cable) 11.

(iii) Any microwave pump 136 that is reflected back from the e.m. coupler, and which will thus also arrive at port 134, should be substantially prevented from leaving through port 135; in other words, the diplexing network should 'strip off' the reflected pump from the maser signal such that the former does not contaminate the latter at the oscillator's output 12.

A diplexing network with the above functionality could be designed by any engineer who is expert in art of microwave signal-processing. Regarding (ii) and (iii), the desired separation of the maser signal from the reflected pump can be achieved by exploiting the difference between their respective frequencies. Such a network could be embodied by an individual microwave component, i.e. a consolidated 'diplexer', or a circuit comprising two or more separate microwave components (such as, but not limited to, circulators, directional couplers, power splitters/combiners and filters), where one or several of these components exhibit, either by design or accidentally, an appropriately different response at the frequencies of the pump and maser signal. The reflected pump 136, upon having been stripped away from the maser signal 141 by the diplexing network, could then be dumped into a load 137, either inside or outside of the cryostat; if the reflected pump were to return along the same wave-guiding means 8 as that through which the pump is applied to the active resonator (as would be the case with a simple three-port diplexing network, like the one shown in FIG. 19), the required direction-dependent dumping function could be effected through the insertion of an appropriately oriented circulator 138 at some point along the wave-guiding means 8. This circulator 138 and its associated load 137 could be consolidated into a single device generally known as an 'isolator', that would only allow pump power to flow from the pump source 6 to the active resonator 1.

For reasons of energy efficiency, it is general desirably for the applied microwave pump 5 to be impedance-matched with respect to the active resonator's pump mode 18, such that all of its power gets absorbed by the mode, and none wastefully reflected back. Such impedance matching minimises the required power of the applied microwave pump 5 and thus the power rating (hence size and cost) of the pump source 6. It can generally be achieved by adjusting the position and/or orientation of the pump mode's e.m. coupling means (particularly that of its probing tip 22) with respect to the pump mode 18, thereby adjusting the degree of electromagnetic coupling between the applied pump and the pump mode. Now, with regard to optimising the maser oscillator's frequency stability and phase noise, it is also generally desirable for the degree of electromagnetic coupling between the signal-WG mode 15 and its recipient microwave signal output 9 to be such that both (i) the signal output 9, which can be increased by increasing the e.m. coupling, is of adequate strength, while (ii) the loaded (non-magnetic) Q of the signal-WG mode, which can be increased by reducing the e.m. coupling, remains high. These two opposing considerations can be traded off quantitatively through equations (1) and (2) in the Background, whose right-hand sides includes the loaded Q, $Q_L$, and the extracted power, $P_0$, respectively. As with the e.m. coupler for the pump mode, the appropriate level of e.m. coupling to the signal-WG mode can generally be achieved by adjusting the position and/or orientation of its relevant e.m. coupling means, particularly that of its probing tip 24. When both couplers are consolidated into a single dual-functioning e.m. coupler 129&130, it may thus not generally be possible to find a position/orientation of the coupler that simultaneously achieves both impedance matching to the pump mode and optimal loading of the signal-WG mode.

For a given position and/or orientation of the single dual-functioning e.m. coupler, which —say—provides (without the insertion of 139) near optimal coupling with respect to either the pump or the signal-WG mode (but not both), exactly optimal coupling with respect to both can thereupon be achieved, simultaneously, through the insertion of a microwave impedance-matching means 139, often referred to in the art as a 'tuning unit' or 'stub tuner' ahead of the e.m. coupler 129&130. This tuner should have sufficient degrees of freedom (embodied by the number of length-adjustable stubs that it incorporates, for example), and a sufficient tuning range with respect to each of these degrees of freedom, so as to include that setting for which both the pump and the signal-WG couplings are optimized, simultaneously. The subsequently impedance-transformed versions of both the applied pump, 140, and the extracted maser signal, 141, which flow (in opposite directions) between the tuner 139 and the dual-functioning e.m. coupler 129&130 then have the appropriate magnitudes (and phases) relative to their pre-transformed equivalents, viz. 5 and 9, respectively, so as to effect the desired optimal couplings.

This tuning unit 139 should generally be designed such that its frequency response (dispersion and absorption) at and about the frequency of the signal-WG mode is as insensitive as practicable to any fluctuations in uncontrolled environmental parameters (such as temperature), lest the centre frequency of the signal-WG mode, and thus that of the maser signal's output 141 (or 9) itself, be affected (i.e. 'pulled') by these fluctuations. In practical embodiments, the tuning unit 139 might well be consolidated within the diplexing network 132 into a single impedance-matching diplexer (not shown), that incorporates one or several microwave resonating structures, e.g. a metal-walled cavity resonator with its own internal couplers.

[2] Incorporation of the Invention within Hybrid Frequency Sources

The whispering-gallery-mode maser oscillator, as the subject of this invention, generally offers superior frequency stability over time intervals shorter than 1000 seconds. Over longer time intervals, the frequency of the maser's output signal will tend to drift, as is evidenced by 126 in FIG. 17, and its stability (over these longer time intervals) is generally inferior to that offered by existing state-of-the-art atomic frequency references, such as caesium-beam clocks or hydrogen masers. Also, whereas the absolute frequency of the WG-mode maser oscillator is determined by the dimensions and electromagnetic properties of its dielectric body, the frequency of an atomic frequency reference can be reproduced with relatively far greater accuracy. It is possible, however, to combine a WG-mode maser oscillator with such an atomic frequency standard or clock within a hybrid system such that the frequency of the system's output exhibits both the superior short-term stability and low phase-noise characteristics of the WG-mode maser oscillator and the long-term stability (i.e. low drift) and absolute reproducibility of the atomic frequency standard.

Indeed, R. T. Wang and G. J. Dick, in 'A Receiver Design for the Superconducting Cavity-Maser Oscillator', NASA/JPL Telecommunications and Data Acquisition Progress Report 42-107, pp. 1-5, Nov. 15, 1991, in particular their FIG. 1, describe a directly equivalent hybrid system, where a superconducting cavity-maser oscillator (SCMO), as has already been mentioned in the Background and elsewhere, is 'disciplined' by a hydrogen maser to remove its long-term drift. Here the SCMO was tuned by modifying the strength of an applied magnetic bias field. The hydrogen maser and SCMO were incorporated within a 'receiver', i.e. a frequency synthesiser, that provided ultra-frequency-stable carriers at 100 kHz and 5, 10, and 1000 MHz. With appropriate modifications, the whispering-gallery-mode maser oscillator described in this patent could replace the SCMO that Wang and Dick used in such a receiver. In such a substitution, the WG-mode maser oscillator's output could be tuned by varying its temperature, or, like Wang and Dick, by varying the strength of an applied magnetic field, or by varying the power or frequency of the applied pump, or by varying some other variable to which the frequency of the WG-mode maser oscillator's output is sensitive to some finite degree.

As an alternative to controlling the frequency of the whispering-gallery-mode maser oscillator's own output, one may instead control the frequency of a 'side-band' derived from it, where the former is not adjusted (i.e. the maser oscillator 'runs freely'), while the spacing or 'offset' in frequency between it and the latter is adjusted. This approach can be realized by generating an r.f. tone with a voltage-controllable synthesiser (i.e. one with a 'd.c. FM modulation' capability), where this tone's frequency Δf is typically several orders of magnitude lower than that of the maser oscillator's (free-running) output, and where the tone is mixed with the maser oscillator's output to provide the said tunable side-band, which can thereupon be compensated or 'disciplined' against long-term drift.

FIG. 20 depicts the essential components of a typical embodiment of such a drift-compensated frequency reference exploiting this 'offset-sideband' approach, where, in the depicted case, the reference generates an ultra-frequency-stable and low-phase-noise output 155 at 9.2 GHz. Here, the WG-mode maser oscillator 142 provides an output 143 at a frequency of (9.2+Δf) GHz, which is mixed on a low-phase-noise single-sideband microwave mixer 144 with a signal 145 of frequency Δf provided by an r.f. voltage-controlled oscillator ('VCO') or a software-controlled direct-digital synthesizer 146. The output at 9.2 GHz from the single-sideband mixer is first divided by 92 through a single or cascade of frequency divider(s) 147 and thereupon mixed in quadrature on a phase detector 150, against the 100 MHz low-drift frequency reference 148 supplied by a commercial atomic hydrogen maser 149. Upon passage through a low-pass filter 151 (to remove unwanted mixing 'harmonics' at multiples of 100 MHz), the resultant near-d.c. error signal 152 is used to control the frequency of the VCO 146 in a standard phased-locked loop (PLL), with suitable gain and damping constants set within the PLL loop filter 153, whose output is applied to the VCO's control input 154. The drift-free, ultra-frequency-stable 9.2 GHz microwave reference carrier 155 is extracted through a directional coupler or power splitter 156. This output could be used to synthesize the interrogating signal for a primary caesium beam or fountain clock. Optionally, an ultrastable 100 MHz clock reference 157 can be supplied to the VCO at its clock or frequency-reference input 158, by tapping off some of the frequency divider's output through a second directional coupler or power splitter 159; this 100 MHz clock reference could otherwise be supplied by either the VCO's own on-board (free running) crystal oscillator or from the hydrogen maser's 100 MHz output; the provision of a post-divider 100 MHz tap 157 would, however, generally be the preferred choice.

The above example of complementary hybridization (in this case between an WG-mode maser oscillator and a commercial hydrogen maser) is but one scheme through which the whispering-gallery-mode maser oscillator can be effectively exploited as a superior component, with regard to its frequency-stability performance, cost of manufacture, or operational requirements, within a greater system.

With or without being steered/disciplined by a low-drift atomic frequency standard, both r.f. and microwave and even optical carriers (ranging in frequency from a few kHz to thousands of teraHz) of exceptional frequency stability can be derived from the whispering-gallery-mode maser oscillator's output by including it within schemes of frequency synthesis. These schemes are exemplified by the papers referenced below, where, in each case, the WG-mode maser oscillator could replace the ultrastable microwave oscillator(s) that each set of authors themselves used:

F. Lardet-Vieudrin, P. Salzenstein, D. Vernier, D. Gillet, D., M. Chaubet, and V. Giordano, in 'Design and realisation of a 100 MHz synthesis chain from an X-band reference signal'

Proceedings of the IEEE Frequency Control Symposium and 17 European Frequency Time Forum, Tampa, Fla., 4-8 May 2003. Page(s) 560-564; particularly FIG. 1.

G. John Dick and Rabi T. Wang, 'Stability and Phase Noise Tests of Two Cryo-Cooled Sapphire Oscillators', Proceedings of the 1999 Joint Meeting of The European Frequency and Time Forum and the IEEE International Frequency Control Symposium, pp. 548-551; particularly the 'low-noise receiver' shown in their FIG. 2.

Y. Koga. C. McNielage, J. H. Searls and S.-I. Ohshima, 'A Microwave Excite for Cs Frequency Stand Based on a Sapphire Loaded Cavity Oscillator', IEEE Transactions on Ultrasonics Ferrolectrics and Frequency Control Vo. 48 No. 1 January 2001, pp. 1-5; particularly FIGS. 1, 3 and 5(*b*) and 5(*c*).

Steven T. Cundiff, Jun Ye, and John L. Hall, 'Optical frequency synthesis based on mode-locked lasers', Review of Scientific Instruments, Vol. 72, pp. 3749-3771 (2001).

[3] Narrowness of the Signal-WG Mode's Linewidth in Comparison with that of the Paramagnetic Signal Transition It was noted in the final paragraph of the passage entitled 'Maser action:', in the subsection entitled 'Electronic paramagnetic (EPR) and maser action', in the 'Essential Features' section above, that the loaded (non-magnetic) Q of the signal-WG mode is typically at least a factor of $10^4$ greater than the line Q of the paramagnetic ion's signal transition. The significance of this colossal inequality, which is a key, characterizing feature of the invention, is addressed in more detail here.

As the Q is inversely proportional to the linewidth of a resonance, the above observation is equivalent to stating that the resonance associated with the active resonator's (loaded) signal-WG mode 15 is (at least) a factor of $10^4$ narrower in frequency than the electron paramagnetic resonance (i.e. 'EPR' or 'ESR') associated with the paramagnetic ions' maser signal transition 17. This colossal inequality in linewidth distinguishes the current invention from atomic maser frequency standards, such as the hydrogen maser. It is not wholly unique to the present invention, as it is shared with Dick et al's Superconducting Cavity Maser Oscillator (SCMO), as referenced in the middle of the subsection entitled 'Solid-state masers' in the Background. [As already discussed above, the key difference between the SCMO and the present invention is that, in the former, the maser amplifier and high-Q (and, incidentally, superconducting) resonator were spatially separate elements, connected together by a waveguide cavity; in the present invention, on the other hand, the maser amplifier and frequency-defining resonator are physically consolidated (i.e. spatially overlapping) within the same dielectric body.]

FIG. 21 depicts the above-said inequality of linewidths, as well as displaying (in its right-most half) the corresponding arrangement in frequency space for the paramagnetic (ESR) pump transition and associated electromagnetic pump mode. Effective maser action (hence oscillation) requires that the centre frequency 142, denoted as $f_{Signal\_Mode}$ of the WG signal mode 15, lies substantially within the response profile 143 of the paramagnetic (ESR) signal transition 17, whose centre frequency 144 is $f_{Signal\_ESR}$ and whose full-width-half-maximum (FWHM) linewidth 145, that incorporates both homogeneous and inhomogeneous broadening, is $\Delta f_{Signal\_ESR}$. Expressing things mathematically:

$$\frac{|f_{\text{Signal\_Mode}} - f_{\text{Signal\_ESR}}|}{\Delta f_{\text{Signal\_ESR}}} \leq C_{Signal}, \tag{3}$$

where $C_{Signal}$ is a dimensionless constant (or 'criterion') of order unity (i.e., generally less than 10). With reference to FIG. 21, the linewidth inequality can now be expressed as:

$$\Delta f_{Signal\_Mode} \square \Delta f_{Signal\_ESR}, \tag{4}$$

where $\Delta f_{Signal\_Mode}$ is the FWHM linewidth 146 of the (either loaded or unloaded) signal-WG mode, and with the '□' typically being satisfied by at least a factor of $10^4$. Thus, in relation to the as-drawn ESR profile 143 in FIG. 21, the true profile of the signal-WG mode's resonance is much narrower than how it is depicted 153 in the same.

Unless so-called 'harmonic pumping' is employed (see A. E. Siegman's textbook, 'Microwave solid-state masers', already referenced, for example), the absolute (centre) frequencies of the electromagnetic pump mode 18 and its corresponding paramagnetic (ESR) pump transition 19 differ, in general, significantly from those of the signal-WG mode 15 and its the maser signal transition 17; this feature is represented in FIG. 21 by the gap 147 along the frequency axis. Effective pumping action requires that the centre frequency 148, denoted as $f_{Pump\_Mode}$, of the pump mode, lie substantially within the response profile 149 of the ESR pump transition, whose centre frequency 150 is $f_{Pump\_ESR}$ and whose FWHM linewidth 151 is $\Delta f_{Pump\_ESR}$. That is, $$\frac{|f_{\text{Pump\_Mode}} - f_{\text{Pump\_ESR}}|}{\Delta f_{\text{Pump\_ESR}}} \leq C_{Pump}, \tag{5}$$

where $C_{Pump}$ is again a dimensionless constant of order unity. Unlike as for the signal-WG mode and its associated signal transition, the linewidth 152 of the pump mode, $\Delta f_{Pump\_Mode}$, need not be orders of magnitude smaller than $\Delta f_{Pump\_ESR}$, though, as is the case in the first experimental embodiment, it can be. The pump mode's linewidth 152 should, however, be small enough to allow the pump mode 18 (upon being coupled and impedance matched to the pump 5) to attain an electromagnetic amplitude that is high enough to substantially saturate the pump transition 19 (so as thereupon to provide and sustain a population inversion across the maser signal transition 17) without requiring the application of a pump that is so powerful as to cause intolerable heating within the active resonator 1 and/or surrounding cold parts of the refrigerator (in particular, should the load 137 be cryogenic, where the reflected pump power is dumped) in which the active resonator operates.

[4] First-Order Immunity of Output Frequency to Fluctuations of the Magnetic Field within the Zero-Field Variant of the Invention This feature was already briefly mentioned at the end of the passage entitled 'Operation in zero d.c. magnetic field' within the section entitled 'Advantages' above; it is elucidated in rather greater detail here. It is exhibited by the 'zero-field' variant of the invention, where maser oscillation takes place without the paramagnetic ions 34 being exposed to an applied d.c. magnetic bias field 13, and where the paramagnetic levels 41, 42, 44 of the invention's simplest maser scheme, as shown in FIG. 4, are Kramers doublets, with each level made up of a pair of sublevels, 113 & 114, 109 & 110, and 111 & 112, respectively, as shown in FIG. 14. Each Kramers doublet is energy degenerate at zero magnetic field; that is, when viewed as lines charting the sublevels' respective energies as functions of the applied magnetic field, the two sublevels (e.g. $|1^-\rangle$ and $|1^+\rangle$ in the case of the ground-state level 42) exactly coincide at zero field. Furthermore, and what is essential to the field-immunity feature described here, is that the slopes of these coinciding/crossing sublevels are exactly equal and opposite at zero magnetic field; it is this characteristic symmetry of the Kramers doublets that provides the balancing mechanism for defeating the pulling of the maser oscillator's output frequency as the magnetic field fluctuates about zero.

As has been noted in previous sections, the whispering-gallery-mode maser oscillator's frequency is set by the (potentially 'pulled') centre frequency of the signal-WG mode 15 as opposed to that of the EPR signal transition 17. The magnetic susceptibility associated with the EPR transition does, however, contribute—albeit typically only slightly—towards determining the former; the magnitude and direction of the frequency shift or 'pulling' attributable to it can be expressed as $$\frac{\Delta f}{f_{WG}} = -\frac{1}{2} A_{fill} \chi'(f_{WG}), \tag{6}$$

where $\Delta f$ is the frequency shift, $f_{WG}$ is the signal-WG mode's absolute frequency, $\chi'(f)$ is the real (the so-called 'dispersive') part of the magnetic susceptibility of the dielectric material hosting the paramagnetic ions within the dielectric body, and $A_{fill}$ is the so-called 'filling factor' of this (both magnetic and dielectric) material with respect to the signal-WG mode.

As is understood by experts in the art of paramagnetic resonance (see, for example, section 5-6 entitled 'An alternative approach—the Bloch equations' in Siegman's textbook, already referenced), the overall magnitude and sign of the dispersive susceptibility $\chi'(f)$ is proportional to the population difference between the two paramagnetic energy levels that the EPR transition connects; its profile, as a function of the frequency f, is determined by the broadening processes associated with the transition. If the EPR transition exhibits so-called homogeneous broadening, then the combined real and imaginary parts of the susceptibility, $\chi'(f)+i\chi''(f)$ will take the form of a generalized Lorentzian. If so-called inhomogeneous broadening operates, then $\chi'(f)$ will take a different form, often tending towards that of the first derivative of a gaussian. [Inhomogeneous broadening is discussed again below.] In most cases, and as shall be assumed henceforth, the combined effect of all of the broadening processes associated with the EPR is a magnetic susceptibility profile whose real, dispersive part $\chi'(f)$ is antisymmetric about the electron paramagnetic resonance's centre frequency $f_{EPR}$, and whose imaginary, the so-called 'absorptive', part $\chi''(f)$ is symmetric about the same. [These two parts will actually be related through the so-called Kramers-Kronig relation.]

As a preliminary remark/caveat, it is reiterated here that, due to (i) the phenomenon/mechanism known in the art of maser/laser physics as 'population clamping' (already mentioned in 'Advantages' above), as is associated with above-threshold maser/laser oscillation in general, and where (ii) this clamping mechanism is particularly effective when the loaded non-magnetic Q of the signal-WG mode is extremely high (as is typically the case in advantageous embodiments of the current invention), the population difference or 'inversion' (positive for masing) and thus the dispersive susceptibility $\chi'(f)$ will be suppressed by a significant, f-independent factor at all frequencies f over the susceptibility's profile. Thus, though the maser oscillator necessarily operates within the potentially dispersive line profile of the EPR signal transition, the latter's efficacy at perturbing the oscillator's frequency is advantageously muted.

Now, if the centre frequency of the signal-WG mode $f_{WG}$ (142) is exactly aligned with that of a single EPR signal transition, as per quadrant 'A' of FIG. 22, the dispersive susceptibility 160 associated with this transition, namely $\chi'_{|2>\leftrightarrows|1>}(f)$, will vanish at the signal-WG mode's centre frequency, and thus the dispersive EPR frequency shift will be zero; i.e., $\chi'_{|2>\leftrightarrows|1>}(f_{WG}=f_{EPR})=0$, so $\Delta f=0$.

If, however, as depicted in quadrant 'B' of FIG. 22, the frequency $f_{EPR}$ of the EPR transition shifts 161 (in the case shown, decreases) to a different one, $f'_{EPR}$, upon a change 162 in the magnetic field (from H=0 to H=+ΔH), the subsequent dispersive susceptibility 163, when evaluated at the frequency of the signal-WG mode, 142, will no longer be zero 164; i.e., $\chi'_{|2>\leftrightarrows|1>}(f_{WG\neq fEPR})\neq 0$, so $\Delta f\neq 0$.

In the case of a zero-field maser, two EPR transitions each contribute a separate dispersive susceptibility: the $|2^{31}>\leftrightarrows|1^{31}>$ transition 117 in FIG. 14 between the $|2^{-}>$ and $|1^{31}>$ sublevels (viz. 112 and 110 ibid.) provides $\chi'_{|2^{-}>\leftrightarrows|1^{-}>}(f)$, and the dual $|2^{30}>\leftrightarrows|1^{30}>$ transition (not indicated) between the $|2^{30}>$ and $|1^{30}>$ sublevels (viz. 111 and 109) provides $\chi'_{|2^{+}>\leftrightarrows|1^{+}>}(f)$. Both will be antisymmetric about their respective centre frequencies and the total dispersive susceptibility $\chi'_{\{|2^{+}>\leftrightarrows|1^{+}>+|2^{-}>\leftrightarrows|1^{-}>\}}(f)$, viz. 165 (quadrant 'C') and 166 (quadrant 'D') in FIG. 22, will equal their superposition. Unless the pump is circularly polarized, the population difference (inversion) will be the same across both transitions. And, provided the electromagnetic coupling means for the signal-WG mode is non-selective with regard to the mode's state of circular polarization, both component dispersive susceptibilities will have the same amplitude. Thus, in quadrant 'C' of FIG. 22, corresponding to zero magnetic field, these two susceptibilities 167 will lie exactly on top of one another and their sum susceptibility 165 will also be zero at the signal-WG mode's centre frequency, $f_{WG}$ (142). Now, by dint of the symmetry of equal and opposite slopes about zero magnetic field for the pair of sublevels within each Kramers doublet, the two now non-overlapping component susceptibility profiles 168 and 169 will shift both in opposite directions (170 and 171 respectively) and by equal amounts upon a change 162 in the (either ambient or applied) magnetic field. As a result of the subcomponent profiles' antisymmetry, the total dispersive susceptibility profile $\chi'_{\{|2^{+}>\leftrightarrows|1^{+}>+|2^{-}>\leftrightarrows|1^{-}>\}}(f)$ will, though distorted, remain antisymmetric about the signal-WG mode's centre frequency $f_{WG}$ and, thus, will continue to vanish at it. Hence, the WG-mode maser oscillator's output frequency will suffer no frequency shift, to first order, on fluctuations in the magnetic field (about zero magnetic field). Such insensitivity is a highly desirable feature with regard to achieving good frequency stability without magnetic shielding 45 or stabilization.

Furthermore, it can be shown, going to next order in the analysis, that even if the centre frequency 142 of the signal-WG mode is offset somewhat from that of the centre ('zero-splitting') frequency of the Kramers-doublet EPR transition(s) 144 at zero magnetic field, a significant degree of compensation (in comparison to the frequency shift from a single, unbalanced itinerant EPR transition) is achieved, provided the offset is a small fraction of the EPR linewidth.

[5] Inhomogeneous Broadening and Zero-Field Masering with Polycrystalline Dielectrics Putting aside (super-)hyperfine interactions (which are discussed briefly below), the number (i.e. the degeneracy) of and quantitative spacing between the paramagnetic energy levels of a paramagnetic ion, when dissolved within a solid dielectric host, are determined by (i) the chemical species and valency of the paramagnetic ion is question, (ii) the so-called 'crystal field' (i.e. the spatially-dependent electromagnetic environment) to which the ion is exposed, where this crystal field is defined by the chemical species, valency and location (in relation to the paramagnetic ion) of the atoms/ions in the dielectric that immediately surrounds the paramagnetic ion, and (iii) the magnitude and orientation of any externally applied magnetic field (see, e.g., FIG. 14). These dependencies are all well understood by experts in the art of electron paramagnetic resonance (in solids), as expounded in scholarly monographs such as that by A. Abragam and B. Bleaney (already referenced above).

To achieve maser oscillation, a sufficient fraction of the paramagnetic ions must share a substantially common/identical scheme of paramagnetic energy levels, viz. FIG. 4 (or 14). In other words, to employ the art's technical jargon, the ions' pump and signal transitions should not suffer excessive 'inhomogeneous broadening'. Ignoring the effect of any applied magnetic field for the moment, paramagnetic ions of the same chemical species and valence that occupy equivalent lattice sites within either a monocrystalline or a polycrystalline dielectric will (but for their proximity to defects/grain boundaries) be exposed to substantially the same crystal field, and will thus exhibit substantially equivalent paramagnetic energy levels. Now, the effect of an applied magnetic field will depend on the relative orientation(s) or the single dielectric crystal, in the monocrystalline case, or the many individual component dielectric crystallites, in the polycrystalline case, with respect to the applied magnetic field. In the latter, where the component dielectric crystallites are oriented in many different (and often random) directions, the applied magnetic field will generally cause the energy levels of the paramagnetic ions in different crystallites to differ, resulting in a form of inhomogeneous broadening.

As already mentioned in the Background, and also in connection with the invention's first experimental embodiment, whispering-gallery-mode maser oscillators can be divided into (i) those whose dielectric bodies operate under exposure to a finite d.c. magnetic bias fields and (ii) those whose dielectric bodies do not. Those of the latter type represent the 'zero-field' variant of the present invention. Putting aside the whispering-gallery nature of the invention's signal mode, zero-field and finite-magnetic-field maser oscillators have their own advantages and disadvantages, which are well known and understood to experts in the art of solid-state maser oscillators, as expounded in Bogle and Symmon's seminal 1959 paper [viz. 'Zero-Field Masers', G. S. Bogle and H. F. Symmons, Australian Journal of Physics, 12, pp. 1-20 (1959)] already mentioned in the Background. A few notable ones, which have not already been explicitly addressed, are stated here:

Irrespective of whether the electromagnetic signal mode is of a whispering-gallery type, maser oscillators whose dielectric bodies are subject to finite applied d.c. magnetic bias fields generally have the feature of being 'frequency selectable' in the sense that the frequencies of their paramagnetic pump and/or signal transitions can be adjusted (to a limited though nevertheless significant extent), by selecting the magnitude and/or direction of the applied d.c. magnetic bias field, to those particular pump and/or output signal frequencies required in a particular application. The frequencies of the pump and signal transitions in a zero-field maser oscillator, and hence those of the pump and WG-signal modes (respectively) that are required to be aligned with them, are, in contrast, rigidly determined by the system's solid-state chemistry, i.e., the chemical species and valence of the masering paramagnetic ion and the atomic composition and structure of the ions of dielectric host lattice that surround it; in the jargon of the art, the frequencies of the applied pump 148 and extracted oscillator signal 142 are required to equate to the system's so-called 'zero-field splittings'.

An obvious and previously mentioned advantage of the zero-field maser oscillator variant is that it does not require a means 16 of generating a (generally sizeable) applied d.c. magnetic bias field, this means could be bulky, costly and consume significant power. To achieve an advantageous degree of frequency stability, a zero-field oscillator might nevertheless still require the inclusion of an either passive shielding or active regulation means 45 for stabilizing the magnetic field in this case sufficiently close to zero.

Now, as was pointed out both by Bogle and Symmons (1959, ibid.) and in particular by N. Bloembergen's in his 1960 symposium paper already mentioned in the Background [viz. 'The Zero-Field Solid State Maser as a Possible Time Standard', N. Bloembergen, in 'Quantum Electronics. A Symposium', Columbia University Press, New York, pp. 160-166 (1960)], the zero-field maser oscillator can be made to work effectively with polycrystalline dielectric materials: since there is no applied magnetic field to shift the energy levels (by differing amounts), the paramagnetic ions within every crystallite, no matter how each crystallite is oriented, will be in tune with the applied pump and extracted maser-oscillator signals. As dielectric bodies (of some specific, designed shape) made from polycrystalline ceramics, such as (doped) alumina $\alpha$-$Al_2O_3$, would generally be far cheaper to produce than ones cut from (either mined or artificially grown) monocrystalline dielectrics, such as sapphire or some other precious or semi-precious gem stone, this long-since-known advantage of zero-field maser oscillators is revived here.

It is also briefly added here, for the sake of completeness, that the feasibility of zero-field masering depends on both the paramagnetic ion's chemical species and valence and the rotational symmetry of the crystal field of the dielectric in which it sits. This symmetry must be sufficiently low for the transition probability of the maser scheme's pump transition to be non-zero. [As the pump transition is necessarily a 'level-crossing' one, it is otherwise 'forbidden']. Again, this requirement is/was well understood by experts in the art such as Bogle and Symmons.

[6] Hole Burning, the Required/Optimal Concentration of Masering Paramagnetic Ions, and Electron-Nuclear Double Resonance With regard to optimising the maser oscillator's frequency stability; it is generally desirable for the concentration (and hence number of) the masering paramagnetic ions to be as low as is compatible with the oscillator's operational requirements, such as its delivery of a certain level of oscillator output power, or the need for the maser oscillator to operate at a particular frequency-versus-operating-parameter turnover point, such as the minimum 128 shown in FIG. 18. A needlessly greater concentration of paramagnetic ions will generally increase the sensitivity of the maser oscillator's output frequency to operational parameters such as pump power, pump frequency, the temperature of the dielectric body (and/or its surrounding optional electromagnetic cavity) and the applied magnetic field. With regard to frequency stability, one thus generally desires a 'frugal' maser oscillator that, by dint of the high quality factor (Q) of the whispering-gallery signal mode that its dielectric body supports, harnesses a relatively small number of paramagnetic ions (typically only $10^{15}$), whose maser gain is just sufficient to reach the threshold for maser oscillation and thereupon energize the WG-signal mode sufficiently to provide just enough oscillator output power. In support of this frugality, the output coupling should in turn be as low as is sufficient to extract just the required amount of output signal power.

Due to inhomogeneous broadening, only a certain subset of the paramagnetic ions of the masering species will actually participate in the maser action. The saturation (population clamping) of those that do will 'burn a hole' in the inhomogeneous line profile. The shape and particularly the width of this hole will be determined by the so-called 'spin-packet lineshape'; the ratio of this width to that of the whole inhomogeneously line is known as the 'homogeneity parameter' and quantifies the faction of the ions able to participate in the masering process. The concentration of paramagnetic ions required to attain the threshold maser oscillation will generally scale in inverse proportion to the homogeneity parameter.

In the well-studied case of ruby, i.e. $Cr^{3+}$ paramagnetic ions doping monocrystalline sapphire, the spin packet lineshape and the mechanism of inhomogeneous broadening have been investigated by Boscaino and Gelardi ['The spin packet lineshape in dilute ruby samples', R. Boscaino and F. M. Gelardi, Journal of Physics C: Solid State Physics, Vol. 15, pp. 6245-6255 (1982)] and works referenced therein. Summarizing briefly, the inhomogeneous broadened line has a gaussian profile, that arises from the superhyperfine interaction between the $Cr^{3+}$ ions' electron spin and its surrounding host $^{27}Al$ nuclear spins; the (narrower) spin-packet lineshape is found, experimentally, also to have a gaussian profile. A modification of the effective number of masering paramagnetic ions could thus be achieved by flipping of the $^{27}Al$ nuclear spins of the sapphire host dielectric through their exposure to an applied r.f. magnetic field, where this field oscillates at the frequency (or frequencies) of one or several of the five available $^{27}Al$ nuclear magnetic resonance (NMR) transitions within the $^{27}Al$'s nuclear spin-5/2 Zeeman 'quadrupole'. In such a scheme, each EPR spin packet would circulate/drift in and out of resonance with the signal-WG microwave mode as the nuclear spin states of the $^{27}Al$ nuclei surrounding each paramagnetic $Cr^{3+}$ (or $Fe^{3+}$) ion change. This r.f. field, typically a few hundred kHz or a few MHz in frequency, could be generated by a coil in proximity of (or surrounding) the dielectric body, where this coil is driven remotely by an r.f. generator via a cable, and where the coil is positioned so as not to substantially perturb/load the microwave signal-WG or pump modes. Such an approach, where NMR transitions are exploited to indirectly affect an EPR transition (in this case, a masering one) may be regarded as a variant of ('distant') electron-nuclear double resonance ('ENDOR').

Those skilled in the art will appreciate that the present invention may be embodied as part of a navigation system, e.g. as part of a system generally similar to the Global Positioning System (GPS). The present invention may, for example, be included as part of a spacecraft (which term is intended to include satellites).

The invention claimed is:

1. A resonator comprising:

a. a dielectric body excitable in a whispering gallery mode, wherein the dielectric body comprises paramagnetic ions;

b. a first coupling means for coupling a pump signal to the dielectric body; and c. a second coupling means for extracting an oscillator signal from a whispering gallery mode of the dielectric body.

2. The resonator of claim 1 wherein the first coupling means is distinct from the second coupling means.

3. The resonator of claim 1 comprising a single coupling means, wherein the single coupling means is operable as both the first and second coupling means.

4. The resonator of claim 3 further comprising an isolator means connected to the single coupling means.

5. The resonator of claim 1 wherein:

a. the first coupling means is operable to couple the pump signal to a first whispering gallery mode, b. the second coupling means is operable to extract the oscillator signal from a second whispering gallery mode, and c. the first and second whispering gallery modes are distinct.

6. The resonator of claim 1 wherein the dielectric body is elliptical, toroidal, cylindrical or has rotational symmetry.

7. The resonator of claim 1 wherein the dielectric body comprises one or more pieces.

8. The resonator of claim 1 wherein:

a. the dielectric body has an electric permittivity tensor that exhibits rotational symmetry about a first axis, b. the dielectric body is rotationally symmetric about a second axis, and c. the first and second axes are substantially parallel.

9. The resonator of claim 1 wherein the paramagnetic ions are in a crystalline or polycrystalline lattice.

10. The resonator of claim 1 wherein the dielectric body comprises sapphire.

11. The resonator of claim 1 wherein the concentration of paramagnetic ions within the dielectric body is substantially 1 in 103, 104, 105, 106, 107, 108 or 109.

12. The resonator of claim 1 wherein the paramagnetic ions comprise Fe3+ or Gd3+ ions.

13. The resonator of claim 1 further comprising auxiliary paramagnetic ions.

14. The resonator of claim 1 further comprising an electromagnetic cavity in which the dielectric body is mounted.

15. The resonator of claim 14 wherein the electromagnetic cavity comprises conductive walls.

16. The resonator of claim 14 wherein the cavity is substantially evacuated.

17. The resonator of claim 14 wherein the cavity contains an exchange gas.

18. The resonator of claim 1 further comprising a cooler maintaining the dielectric body at a cryogenic temperature.

19. The resonator of claim 18 wherein the cooler is operable to maintain the dielectric body at a substantially constant temperature.

20. The resonator of claim 1 further comprising a controller controlling a DC bias magnetic field of the dielectric body.

21. The resonator of claim 20 wherein the controller is operable to apply a substantially constant DC bias magnetic field.

22. The resonator of claim 20 wherein the controller comprises a superconducting tube and/or mu-metal shields.

23. The resonator of claim 20 wherein the controller is operable to set the DC bias magnetic field to substantially zero.

24. The resonator of claim 1 further comprising an amplifier amplifying the oscillator signal.

25. The resonator of claim 1 further comprising a tuner tuning the frequency of the oscillator signal.

26. The resonator of claim 25 wherein the tuner is operable to tune the frequency by changing at least one of:

a. the temperature of the dielectric body, and b. a DC magnetic field of the dielectric body.

27. The resonator of claim 1 further comprising:

a. a whispering gallery oscillator wherein the resonator is incorporated, and b. a pump oscillator coupled to the first coupling means.

28. The resonator of claim 27 further comprising means for maintaining the pump oscillator at a substantially constant frequency.

29. The resonator of claim 27 further comprising means for maintaining the pump signal at a substantially constant amplitude.

30. The resonator of claim 27 further comprising a tuner for tuning the frequency of the oscillator signal, wherein the tuner is operable to tune the frequency by changing at least one of:

a. the frequency of the pump signal, and b. the amplitude of the pump signal.

31. The resonator of claim 27 further comprising:

a. a hybrid frequency source wherein the whispering gallery oscillator is incorporated, b. a long-term stable oscillator;

c. means for combining the outputs of the two oscillators so as to combine the short-term frequency stability of the whispering gallery mode oscillator with the long-term frequency stability of the long-term stable oscillator.

32. The resonator of claim 31 further comprising a tuner for tuning the frequency of the whispering gallery oscillator signal, wherein the means for combining is operable, by tuning the frequency of the whispering gallery oscillator, to lock the whispering gallery mode oscillator to the long-term stable oscillator.

33. The resonator of claim 32 further comprising:

a. a tunable oscillator, and b. a mixer combining the outputs of the whispering gallery mode oscillator and the tunable oscillator, wherein the means for combining is operable, by tuning the frequency of the tunable oscillator, to lock the combined output with the long-term stable oscillator.

34. The resonator of claim 27 further comprising a navigation system wherein the whispering gallery oscillator is incorporated.

35. The resonator of claim 27 further comprising a spacecraft wherein the whispering gallery oscillator is incorporated.

36. A method of generating an oscillator signal comprising the steps of:

a. coupling a pump signal to a dielectric body in order to excite paramagnetic ions within the dielectric body;

b. using a paramagnetic transition of the paramagnetic ions to excite a whispering gallery mode of the dielectric body; and c. extracting the oscillator signal by coupling to the whispering gallery mode.

37. The method of claim 36 further comprising the step of operating at a turnover.

38. The method of claim 37 further comprising the step of operating at one or more of the following turnovers:

a. pump frequency, b. pump amplitude, and c. temperature.

39. The method of claim 36 comprising the step of using a 4 level, 2 pump, scheme to excite the paramagnetic ions.

* * * * *